(12) United States Patent
Kim et al.

(10) Patent No.: US 12,527,155 B2
(45) Date of Patent: Jan. 13, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Gyeong-Woo Kim, Paju-si (KR); Ji-Seon Jang, Paju-si (KR); Ik-Rang Choe, Paju-si (KR); Hye-Gun Ryu, Paju-si (KR); Han-Jin Ahn, Paju-si (KR); Jun-Yun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1099 days.

(21) Appl. No.: 17/524,239

(22) Filed: Nov. 11, 2021

(65) Prior Publication Data

US 2022/0209121 A1    Jun. 30, 2022

(30) Foreign Application Priority Data

Dec. 29, 2020 (KR) .......................... 10-2020-0186092

(51) Int. Cl.
*H10K 50/12* (2023.01)
*C07D 471/04* (2006.01)
(Continued)

(52) U.S. Cl.
CPC ......... *H10K 50/121* (2023.02); *C07D 471/04* (2013.01); *C07F 5/027* (2013.01);
(Continued)

(58) Field of Classification Search
CPC .................. H10K 50/121; H10K 2101/90
See application file for complete search history.

(56) References Cited

U.S. PATENT DOCUMENTS

| 2016/0064684 A1 | 3/2016 | Seo et al. |
| 2017/0012207 A1 | 1/2017 | Seo et al. |

(Continued)

FOREIGN PATENT DOCUMENTS

| CN | 106467553 A | 3/2017 |
| CN | 109378392 A | 2/2019 |

(Continued)

OTHER PUBLICATIONS

Extended European Search Report dated Apr. 6, 2022, issued in corresponding European Patent Application No. 21205207.0.

(Continued)

*Primary Examiner* — Sean M DeGuire
(74) *Attorney, Agent, or Firm* — Morgan, Lewis & Bockius LLP

(57) ABSTRACT

An organic light emitting diode includes a first electrode; a second electrode facing the first electrode; and a first emitting material layer including a first compound, a second compound and a third compound and positioned between the first and second electrodes, wherein an onset wavelength of the second compound is greater than an onset wavelength of the first compound and is smaller than an onset wavelength of the third compound, wherein a maximum emission wavelength of the second compound is smaller than a maximum emission wavelength of the first compound, and a maximum emission wavelength of the third compound is equal to or smaller than a maximum emission wavelength of the first compound, and wherein a full width at half maximum of each of the second and third compounds is smaller than a full width at half maximum of the first compound.

17 Claims, 34 Drawing Sheets

(51) Int. Cl.
  C07F 5/02 (2006.01)
  C09K 11/06 (2006.01)
  H10K 85/60 (2023.01)
  *H10K 50/11* (2023.01)
  *H10K 50/19* (2023.01)
  *H10K 59/80* (2023.01)
  *H10K 101/00* (2023.01)
  *H10K 101/10* (2023.01)
  *H10K 101/20* (2023.01)

(52) U.S. Cl.
  CPC .......... C09K 11/06 (2013.01); H10K 85/6572 (2023.02); *C09K 2211/1018* (2013.01); *H10K 50/11* (2023.02); *H10K 50/19* (2023.02); *H10K 59/873* (2023.02); *H10K 85/658* (2023.02); *H10K 2101/10* (2023.02); *H10K 2101/20* (2023.02); *H10K 2101/90* (2023.02)

(56) References Cited

U.S. PATENT DOCUMENTS

| | | |
|---|---|---|
| 2017/0040553 A1 | 2/2017 | Watabe |
| 2020/0136059 A1 | 4/2020 | Hong et al. |
| 2020/0185621 A1 | 6/2020 | Yoo et al. |
| 2020/0313096 A1* | 10/2020 | Kim .................. C07F 5/027 |
| 2020/0343469 A1 | 10/2020 | Ohsawa et al. |
| 2021/0280811 A1 | 9/2021 | Ohsawa et al. |

FOREIGN PATENT DOCUMENTS

| | | |
|---|---|---|
| CN | 111106256 A | 5/2020 |
| CN | 111755628 A | 10/2020 |
| JP | 2020090485 A | 6/2020 |
| KR | 10-2016-0026717 A | 3/2016 |
| KR | 10-2018-0030081 A | 3/2018 |
| KR | 10-2018-0039086 A | 4/2018 |
| KR | 10-2020-0068352 A | 6/2020 |
| WO | 2019-087003 A1 | 5/2019 |
| WO | 2019235452 A1 | 12/2019 |
| WO | 2020-012304 A1 | 1/2020 |
| WO | WO2020040298 A1 | 9/2021 |

OTHER PUBLICATIONS

Song Eun Lee et al., 2014 "Enhanced Hybrid Blue Organic Light Emitting Diodes with a Multi-Emitting Layer Using Fluorescent and Phosphorescent Emitters," Molecular Crystals and Liquid Crystals vol. 601:1, 223-230.

Office Action dated Dec. 23, 2022, issued in corresponding Taiwan Patent Application No. 110140911.

Search Report dated Nov. 1, 2022, issued in corresponding Japan Patent Application No. 2021-195164.

Korean Office Action dated Jan. 17, 2025 issued in corresponding Korean Patent Application No. 10-2020-0186092.

* cited by examiner

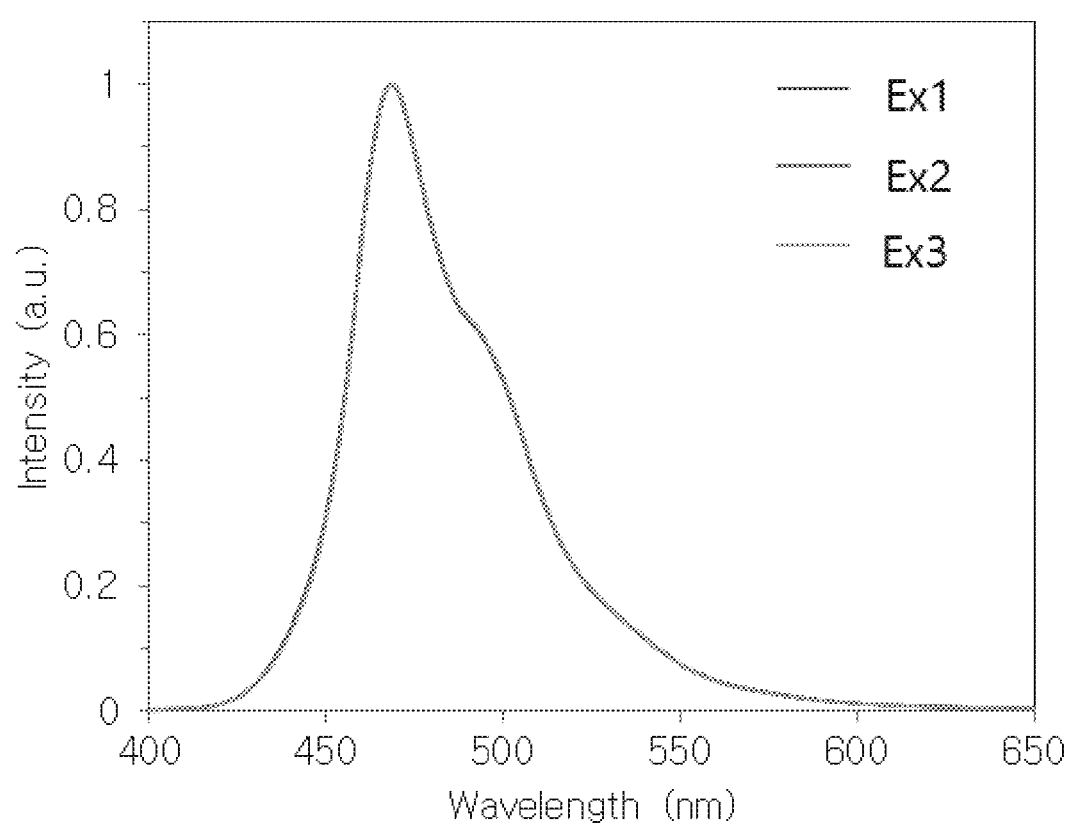

ORGANIC LIGHT EMITTING DIODE AND ORGANIC LIGHT EMITTING DEVICE INCLUDING THE SAME

CROSS-REFERENCE TO RELATED APPLICATIONS

The present application claims the benefit of Korean Patent Application No. 10-2020-0186092 filed in the Republic of Korea on Dec. 29, 2020, which is hereby incorporated by reference in its entirety.

BACKGROUND

Technical Field

The present disclosure relates to an organic light emitting diode, and more particularly, to an organic light emitting diode having excellent emitting property and an organic light emitting device including the organic light emitting diode.

Discussion of the Related Art

Recently, requirement for flat panel display devices having small occupied area is increased. Among the flat panel display devices, a technology of an organic light emitting display device, which includes an organic light emitting diode (OLED) and may be called to as an organic electroluminescent device, is rapidly developed.

The OLED emits light by injecting electrons from a cathode as an electron injection electrode and holes from an anode as a hole injection electrode into an emitting material layer, combining the electrons with the holes, generating an exciton, and transforming the exciton from an excited state to a ground state.

The emitting material in the emitting material layer of the OLED may be classified into a phosphorescent material, a fluorescent material and a delayed fluorescent material. Each of the delayed fluorescent material and the phosphorescent material has a wider full width at half maximum (FWHM) than the fluorescent material, while the fluorescent material has a lower emitting efficiency than the delayed fluorescent material and the phosphorescent material.

SUMMARY

Accordingly, embodiments of the present disclosure are directed to an OLED and an organic light emitting device that substantially obviate one or more of the problems associated with the limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages in accordance with embodiments of the present disclosure, as embodied and broadly described herein, an organic light emitting diode comprises a first electrode; a second electrode facing the first electrode; and a first emitting material layer including a first compound, a second compound and a third compound and positioned between the first and second electrodes, wherein an onset wavelength of the second compound is greater than an onset wavelength of the first compound and is smaller than an onset wavelength of the third compound, wherein a maximum emission wavelength of the second compound is smaller than a maximum emission wavelength of the first compound, and a maximum emission wavelength of the third compound is equal to or smaller than a maximum emission wavelength of the first compound, and wherein a full width at half maximum of each of the second and third compounds is smaller than a full width at half maximum of the first compound.

In another aspect, an organic light emitting device comprises a substrate; and an organic light emitting diode disposed on or over the substrate, the organic light emitting diode including: a first electrode; a second electrode facing the first electrode; and a first emitting material layer including a first compound, a second compound and a third compound and positioned between the first and second electrodes, wherein an onset wavelength of the second compound is greater than an onset wavelength of the first compound and is smaller than an onset wavelength of the third compound, wherein a maximum emission wavelength of the second compound is smaller than a maximum emission wavelength of the first compound, and a maximum emission wavelength of the third compound is equal to or smaller than a maximum emission wavelength of the first compound, and wherein a full width at half maximum of each of the second and third compounds is smaller than a full width at half maximum of the first compound.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain various principles of the present disclosure.

FIGS. 8A to 8G are graphs of an EL spectrum of the OLEDs according to the third and fourth embodiments of the present disclosure.

DETAILED DESCRIPTION

Reference will now be made in detail to examples and embodiments of the disclosure, which are illustrated in the accompanying drawings.

The present disclosure relates to an OLED, in which a delayed fluorescent material, a phosphorescent material and a fluorescent material are applied in a single emitting material layer or adjacent emitting material layers, and an organic light emitting device including the OLED. For example, the organic light emitting device may be an organic light emitting display device or an organic lightening device. As an example, an organic light emitting display device, which is a display device including the OLED of the present disclosure, will be mainly described.

Figure 1:
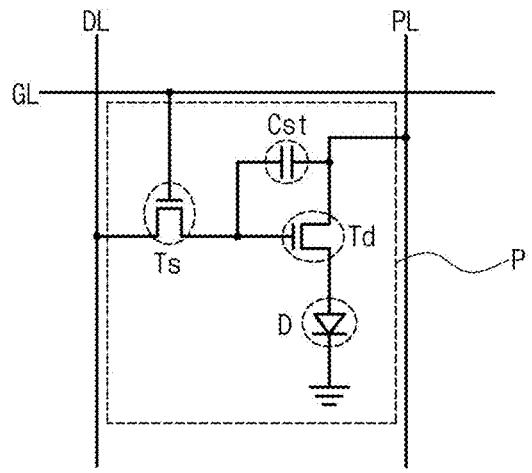
FIG. 1 is a schematic circuit diagram of an organic light emitting display device of the present disclosure.

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region may include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
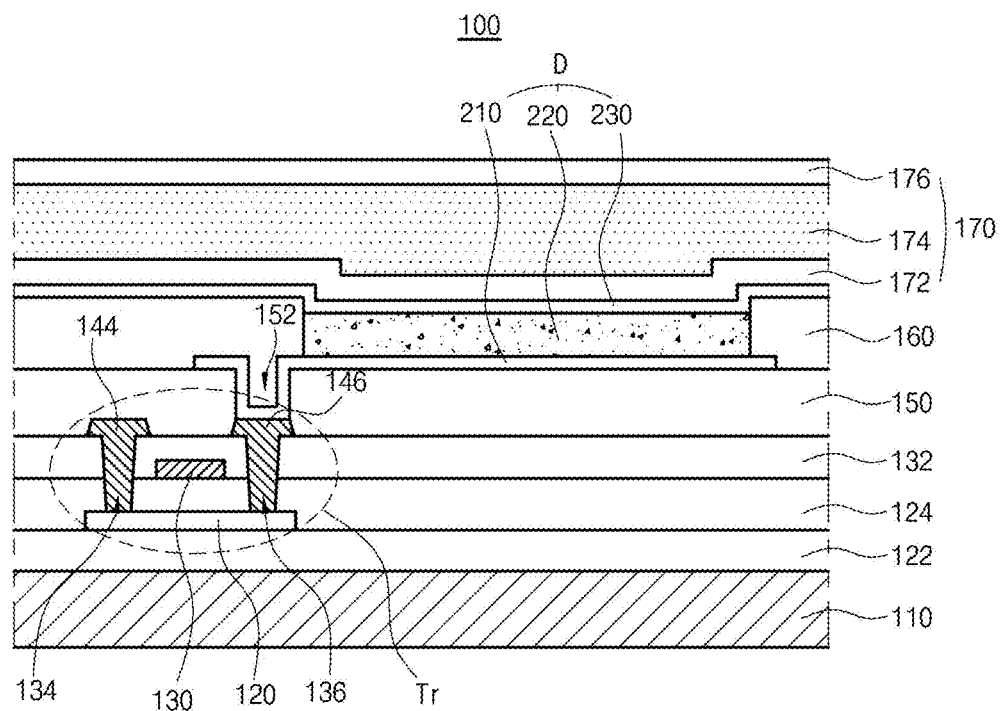
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 110, a TFT Tr and an OLED D connected to the TFT Tr.

The substrate 110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 122 is formed on the substrate, and the TFT Tr is formed on the buffer layer 122. The buffer layer 122 may be omitted.

A semiconductor layer 120 is formed on the buffer layer 122. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 124 is formed on the semiconductor layer 120. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120. In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130. The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132. The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element. In addition, the power line, which may be formed to be parallel to and spaced apart from one of the gate and data lines, and the storage capacitor for maintaining the voltage of the gate electrode of the TFT Tr in one frame may be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, an light emitting layer 220 and a second electrode 230. The light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 may be an anode and may be formed of a conductive material, e.g., a transparent conductive oxide (TCO), having a relatively high work function. For example, the first electrode 210 may be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 is operated in a bottom-emission type, the first electrode 210 may have a single-layered structure of the transparent conductive material layer. When the organic light emitting display device 100 is operated in a top-emission type, a reflection electrode or a reflection layer may be formed under the first electrode 210. For example, the reflection electrode or the reflection layer may be formed of silver (Ag) or aluminum-palladium-copper (APC) alloy. In this instance, the first electrode 210 may have a triple-layered structure of ITO/Ag/ITO or ITO/APC/ITO.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The light emitting layer 220 as an emitting unit is formed on the first electrode 210. The light emitting layer 220 may have a single-layered structure of an emitting material layer (EML) including an emitting material. To increase an emitting efficiency of the organic light emitting display device, the light emitting layer 220 may have a multi-layered structure. For example, the light emitting layer 220 may further include a hole injection layer (HIL), a hole transporting layer (HTL), an electron blocking layer (EBL), a hole blocking layer (HBL), an electron transporting layer (ETL) and an electron injection layer (EIL). The HIL, the HTL and the EBL are sequentially disposed between the first electrode 210 and the EML, and the HBL, the ETL and the EIL are sequentially disposed between the EML and the second electrode 230. In addition, the EML may have a single-layered structure or a multi-layered structure. Moreover, two or more light emitting layers may be disposed to be spaced apart from each other such that the OLED D may have a tandem structure.

The second electrode 230 is formed over the substrate 110 where the light emitting layer 220 is formed. The second electrode 230 covers an entire surface of the display area and may be formed of a conductive material having a relatively low work function to serve as a cathode. For example, the second electrode 230 may be formed of aluminum (Al), magnesium (Mg), calcium (Ca), silver (Ag) or their alloy or combination. In the top-emission type organic light emitting display device 100, the second electrode 230 may have a thin profile (small thickness) to provide a light transmittance property (or a semi-transmittance property).

Although not shown, the organic light emitting display device 100 may include a color filter corresponding to the red, green and blue pixel regions. For example, when the OLED D, which has the tandem structure and emits the white light, is formed to all of the red, green and blue pixel regions, a red color filter pattern, a green color filter pattern and a blue color filter pattern may be formed in the red, green and blue pixel regions, respectively, such that a full-color display is provided. When the organic light emitting display device 100 is operated in a bottom-emission type, the color filter may be disposed between the OLED D and the substrate 110, e.g., between the interlayer insulating layer 132 and the planarization layer 150. Alternatively, when the organic light emitting display device 100 is operated in a top-emission type, the color filter may be disposed over the OLED D, e.g., over the second electrode 230.

An encapsulation film 170 is formed on the second electrode 230 to prevent penetration of moisture into the OLED D. The encapsulation film 170 includes a first inorganic insulating layer 172, an organic insulating layer 174 and a second inorganic insulating layer 176 sequentially stacked, but it is not limited thereto.

The organic light emitting display device 100 may further include a polarization plate (not shown) for reducing an ambient light reflection. For example, the polarization plate may be a circular polarization plate. In the bottom-emission type organic light emitting display device 100, the polarization plate may be disposed under the substrate 110. In the top-emission type organic light emitting display device 100, the polarization plate may be disposed on or over the encapsulation film 170.

In addition, in the top-emission type organic light emitting display device 100, a cover window (not shown) may be attached to the encapsulation film 170 or the polarization plate. In this instance, the substrate 110 and the cover window have a flexible property such that a flexible organic light emitting display device may be provided.

Figure 3:
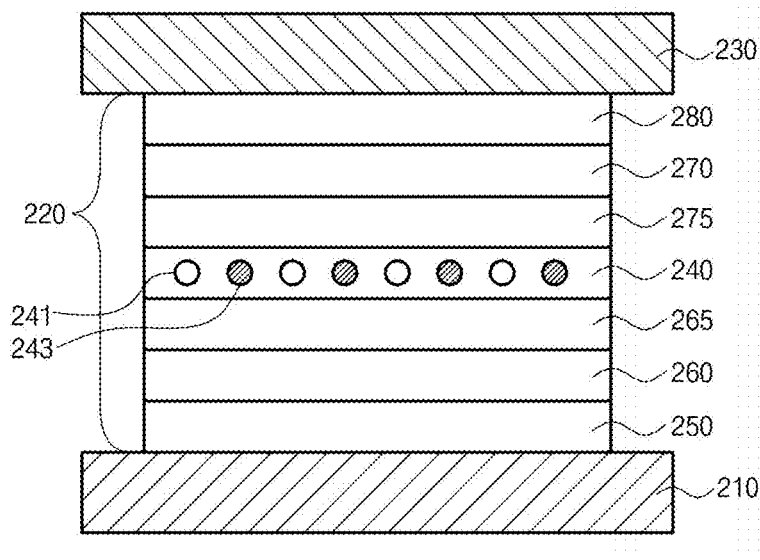
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first and second electrodes 210 and 230, which face each other, and the light emitting layer 220 therebetween. The light emitting layer 220 includes an emitting material layer (EML) 240. The organic light emitting display device 100 (of FIG. 2) may include a red pixel region, a green pixel region and a blue pixel region, and the OLED D1 may be positioned in each of the red, green and blue pixel regions.

The first electrode 210 may be an anode, and the second electrode 230 may be a cathode.

The light emitting layer 220 may further include at least one of a hole transporting layer (HTL) 260 between the first electrode 210 and the EML 240 and an electron transporting layer (ETL) 270 between the second electrode 230 and the EML 240.

In addition, the light emitting layer 220 may further include at least one of a hole injection layer (HIL) 250 between the first electrode 210 and the HTL 260 and an electron injection layer (EIL) 280 between the second electrode 230 and the ETL 270.

Moreover, the light emitting layer 220 may further include at least one of an electron blocking layer (EBL) 265 between the HTL 260 and the EML 240 and a hole blocking layer (HBL) 275 between the EML 240 and the ETL 270.

For example, the HIL 250 may include at least one compound selected from the group consisting of 4,4',4"-tris (3-methylphenylamino)triphenylamine (MTDATA), 4,4',4"-tris(N,N-diphenyl-amino)triphenylamine(NATA), 4,4',4"-tris(N-(naphthalene-1-yl)-N-phenyl-amino)triphenylamine (1T-NATA), 4,4',4"-tris(N-(naphthalene-2-yl)-N-phenyl-amino)triphenylamine(2T-NATA), copper phthalocyanine (CuPc), tris(4-carbazoyl-9-yl-phenyl)amine(TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile(dipyrazino[2,3-f:2' 3'-h]quinoxaline-2,3,6,7,10,11-hexacarbonitrile; HAT-CN), 1,3,5-tris[4-(diphenylamino)phenyl]benzene(TDAPB), poly (3,4-ethylenedioxythiphene)polystyrene sulfonate(PEDOT/ PSS), and N-(biphenyl-4-yl)-9,9-dimethyl-N-(4-(9-phenyl-9H-carbazol-3-yl)phenyl)-9H-fluoren-2-amine, but it is not limited thereto. The HIL 250 may have a thickness of about 1 to 30 nm.

The HTL 260 may include at least one compound selected from the group consisting of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N, N'-bis(4-butylpnehyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yOphenyObiphenyl-4-amine, but it is not limited thereto. The HTL 260 may have a thickness of about 10 to 100 nm.

The ETL 270 may include at least one of an oxadiazole-based compound, a triazole-based compound, a phenanthroline-based compound, a benzoxazole-based compound, a benzothiazole-based compound, a benzimidazole-based compound, and a triazine-based compound. For example, the ETL 270 may include at least one compound selected from the group consisting of tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3, 5-tris(N-phenylbenzimidazol-2-yl)benzene (TPBi), bis(2-methyl-8-quinolinolato-N1,O8)-(1,1'-biphenyl-4-olato) aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl) biphenyl-3-yl)1,3,5-triazine (TmPPPyTz), poly[9,9-bis(3'-((N,N-dimethyl)-N-ethylammonium)-propyl)-2,7-fluorene]-alt-2,7-(9,9-dioctylfluorene)]dibromide (PFNBr), tris(phenylquinoxaline (TPQ), and diphenyl-4-triphenylsi-lyl-phenylphosphine oxide (TSPO1), but it is not limited thereto. The ETL 270 may have a thickness of about 10 to 100 nm.

The EIL 280 may include at least one of an alkali halide compound, such as LiF, CsF, NaF, or $BaF_2$, and an organometallic compound, such as Liq, lithium benzoate, or sodium stearate, but it is not limited thereto. The EIL 280 may have a thickness of about 0.1 to 10 nm.

The EBL 265, which is positioned between the HTL 260 and the EML 240 to block the electron transfer from the EML 240 into the HTL 260, may include at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl) benzene (mCP), 3,3'-bis(N-carbazolyl)-1,1'-biphenyl (mCBP), CuPc, N,N'-bis[4-[bis(3-methylphenyl)amino] phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene), but it is not limited thereto. The EBL 265 may have a thickness of about 5 to 30 nm.

The HBL 275, which is positioned between the EML 240 and the ETL 270 to block the hole transfer from the EML 240 into the ETL 270, may include the above material of the ETL 270. For example, the material of the HBL 275 has a HOMO energy level being lower than a material of the EML 240 and may be at least one compound selected from the group consisting of BCP, BAlq, Alq3, PBD, spiro-PBD, Liq, bis-4,6-(3,5-di-3-pyridylphenyl)-2-methylpyrimidine (B3PYMPM), bis[2-(diphenylphosphino)phenyl]ether oxide (DPEPO), 9-(6-9H-carbazol-9-yl)pyridine-3-yl)-9H-3,9'-bicarbazole, and TSPO1, but it is not limited thereto. The HBL 275 may have a thickness of about 1 to 30 nm.

The EML 240 include a first compound 241 having a delayed fluorescent property (or characteristic) and a second compound 243 having a fluorescent property. In addition, the EML 240 may further include a third compound (not shown) as a host.

The first compound 241 having the delayed fluorescent property has high emitting efficiency. However, the first compound 241 has a wide FWHM. Accordingly, when the first compound 241 in the EML 240 acts as a dopant (i.e., emitter), the OLED has a disadvantage in a color purity.

To overcome the above problem of the color purity, the EML 240 of the OLED D1 further includes the second compound 243 having the fluorescent property.

A difference between a singlet energy level and a triplet energy level of the first compound 241 is very small (is less than about 0.3 eV). The energy of the triplet exciton of the first compound 241 is converted into the singlet exciton by a reverse intersystem crossing (RISC) such that the first compound 241 has high quantum efficiency. The singlet exciton of the first compound 241 is transported into the second compound, and the emission is generated from the second compound 243. As a result, the OLED D1 provide the emission with narrow FWHM by the second compound 243 and high emitting efficiency by the first compound 241.

Figure 4:
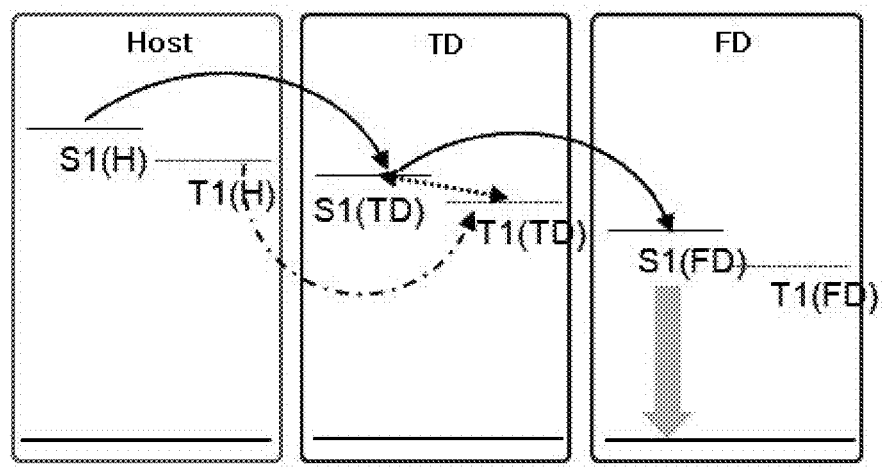
FIG. 4 is schematic view illustrating a mechanism of the light emission in an emitting material layer of the OLED according to the second embodiment of the present disclosure.

Namely, referring to FIG. 4, which is schematic view illustrating a mechanism of the light emission in an emitting material layer of the OLED according to the second embodiment of the present disclosure, the singlet energy level S1 and the triplet energy level T1 generated in the third compound as the host are transported into the first compound 241 "TD". Since the difference between a singlet energy level and a triplet energy level of the first compound 241 is small, the energy of the triplet energy level T1 of the first compound 241 is converted into the singlet energy level S1 of the first compound 241 by the RISC. Then, the singlet energy level S1 of the first compound 241 is transported into the singlet energy level S1 of the second compound 243 "FD", and the second compound 243 provide the light emission.

However, the triplet exciton stays in the first compound 241 during the period of the RISC such that the thermal degradation of the EML 240 and the non-emission quenching of the triplet exciton may occur. Accordingly, the lifespan and the emitting efficiency of the OLED D1 may be decreased. In addition, when the emission is generated from the first compound 241, the FWHM of the OLED D1 is increased.

Figure 5:
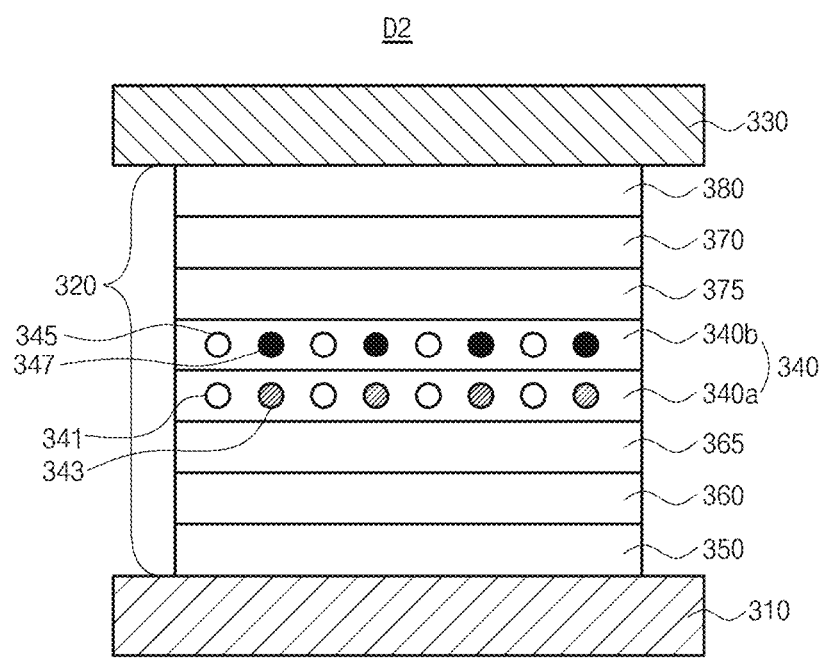
FIG. 5 is a schematic cross-sectional view of an OLED according to a third embodiment of the present disclosure.

FIG. 5 is a schematic cross-sectional view of an OLED according to a third embodiment of the present disclosure.

As shown in FIG. 5, an OLED D2 according to the third embodiment of the present disclosure includes the first and second electrodes 310 and 330, which face each other, and the light emitting layer 320 therebetween. The light emitting layer 320 includes an EML 340. The organic light emitting display device 100 (of FIG. 2) may include a red pixel region, a green pixel region and a blue pixel region, and the OLED D2 may be positioned in each of the red, green and blue pixel regions.

The first electrode 310 may be an anode, and the second electrode 330 may be a cathode.

The light emitting layer 320 may further include at least one of the HTL 360 between the first electrode 310 and the EML 340 and the ETL 370 between the second electrode 330 and the EML 340.

In addition, the light emitting layer 320 may further include at least one of the HIL 350 between the first electrode 310 and the HTL 360 and the EIL 380 between the second electrode 330 and the ETL 370.

Moreover, the light emitting layer 320 may further include at least one of the EBL 365 between the HTL 360 and the EML 340 and the HBL 375 between the EML 340 and the ETL 370.

The EML 340 includes a first compound 341 and a third compound 345 each having the delayed fluorescent property, a second compound 343 having the fluorescent property or the delayed fluorescent property and a fourth compound 347 having the phosphorescent property. The EML 340 includes a first layer 340a and a second layer 340b between the first layer 340a and the second electrode 330. Namely, the second layer 340b is disposed on the first layer 340a. One of the first and second layers 340a and 340b includes the first compound 341 and the second compound 343, and the other one of the first and second layers 340a and 340b includes the third compound 345 and the fourth compound 347. Namely, the third and fourth compounds 345 and 347 are not presented in the one of the first and second layers 340a and 340b, which includes the first and second compounds 341 and 343, and the first and second compounds 341 and 343 is not presented in the other one of the first and second layers 340a and 340b, which includes the third and fourth compounds 345 and 347. The first and third compounds 341 and 345 may be same.

The second compound 343 has the fluorescent property or the delayed fluorescent property with a multi-resonance structure. Accordingly, there is the RISC in the second compound 343 such that the second compound 343 has narrow FWHM.

The OLED D2, in which the first layer 340a as the lower layer includes the first and second compounds 341 and 343 and the second layer 340b as the upper layer includes the third and fourth compounds 345 and 347, will be explained.

The EML 340 includes the first and third compounds 341 and 345 each having the delayed fluorescent property, the second compound 343 having the fluorescent property or the delayed fluorescent property and the fourth compound 347 having the phosphorescent property, and the second compound 343 and the fourth compound 347 are included in the first and second layers 340a and 340b, which are separated, respectively.

The thickness of the first layer 340a may be smaller than the second layer 340b. For example, the first layer 340a may have the thickness of about 50 to 150 Å, and the second layer 340b may have the thickness of about 150 to 250 Å. The weight % of the second compound 343 in the first layer 340a may be equal to or greater than that of the fourth compound 347 in the second layer 340b. For example, the weight % of the second compound 343 in the first layer 340a may be about 1 to 5, preferably, about 3 to 5. The weight % of the fourth compound 347 in the second layer 340b may be about 1 to 3.

Each of the first and third compounds 341 and 345 may be represented by Formula 1-1.

[Formula 1-1]

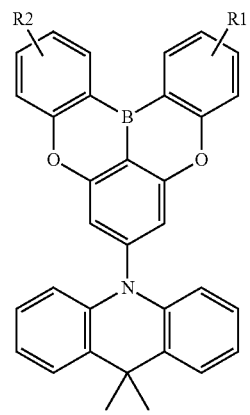

In Formula 1-1, each of R1 and R2 is independently selected from the group consisting of hydrogen (H), C1 to C10 alkyl and C6 to C30 aryl. For example, each of R1 and R2 may be tert-butyl.

Alternatively, each of the first and third compounds 341 and 345 may be represented by Formula 1-2.

[Formula 1-2]

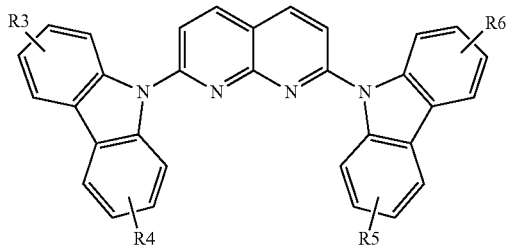

In Formula 1-2, each of R3 to R6 is independently selected from the group consisting of H, C1 to C10 alkyl and C6 to C30 aryl. For example, each of R3 to R6 may be H.

For example, each of the first and third compounds 341 and 345 may be one of the compounds in Formula 2.

[Formula 2]

TD1

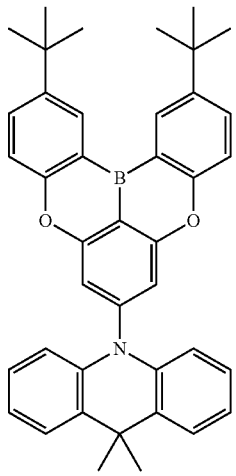

TD2

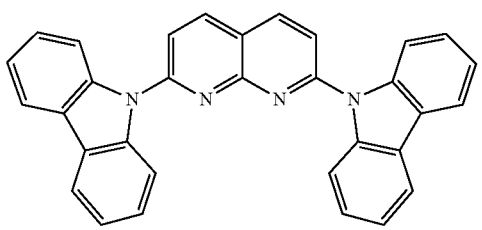

The second compound 343 may be represented by Formula 3.

[Formula 3]

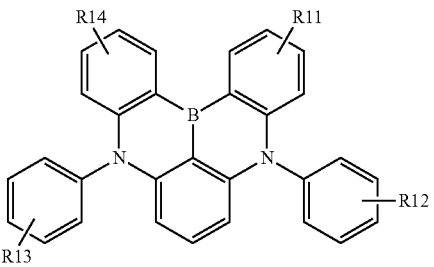

In Formula 3, each of R11 to R14 is independently selected from the group consisting of H, deuterium (D), C1 to C10 alkyl, C6 to C30 aryl and C6 to C30 arylamino group.

For example, R11 may be diphenylamino group, R12 may be H, and each of R13 and R14 may be phenyl. The second compound 343 may be the compound of Formula 4.

[Formula 4]

FD1

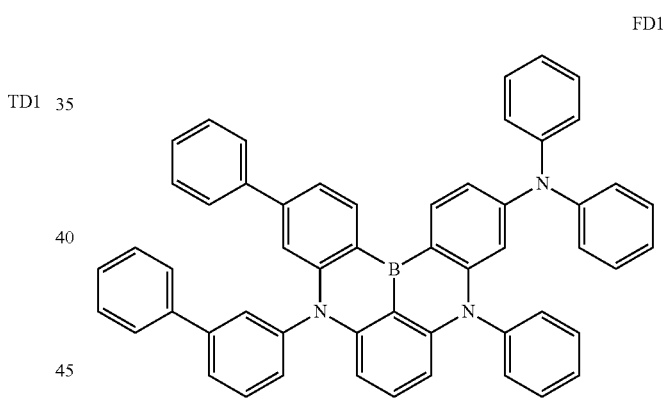

The fourth compound 347 may be represented by Formula 5-1 or Formula 5-2.

[Formula 5-1]

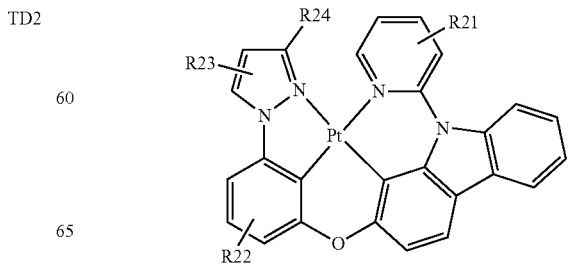

-continued

[Formula 5-2]

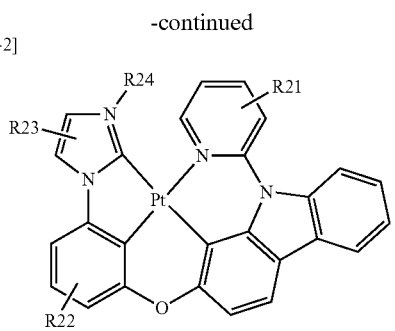

In each of Formulas 5-1 and 5-2, each of R21 to R24 is independently selected from the group consisting of H, C1 to C10 alkyl and C6 to C30 aryl.

For example, each of R21 and R22 may be tert-butyl, and each of R23 and R24 may be independently H, methyl or terphenyl. The fourth compound 347 may be the compound of Formula 6.

[Formula 6]

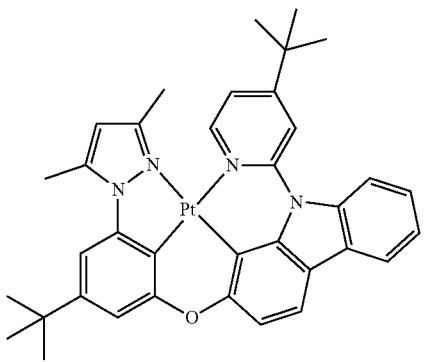

The onset wavelength of the second compound 343 is greater (longer) than that of each of the first and third compounds 341 and 345 and is smaller (shorter) than that of the fourth compound 347. In addition, the maximum emission wavelength (Amax) of the second compound 343 is smaller than that of each of the first and third compounds 341 and 345, and the maximum emission wavelength of the fourth compound 347 is equal to or smaller than that of each of the first and third compounds 341 and 345. Moreover, the FWHM of the second compound 343 is smaller than that of each of the first and third compounds 341 and 345, and the FWHM of the fourth compound 347 is smaller than that of each of the first and third compounds 341 and 345.

The onset wavelength is a wavelength value at a point where the extrapolation line and the X-axis, i.e., wavelength, intersect in a linear region of a short wavelength region in the PL spectrum. More specifically, the onset wavelength may be defined as a wavelength corresponding to a shorter wavelength among two wavelengths in which the emission intensity corresponds to $1/10$ of the maximum value in the PL spectrum.

In the EML 340, each of the first and second layers 340a and 340b may further include a host. The triplet energy level of the host may be equal to or greater (higher) than that of each of the first and third compounds 341 and 345 being the delayed fluorescent compound. When the triplet energy level of the host is smaller (lower) than that of each of the first and third compounds 341 and 345, the triplet exciton of the first and third compounds 341 and 345 is transported into the host such that the improvement of the quantum efficiency (or the emitting efficiency) and/or the lifespan by the RISC in the first and third compounds 341 and 345 is not provided.

In addition, the triplet energy level of the host may be greater than that of the fourth compound 347 having the phosphorescent property. When the triplet energy level of the host is smaller than that of the fourth compound 347, most of the triplet excitons is quenched (non-emission quenching) in the host such that the improvement of the emitting efficiency is not provided.

The host in each of the first and second layers 340a and 340b may include a p-type host and an n-type host.

The first to fourth compounds 341, 343, 345 and 347 meet the above conditions (relations) such that the second and fourth compounds 343 and 347 acts as an emitter (a dopant) in the first and second layers 340a and 340b, respectively.

For example, when the onset wavelength of the first compound 341 is greater than that of the second compound 343, the energy transfer from the first compound 341 into the second compound 343 is not secured (insufficiently generated) such that the emission is provided from the first compound 341. Accordingly, the color purity of the OLED D2 is decreased by the wide FWHM of the first compound 341. In other words, the CIEy value of the light from the OLED D2 is increased.

However, in the OLED D2 of the present disclosure, the first to fourth compounds 341, 343, 345 and 347 meet the above conditions such that the energy of the first and third compounds 341 and 345 is transferred into the second and fourth compounds 343 and 347, respectively, and the emission is provided from the second and fourth compounds 343 and 347. Accordingly, the decrease problem of the lifespan and/or the emitting efficiency by the triplet exciton in the first and third compounds 341 and 345 having the delayed fluorescent property is prevented.

In addition, since the second and fourth compounds 343 and 347 are included in the first and second layers 340a and 340b, respectively, the energy transfer from the fourth compound 347 into the second compound 343 is prevented. Namely, the transfer of the triplet exciton from the fourth compound 347 into the second compound 343 and the non-emission quenching of the triplet exciton are prevented.

Figure 6:
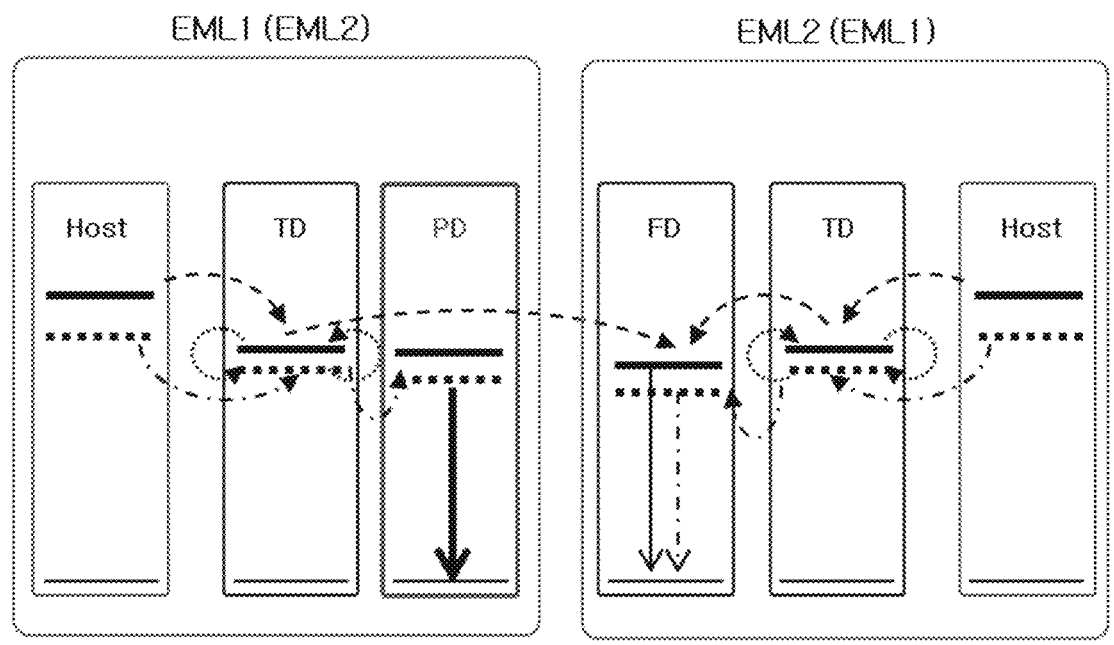
FIG. 6 is schematic view illustrating a mechanism of the light emission in an emitting material layer of the OLED according to the third embodiment of the present disclosure.

Referring to FIG. 6, which is schematic view illustrating a mechanism of the light emission in an emitting material layer of the OLED according to the third embodiment of the present disclosure, in the first layer EML1 (or EML2), the exciton is generated in the host and the first compound TD, and the exciton in the host is transferred into the first compound TD. In the first compound TD, the intersystem crossing (ISC) is occurred. Namely, in the third compound TD, a part of the singlet exciton is converted into the triplet exciton, and a part of the triplet exciton is converted into the singlet exciton. In addition, in the second layer EML2 (or EML1), the exciton is generated in the host and the third compound TD, and the exciton in the host is transferred into the third compound TD. In the third compound TD, the intersystem crossing (ISC) is occurred. Namely, in the third compound TD, a part of the singlet exciton is converted into the triplet exciton, and a part of the triplet exciton is converted into the singlet exciton.

Simultaneously, the singlet exciton of the first compound TD and the third compound TD is transferred into the singlet exciton of the second compound FD (i.e., Forster Energy Transfer, FET), and the triplet exciton of the first compound TD is transferred into the triplet exciton of the fourth compound PD (i.e., Dexter Energy Transfer, DET). Accordingly, light emission occurs in the second compound FD and the fourth compound PD.

On the other hand, since the second and fourth compounds FD and PD are separately included in the first and second layers of the EML, the energy transfer from the fourth compound PD into the second compound FD is suppressed. Accordingly, the quantum efficiency (the emitting efficiency) of the OLED is improved.

Figure 7:
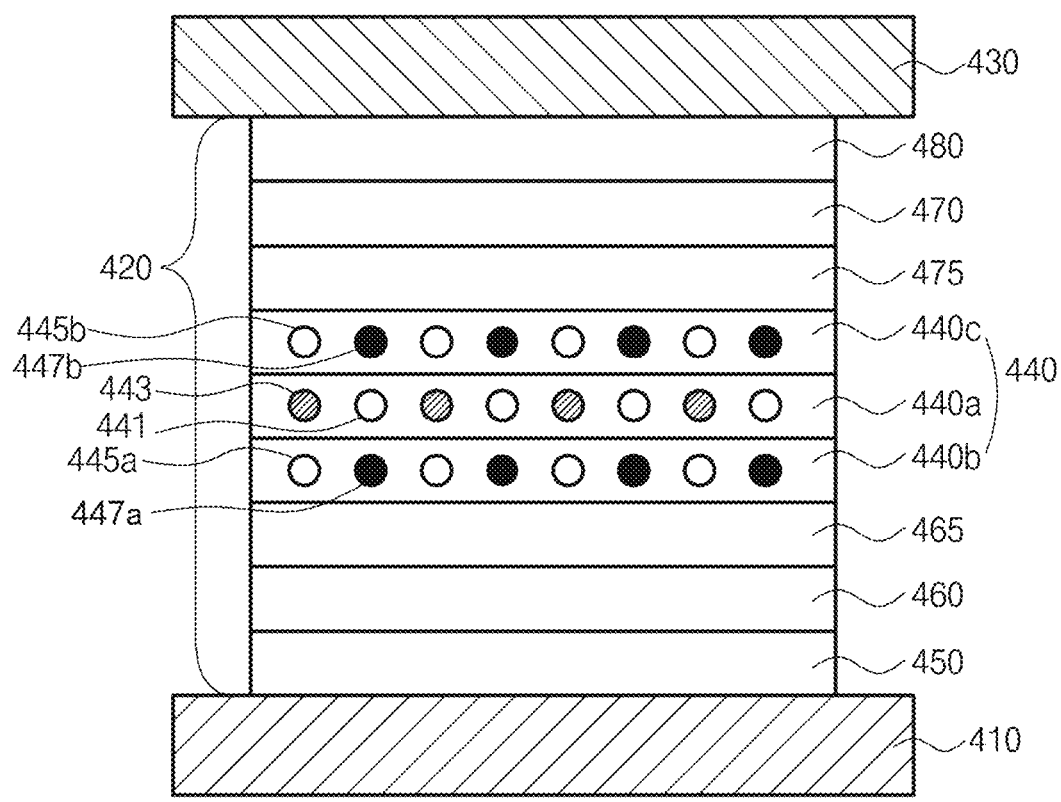
FIG. 7 is a schematic cross-sectional view of an OLED according to a fourth embodiment of the present disclosure.
Figure 8A:
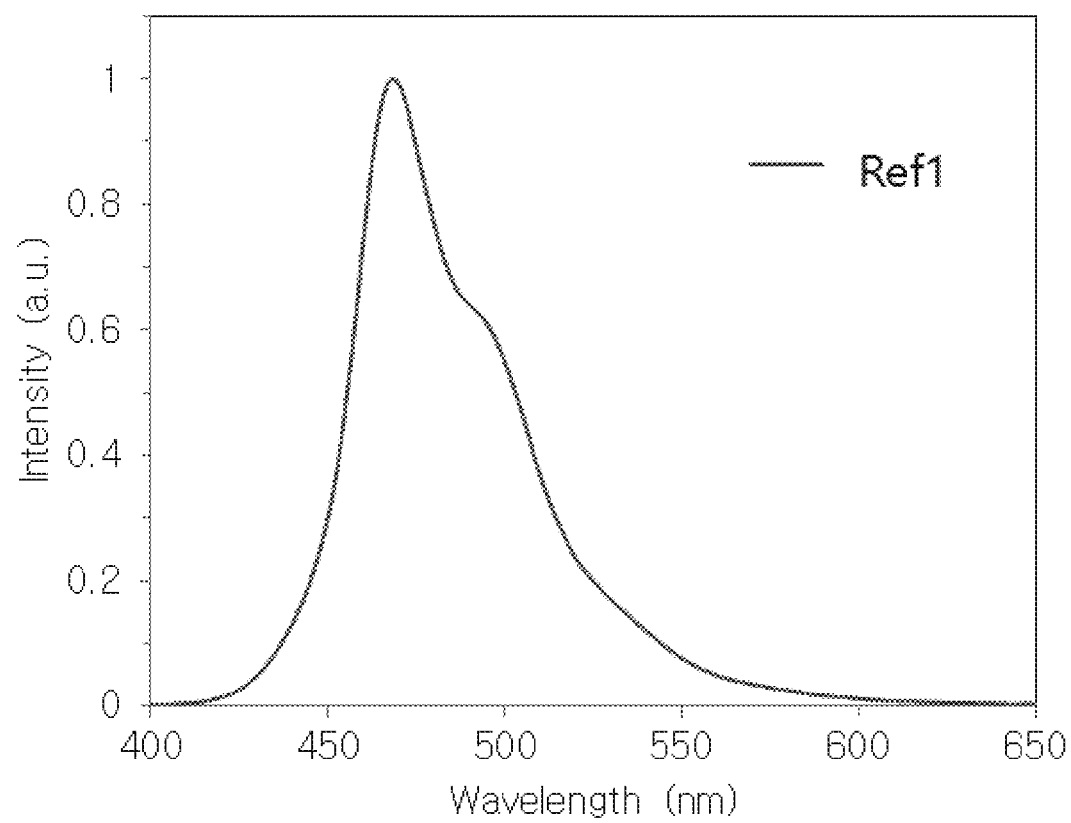
Figure 8B:
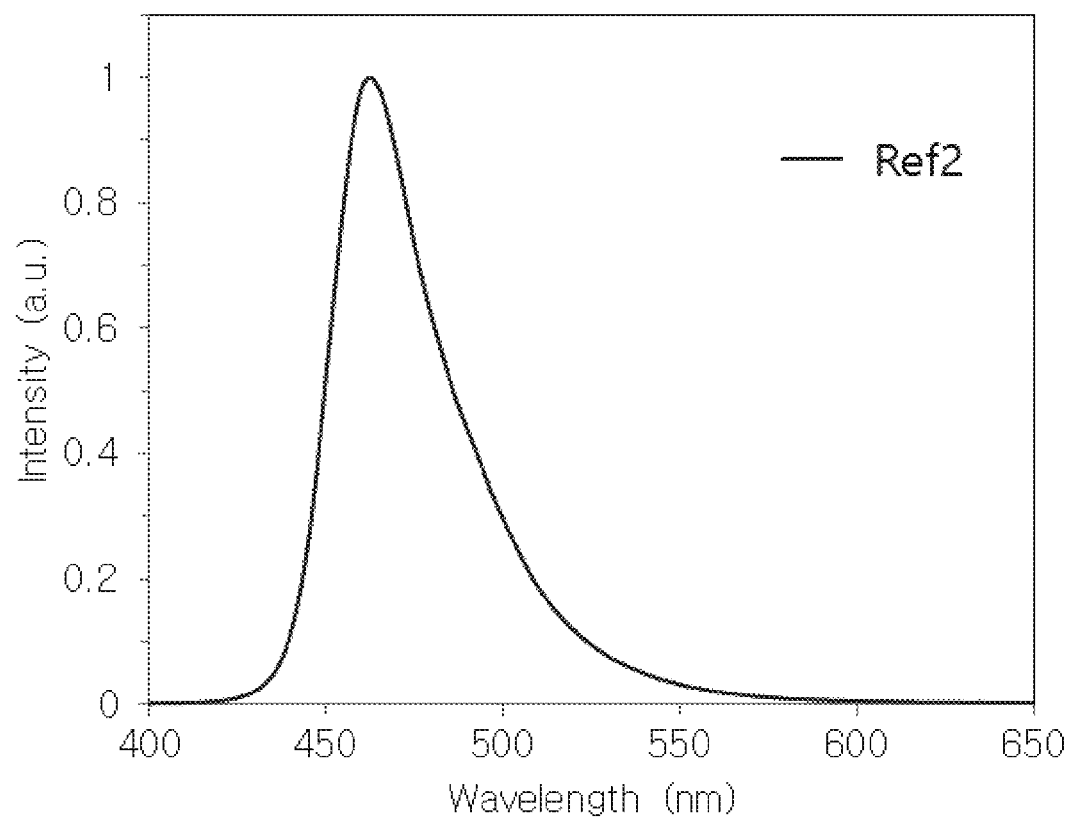
Figure 8D:
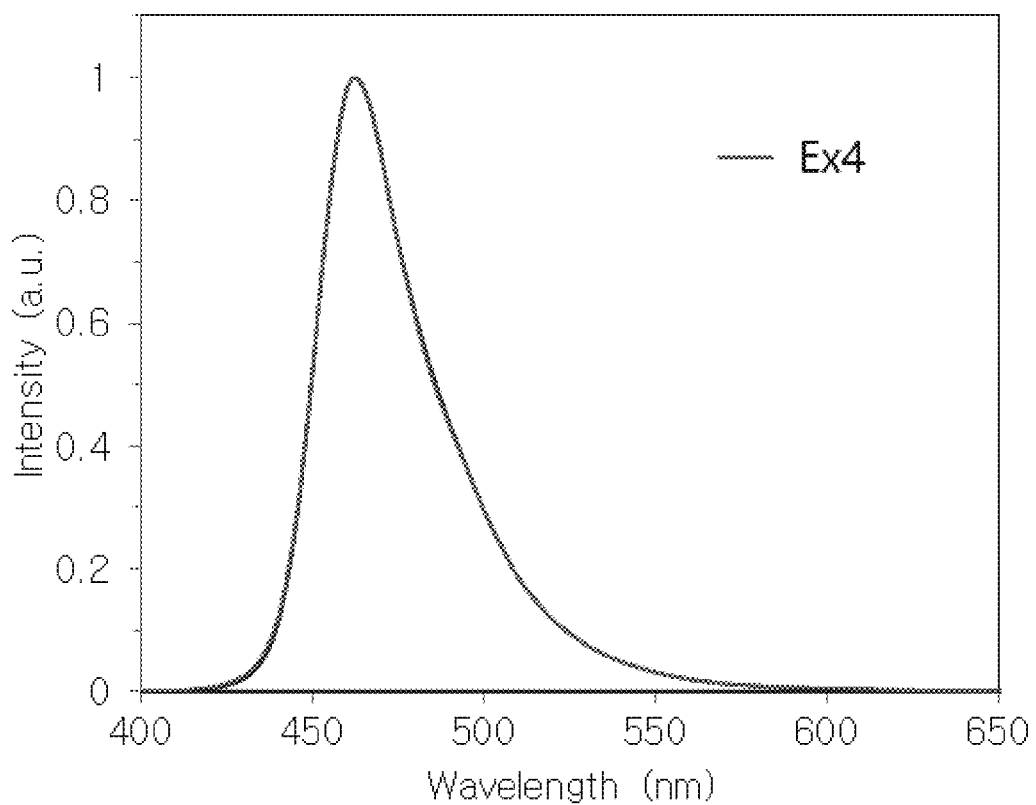
Figure 8E:
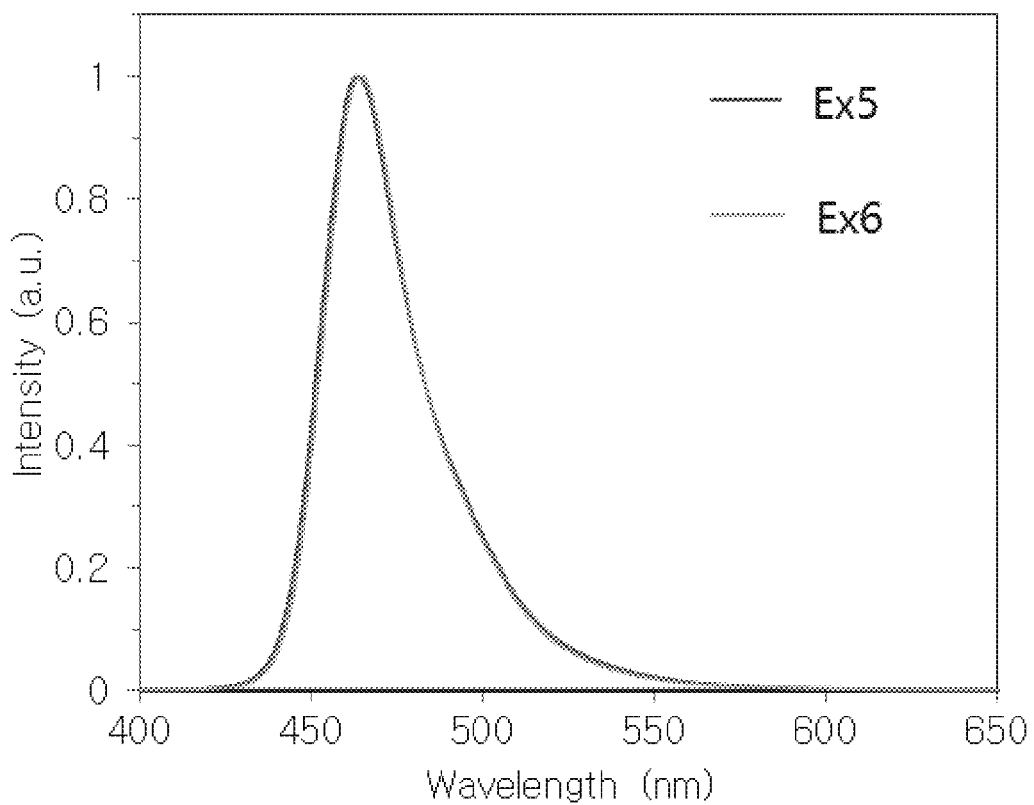
Figure 8F:
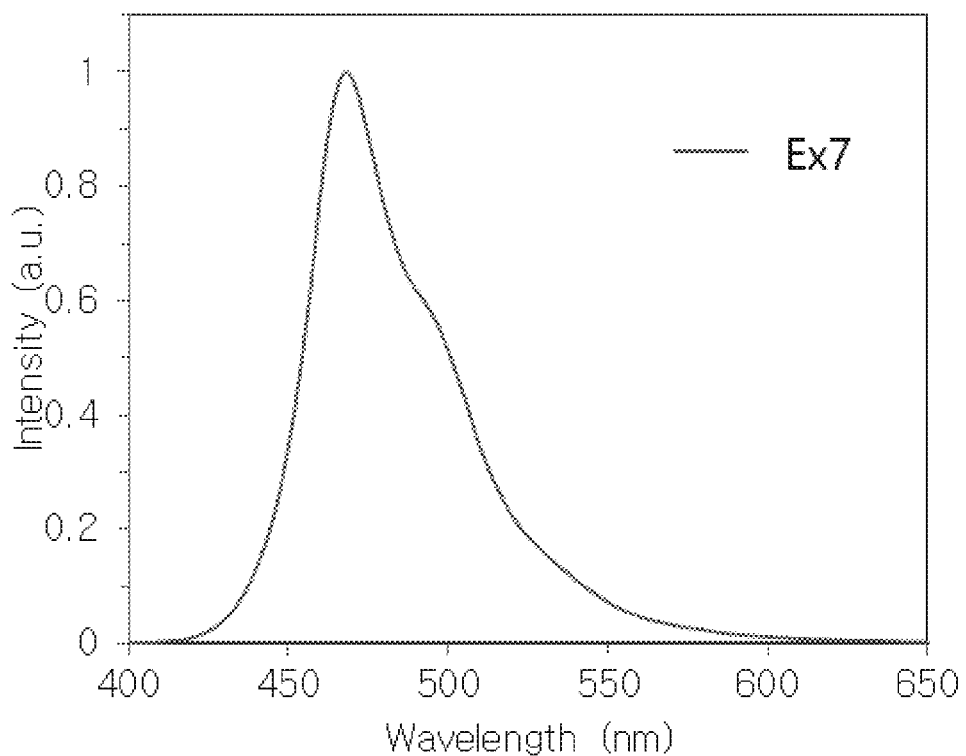
Figure 8G:
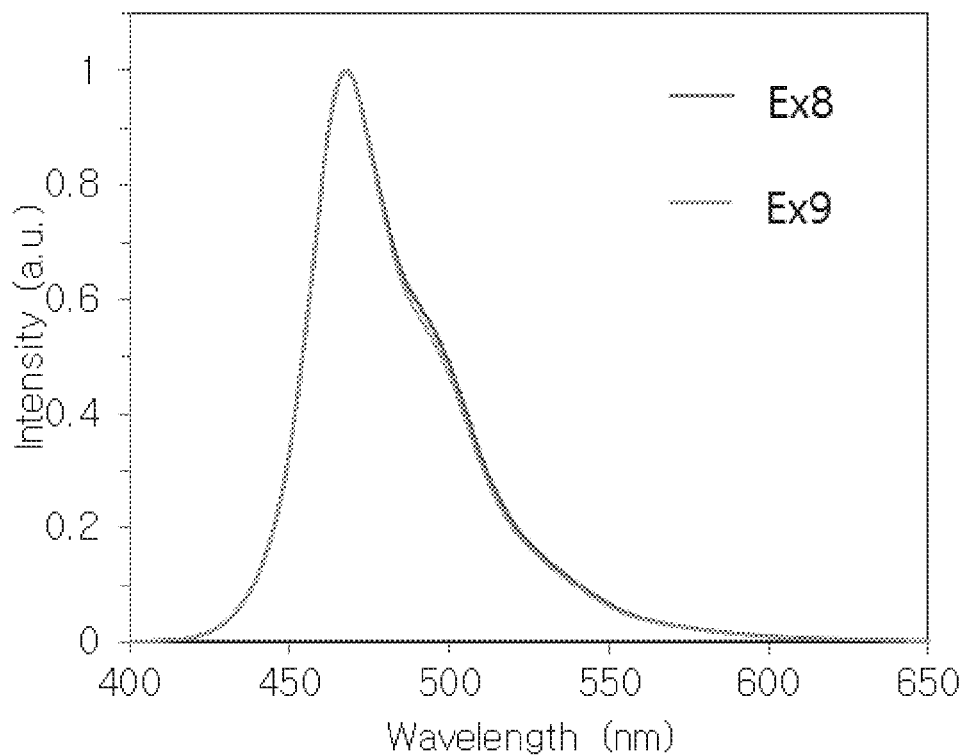

FIG. 7 is a schematic cross-sectional view of an OLED according to a fourth embodiment of the present disclosure.

As shown in FIG. 7, an OLED D3 includes the first and second electrodes 410 and 430, which face each other, and the light emitting layer 420 therebetween. The light emitting layer 420 includes an EML 440. The organic light emitting display device 100 (of FIG. 2) may include a red pixel region, a green pixel region and a blue pixel region, and the OLED D3 may be positioned in each of the red, green and blue pixel regions.

The first electrode 410 may be an anode, and the second electrode 430 may be a cathode.

The light emitting layer 420 may further include at least one of the HTL 460 between the first electrode 410 and the EML 440 and the ETL 470 between the second electrode 430 and the EML 440.

In addition, the light emitting layer 420 may further include at least one of the HIL 450 between the first electrode 410 and the HTL 460 and the EIL 480 between the second electrode 430 and the ETL 470.

Moreover, the light emitting layer 420 may further include at least one of the EBL 465 between the HTL 460 and the EML 440 and the HBL 475 between the EML 440 and the ETL 470.

The EML 440 includes first to sixth compounds 441, 443, 445a, 445b, 447a and 447b. Each of the first, third and fifth compounds 441, 445a and 445b has the delayed fluorescent property, and the second compound 443 has a fluorescent property or the delayed fluorescent property. Each of the fourth and the sixth compounds 447a and 447b has the phosphorescent property. The EML 440 includes a first layer 440a, a second layer 440b between the first layer 440a and the first electrode 410, and a third layer 440c between the first layer 440a and the second electrode 430. Namely, the first and third layers 440a and 440c are sequentially disposed on the second layer 440b. The first layer 440a includes the first and second compounds 441 and 443, and the second layer 440b includes the third and fourth compounds 445a and 447a. The third layer 440c includes the fifth and sixth compounds 445b and 447b. Namely, the third to sixth compounds 445a, 445b, 447a and 447b are not presented in the first layer 440a, and the first, second, fifth and sixth compounds 441, 443, 445b and 447b are not presented in the second layer 440b. In addition, the first to fourth compounds 441, 443, 445a and 447a are not presented in the third layer 440c. The first, third and fifth compounds 441 and 445a and 445b may be same. The fourth and the sixth compounds 447a and 447b may be same.

The first to third layers 440a, 440b and 440c may have the same thickness. For example, each of the first to third layers 440a, 440b and 440c may have the thickness of about 50 to 150 Å. The weight % of the second compound 443 in the first layer 440a may be equal to or greater than each of that of the fourth compound 447a in the second layer 440b and that of the sixth compound 447b in the third layer 440c. For example, the weight % of the second compound 443 in the first layer 440a may be about 1 to 5, preferably about 3 to 5, and each of the weight % of the fourth compound 447a in the second layer 440b and the weight % of the sixth compound 447b in the third layer 440c may be about 1 to 3.

The EML 440 includes the first, third and fifth compounds 441, 445a and 445b each having the delayed fluorescent property, the second compound 443 having the fluorescent property or the delayed fluorescent property, and the fourth and sixth compounds 447a and 447b each having the phosphorescent property, and the second, fourth and sixth compounds 443, 447a and 447b are presented in different layers, i.e., the first, second and third layers 440a, 440b and 440c.

The onset wavelength of the second compound 443 is greater than that of each of the first, third and fifth compounds 441, 445a and 445b and is smaller than that of each of the fourth and sixth compounds 447a and 447b. In addition, the maximum emission wavelength (λmax) of the second compound 443 is smaller than that of each of the first, third and fifth compounds 441, 445a and 445b, and the maximum emission wavelength of each of the fourth and sixth compounds 447a and 447b is equal to or smaller than that of each of the first, third and fifth compounds 441, 445a and 445b. Moreover, the FWHM of the second compound 443 is smaller than that of each of the first, third and fifth compounds 441, 445a and 445b, and the FWHM of each of the fourth and sixth compounds 447a and 447b is smaller than that of each of the first, third and fifth compounds 441, 445a and 445b.

In the OLED D3, the first to sixth compounds 441, 443, 445a, 447a, 445b and 447b meet the above conditions, the energy of the first, third and fifth compounds 441, 445a and 445b are respectively transferred into the second, fourth and sixth compounds 443, 447a and 447b such that the emission is provided from the second, fourth and sixth compounds 443, 447a and 447b. Accordingly, the decrease problem of the lifespan and/or the emitting efficiency by the triplet exciton in the first, third and fifth compounds 441, 445a and 445b having the delayed fluorescent property is prevented.

In addition, since the second, fourth and sixth compounds 443, 447a and 447b are included in the first, second and third layers 440a, 440b and 440c, respectively, the energy transfer from the fourth and sixth compounds 447a and 447b into the second compound 443 is prevented. Namely, the transfer of the triplet exciton from the fourth and sixth compounds 447a and 447b into the second compound 443 and the non-emission quenching of the triplet exciton are prevented.

[OLED1]

An anode (ITO, 50 nm), an HIL (Formula 7, 7 nm), an HTL (Formula 8, 78 nm), an EBL (Formula 9, 10 nm), an EML (30 nm), an HBL (Formula 10, 10 nm), an ETL (Formula 11, 25 nm), an EIL (LiF, 1 nm) and a cathode (Al, 100 nm) are sequentially deposited to form an OLED.

1. Comparative Example (1) Comparative Example 1 (Ref1)

A host (Formula 12, 59 wt %), the compound "TD1" in Formula 2 (40 wt %) and the compound "PD" in Formula 6 (1 wt %) are used to form the EML.

(2) Comparative Example 2 (Ref2)

A host (Formula 12, 59 wt %), the compound "TD1" in Formula 2 (40 wt %) and the compound "FD1" in Formula 4 (1 wt %) are used to form the EML.

2. Example

(1) Example 1 (Ex1)

A host (Formula 12, 59 wt %), the compound "TD1" in Formula 2 (40 wt %) and the compound "PD" in Formula 6 (1 wt %) are used to form a lower EML, and a host (Formula 12, 59 wt %), the compound "TD1" in Formula 2 (40 wt %) and the compound "FD1" in Formula 4 (1 wt %) are used to form an upper EML.

(2) Example 2 (Ex2)

A host (Formula 12, 59 wt %), the compound "TD1" in Formula 2 (40 wt %) and the compound "PD" in Formula 6 (1 wt %) are used to form a lower EML, and a host (Formula 12, 57 wt %), the compound "TD1" in Formula 2 (40 wt %) and the compound "FD1" in Formula 4 (3 wt %) are used to form an upper EML.

(3) Example 3 (Ex3)

A host (Formula 12, 59 wt %), the compound "TD1" in Formula 2 (40 wt %) and the compound "PD" in Formula 6 (1 wt %) are used to form a lower EML, and a host (Formula 12, 55 wt %), the compound "TD1" in Formula 2 (40 wt %) and the compound "FD1" in Formula 4 (5 wt %) are used to form an upper EML.

(4) Example 4 (Ex4)

A host (Formula 12, 59 wt %), the compound "TD1" in Formula 2 (40 wt %) and the compound "FD1" in Formula 4 (1 wt %) are used to form a lower EML, and a host (Formula 12, 59 wt %), the compound "TD1" in Formula 2 (40 wt %) and the compound "PD" in Formula 6 (1 wt %) are used to form an upper EML.

(5) Example 5 (Ex5)

A host (Formula 12, 57 wt %), the compound "TD1" in Formula 2 (40 wt %) and the compound "FD1" in Formula 4 (3 wt %) are used to form a lower EML, and a host (Formula 12, 59 wt %), the compound "TD1" in Formula 2 (40 wt %) and the compound "PD" in Formula 6 (1 wt %) are used to form an upper EML.

(6) Example 6 (Ex6)

A host (Formula 12, 55 wt %), the compound "TD1" in Formula 2 (40 wt %) and the compound "FD1" in Formula 4 (5 wt %) are used to form a lower EML, and a host (Formula 12, 59 wt %), the compound "TD1" in Formula 2 (40 wt %) and the compound "PD" in Formula 6 (1 wt %) are used to form an upper EML.

(7) Example 7 (Ex7)

A host (Formula 12, 59 wt %), the compound "TD1" in Formula 2 (40 wt %) and the compound "PD" in Formula 6 (1 wt %) are used to form a lower EML, a host (Formula 12, 59 wt %), the compound "TD1" in Formula 2 (40 wt %) and the compound "FD1" in Formula 4 (1 wt %) are used to form a middle EML, and a host (Formula 12, 59 wt %), the compound "TD1" in Formula 2 (40 wt %) and the compound "PD" in Formula 6 (1 wt %) are used to form an upper EML.

(8) Example 8 (Ex8)

A host (Formula 12, 59 wt %), the compound "TD1" in Formula 2 (40 wt %) and the compound "PD" in Formula 6 (1 wt %) are used to form a lower EML, a host (Formula 12, 57 wt %), the compound "TD1" in Formula 2 (40 wt %) and the compound "FD1" in Formula 4 (3 wt %) are used to form a middle EML, and a host (Formula 12, 59 wt %), the compound "TD1" in Formula 2 (40 wt %) and the compound "PD" in Formula 6 (1 wt %) are used to form an upper EML.

(9) Example 9 (Ex9)

A host (Formula 12, 59 wt %), the compound "TD1" in Formula 2 (40 wt %) and the compound "PD" in Formula 6 (1 wt %) are used to form a lower EML, a host (Formula 12, 55 wt %), the compound "TD1" in Formula 2 (40 wt %) and the compound "FD1" in Formula 4 (5 wt %) are used to form a middle EML, and a host (Formula 12, 59 wt %), the compound "TD1" in Formula 2 (40 wt %) and the compound "PD" in Formula 6 (1 wt %) are used to form an upper EML.

[Formula 7]

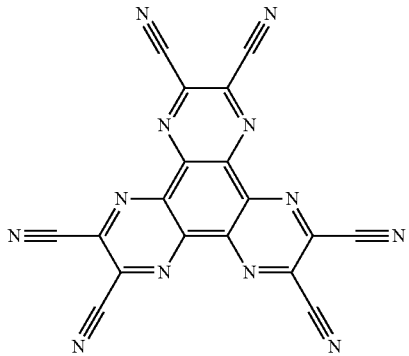

[Formula 8]

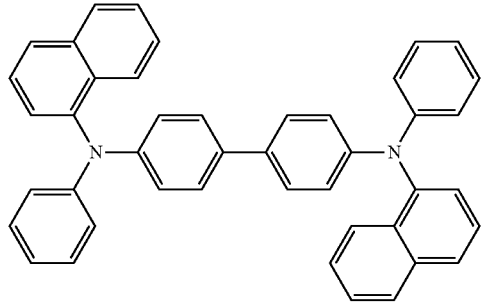

[Formula 9]

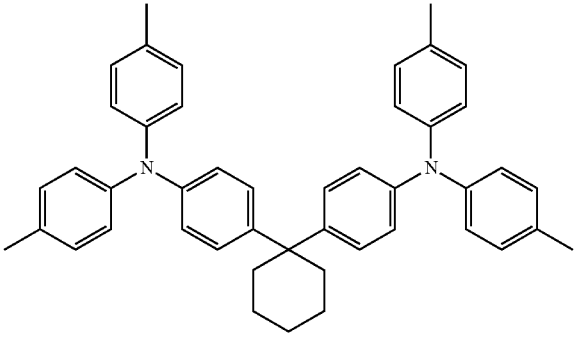

[Formula 10]

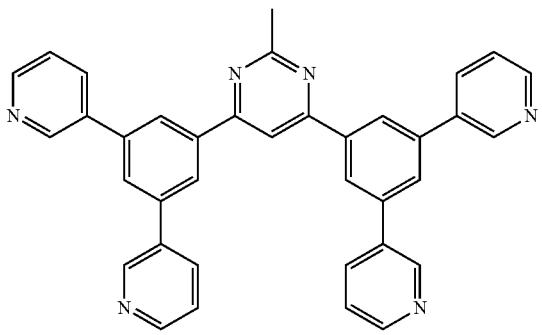

[Formula 11]

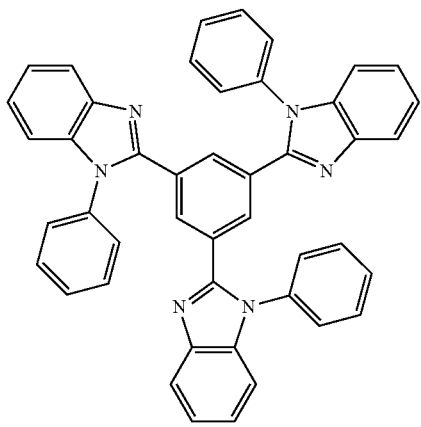

[Formula 12]

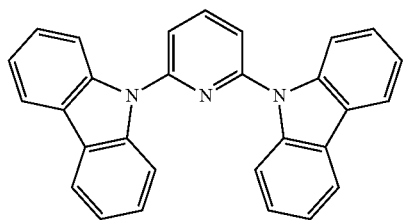

The emitting properties of the OLED in Comparative Examples 1 and 2 and Examples 1 to 9 are measured and listed in Table 1, and the EL spectrum of the OLED are shown in FIGS. 8A to 8G. (EQE=External Quantum Efficiency)

TABLE 1

| | emitting efficiency (cd/A) | EQE (%) | CIEy | FWHM (nm) | LT95 (@300 nit) |
|---|---|---|---|---|---|
| Ref1 | 19.6 | 13.6 | 0.204 | 48 | 1.2 |
| Ref2 | 12.2 | 11.9 | 0.126 | 36 | 0.6 |
| Ex1 | 21.2 | 14.9 | 0.199 | 46 | 0.7 |
| Ex2 | 21.3 | 15.0 | 0.201 | 46 | 0.7 |
| Ex3 | 20.6 | 14.4 | 0.201 | 46 | 0.7 |
| Ex4 | 12.2 | 11.9 | 0.125 | 36 | 0.6 |
| Ex5 | 10.2 | 10.6 | 0.116 | 32 | 0.7 |
| Ex6 | 9.3 | 9.8 | 0.115 | 30 | 0.7 |
| Ex7 | 20.6 | 14.8 | 0.193 | 46 | 0.9 |
| Ex8 | 20.7 | 15.2 | 0.188 | 44 | 0.8 |
| Ex9 | 20.2 | 15.1 | 0.183 | 42 | 0.9 |

As shown in Table 1 and FIGS. 8A to 8G, in the OLED of Ref1, the emission is provided from the phosphorescent compound, i.e., the compound "PD", such that the OLED has wide FWHM. On the other hand, in the OLED of Ref2, the emission is provided from the first compound, i.e., the compound "TD1" as well as the fluorescent compound, i.e., the compound "FD1", because the triplet exciton stays in the first compound. As a result, in the OLED of Ref2, the FWHM becomes relatively wide, and the emitting efficiency is decreased.

However, the OLED of Ex1 to Ex9 provides narrow FWHM and relatively high emitting efficiency. Particularly, in the OLED of Ex4 to Ex6 including the second compound in the first layer being adjacent to the anode, the emission from the first compound is minimized or prevented such that the OLED of Ex4 to Ex6 provides equivalent or narrower FWHM than the OLED of Ref2. In addition, in the OLED of Ex5 and Ex6, where the weight % of the second compound, i.e., the compound "FD1" in the first layer, i.e., the lower EML, is greater than that of the fourth compound, i.e., the compound "PD", in the second layer, i.e., the upper EML, the FWHM is further narrowed such that the color purity is improved.

Moreover, in the OLED of Ex4 to Ex9, the OLED has lower CIEy value to provide high color purity.

Namely, in the OLED according to the third and fourth embodiments of the present disclosure, the second layer including the fourth compound is disposed at a side of the second electrode as the cathode, and the first layer including the second compound is disposed between the first electrode as the anode and the second layer. As a result, the optical property of the OLED is improved. Furthermore, the third layer including the fourth compound is further disposed between the first layer and the first electrode such that the color purity and the emitting efficiency of the OLED are further improved. In the OLED according to the fourth embodiment of the present disclosure, e.g., the OLED of Ex7 to Ex9, the emitting efficiency is significantly increased, the FWHM is decreased, and the lifespan is increased.

When the weight % of the second compound in the first layer is greater than that of the fourth compound in the second layer, the color purity of the OLED is further improved.

Figure 9:
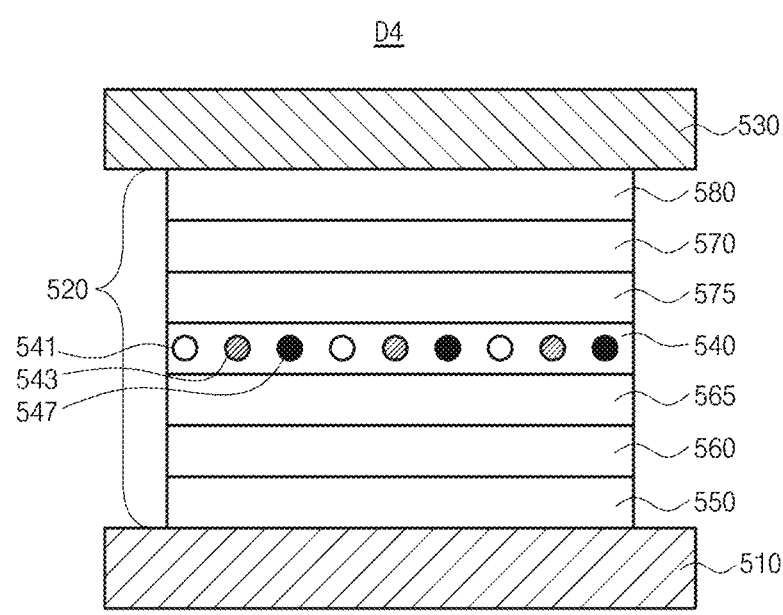
FIG. 9 is a schematic cross-sectional view of an OLED according to a fifth embodiment of the present disclosure.

FIG. 9 is a schematic cross-sectional view of an OLED according to a fifth embodiment of the present disclosure.

As shown in FIG. 9, the OLED D4 includes the first and second electrodes 510 and 530, which face each other, and the light emitting layer 520 therebetween. The light emitting layer 520 includes an emitting material layer (EML) 540. The organic light emitting display device 100 (of FIG. 2) may include a red pixel region, a green pixel region and a blue pixel region, and the OLED D4 may be positioned in each of the red, green and blue pixel regions.

The first electrode 510 may be an anode, and the second electrode 530 may be a cathode.

The light emitting layer 520 may further include at least one of a hole transporting layer (HTL) 560 between the first electrode 510 and the EML 540 and an electron transporting layer (ETL) 570 between the second electrode 530 and the EML 540.

In addition, the light emitting layer 520 may further include at least one of a hole injection layer (HIL) 550 between the first electrode 510 and the HTL 560 and an electron injection layer (EIL) 580 between the second electrode 530 and the ETL 570.

Moreover, the light emitting layer 520 may further include at least one of an electron blocking layer (EBL) 565 between the HTL 560 and the EML 540 and a hole blocking layer (HBL) 575 between the EML 540 and the ETL 570.

The EML 540 include a first compound 541 having the delayed fluorescent property, a second compound 543 having the fluorescent property or the delayed fluorescent property and a third compound 547 having the phosphorescent property. The first to third compounds 541, 543 and 547 are mixed and included in one-layer (single layer).

As described above, the second compound 543 has the fluorescent property or the delayed fluorescent property with a multi-resonance structure. Accordingly, there is the RISC in the second compound 543 such that the second compound 543 has narrow FWHM.

In the EML 540, the weight % of the second compound 543 may be equal to or smaller than that of the third compound 547. For example, with respect to the second compound 543, the third compound 547 has the weight % of about 100 to 1200.

The first compound 541 may be represented by Formula 1-1 or Formula 1-2 and may be one of the compounds in Formula 2. The second compound 543 may be represented by Formula 3 and may be the compounds in Formula 4. The third compound 547 may be represented by Formula 5-1 or Formula 5-2 and may be the compounds in Formula 6.

The onset wavelength of the second compound 543 is greater (longer) than that of the first compound 541 and is smaller (shorter) than that of the third compound 547. In addition, the maximum emission wavelength (λmax) of the second compound 543 is smaller than that of the first compound 541, and the maximum emission wavelength of the third compound 547 is equal to or smaller than that of the first compound 541. The maximum emission wavelength of the second compound 543 is smaller than that of the third compound 547. Moreover, the FWHM of the second compound 543 is smaller than that of the first compound 541, and the FWHM of the third compound 547 is smaller than that of the first compound 541.

Figure 10:
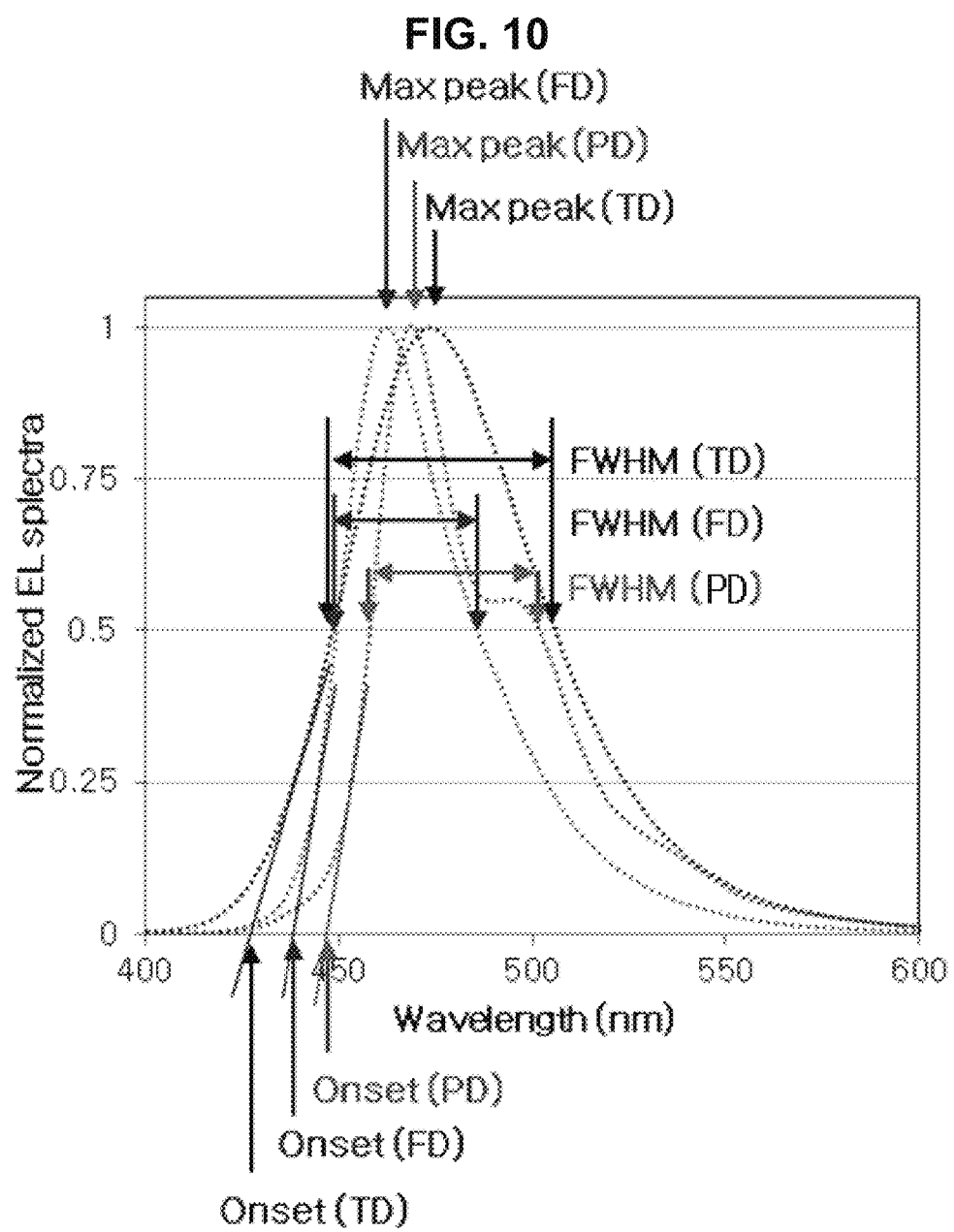
FIG. 10 is a schematic view illustrating a relation between compounds in an emitting material layer of the OLED according to the fifth embodiment of the present disclosure.

Referring to FIG. 10, which is a schematic view illustrating a relation between compounds in an emitting material layer of the OLED according to the fifth embodiment of the present disclosure, the onset wavelength of the second compound 543 (FD) is greater than that of the first compound 541 (TD) and smaller than that of the third compound 547 (PD). In addition, the maximum emission wavelength of each of the second compound 543 (FD) and the third compound 547 (PD) is smaller than that of the first compound 541 (TD), and the maximum emission wavelength of the second compound 543 (FD) is smaller than that of the third compound 547 (PD). Moreover, the FWHM of each of the second compound 543 (FD) and the third compound 547 (PD) is smaller than that of the first compound 541 (TD).

For example, a difference between the onset wavelength of the second compound 543 and the onset wavelength of the first compound 541 may be about 1 to 30 nm, preferably about 5 to 25 nm, and a difference between the onset wavelength of the second compound 543 and the onset wavelength of the third compound 547 may be about 1 to 20 nm, preferably about 5 to 15 nm. A difference between the maximum emission wavelength of the second compound 543 and the maximum emission wavelength of the first compound 541 may be about 1 to 20 nm, preferably about 3 to 15 nm, and a difference between the maximum emission wavelength of the third compound 547 and the maximum emission wavelength of the first compound 541 may be about 0.1 to 10 nm, preferably about 0.1 to 5 nm. In addition, a difference between the maximum emission wavelength of the second compound 543 and the maximum emission wavelength of the third compound 547 may be about 1 to 5 nm, preferably about 1 to 3 nm.

The EML 540 may further include a host. The triplet energy level of the host may be equal to or greater (higher) than that of the first compound 541 being the delayed fluorescent compound. When the triplet energy level of the host is smaller (lower) than that of the first compound 541, the triplet exciton of the first compound 541 is transported into the host such that the improvement of the quantum efficiency (or the emitting efficiency) and/or the lifespan by the RISC in the first compound 541 is not provided.

In addition, the triplet energy level of the host may be greater than that of the third compound 547 having the phosphorescent property. When the triplet energy level of the host is smaller than that of the third compound 547, most of the triplet excitons is quenched (non-emission quenching) in the host such that the improvement of the emitting efficiency is not provided.

The host of the EML 540 may be the same material as the material of the EBL 565. In this instance, the EML 540 may have a light emission function with an electron blocking function. Namely, the EML 540 may serve as a buffer layer for blocking the electron. When the EBL 565 is omitted, the EML 540 may serve as an emitting material layer and an electron blocking layer.

Alternatively, the host of the EML 540 may be the same material as the material of the HBL 575. In this instance, the EML 540 may have a hole blocking function with an emission function. Namely, the EML 540 may serve as a buffer layer for blocking the hole. When the HBL 575 is omitted, the EML 540 may serve as an emitting material layer and a hole blocking layer.

The host in the EML 540 may include a p-type host and an n-type host.

The first to third compounds 541, 543 and 547 meet the above conditions (relations) such that the second and third compounds 543 and 547 act as an emitter (a dopant) in the EML 540.

For example, when the onset wavelength of the first compound 541 is greater than that of the second compound 543, the energy transfer from the first compound 541 into the second compound 543 is not secured (insufficiently generated) such that the emission is provided from the first compound 541. Accordingly, the color purity of the OLED D4 is decreased by the wide FWHM of the first compound 541. In other words, the CIEy value of the light from the OLED D4 is increased.

However, in the OLED D4 of the present disclosure, the first to third compounds 541, 543 and 547 meet the above conditions such that the energy of the first compound 541 is transferred into the second and third compounds 543 and 547, respectively, and the emission is provided from the second and third compounds 543 and 547. Accordingly, the decrease problem of the lifespan and/or the emitting efficiency by the triplet exciton in the first compound 541 having the delayed fluorescent property is prevented.

In addition, since the second and third compounds 543 and 547 are included in the single layer, i.e., the EML 540, the singlet exciton and the triplet exciton of the first compound 541 are respectively transferred into the second and third compounds 543 and 547. Accordingly, the non-emission quenching problem of the triplet exciton in the first compound 541 and/or the second compound 543 is prevented.

Moreover, the maximum emission wavelength of the second compound 543 is smaller than that of the third compound 547, the energy transfer from the third compound 547 into the second compound 543 is prevented or minimized.

Accordingly, the OLED D4 provides high emitting efficiency and high color purity.

Figure 11:
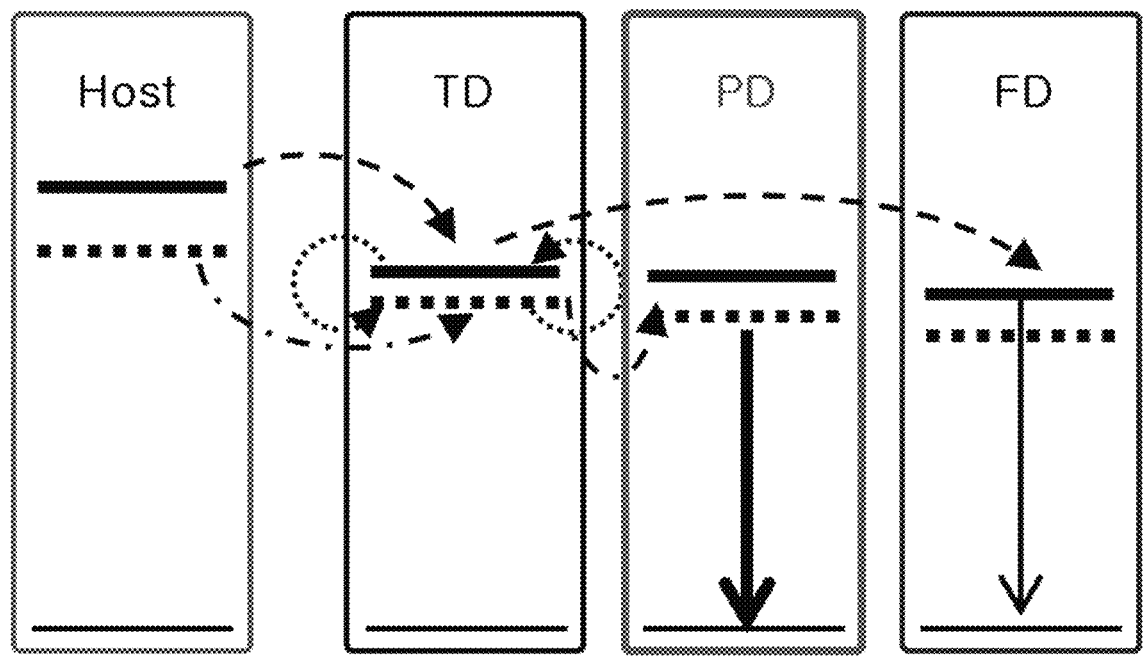
FIG. 11 is schematic view illustrating a mechanism of the light emission in an emitting material layer of the OLED according to the fifth embodiment of the present disclosure.

FIG. 11 is schematic view illustrating a mechanism of the light emission in an emitting material layer of the OLED according to the fifth embodiment of the present disclosure.

Referring to FIG. 11, the singlet exciton and the triplet exciton are generated in the first compound TD. A part of the singlet exciton is converted into the triplet exciton by the ISC, and a part of the triplet exciton is converted into the singlet exciton. Simultaneously, the singlet exciton of the first compound TD is transferred into the singlet exciton of the second compound FD (i.e., Forster Energy Transfer, FET), and the triplet exciton of the first compound TD is transferred into the triplet exciton of the third compound PD (i.e., Dexter Energy Transfer, DET).

In addition, when the EML further includes the host, the singlet exciton generated in the host is transferred into the singlet exciton of the first compound TD (i.e., FET), and the triplet exciton is transferred into the triplet exciton of the first compound TD (i.e., DET). Accordingly, the emitting efficiency can be further increased.

Consequently, since the emission is provided from the second and third compounds FD and PD and the triplet exciton of the first compound TD is transferred into the triplet exciton of the third compound PD, the triplet exciton does not remain (or stay) in the first compound TD. Accordingly, the thermal degradation, non-emission quenching and the short lifespan by the triplet exciton in the first compound TD are prevented.

Namely, when the first and second compounds TD and FD without the third compound PD are included in the EML, a part of the triplet exciton remains in the first compound TD such that the thermal degradation, non-emission quenching and the short lifespan may be generated. However, in the OLED D4 of the present disclosure, the EML includes the first to third compounds TD, FD and PD such that the above problems can be minimized or prevented.

In addition, the second and third compounds FD and PD meet the above conditions, the transfer of the triplet exciton from the third compound PD into the second compound FD is prevented.

[OLED2]

An anode (ITO, 50 nm), an HIL (Formula 7, 10 nm), an HTL (Formula 8, 45 nm), an EBL (Formula 9, 15 nm), an EML (30 nm), an HBL (Formula 10, 5 nm), an ETL (Formula 11, 35 nm), an EIL (LiF, 1 nm) and a cathode (Al, 100 nm) are sequentially deposited to form an OLED.

1. Comparative Example (1) Comparative Example 1 (Ref1)

A host (Formula 12, 60 wt %) and the compound "TD1" in Formula 2 (40 wt %) are used to form the EML.

(2) Comparative Example 2 (Ref2)

A host (Formula 12, 59 wt %), the compound "TD1" in Formula 2 (40 wt %) and the compound "PD" in Formula 6 (1 wt %) are used to form the EML.

(3) Comparative Example 3 (Ref3)

A host (Formula 12, 57 wt %), the compound "TD1" in Formula 2 (40 wt %) and the compound "PD" in Formula 6 (3 wt %) are used to form the EML.

(4) Comparative Example 4 (Ref4)

A host (Formula 12, 52 wt %), the compound "TD1" in Formula 2 (40 wt %) and the compound "PD" in Formula 6 (8 wt %) are used to form the EML.

(5) Comparative Example 5 (Ref5)

A host (Formula 12, 48 wt %), the compound "TD1" in Formula 2 (40 wt %) and the compound "PD" in Formula 6 (12 wt %) are used to form the EML.

(6) Comparative Example 6 (Ref6)

A host (Formula 12, 59 wt %), the compound "TD1" in Formula 2 (40 wt %) and the compound "FD1" in Formula 4 (1 wt %) are used to form the EML.

2. Example (1) Example 1 (Ex1)

A host (Formula 12, 58 wt %), the compound "TD1" in Formula 2 (40 wt %), the compound "FD1" in Formula 4 (1 wt %) and the compound "PD" in Formula 6 (1 wt %) are used to form the EML.

(2) Example 2 (Ex2)

A host (Formula 12, 56 wt %), the compound "TD1" in Formula 2 (40 wt %), the compound "FD1" in Formula 4 (1 wt %) and the compound "PD" in Formula 6 (3 wt %) are used to form the EML.

(3) Example 3 (Ex3)

A host (Formula 12, 51 wt %), the compound "TD1" in Formula 2 (40 wt %), the compound "FD1" in Formula 4 (1 wt %) and the compound "PD" in Formula 6 (8 wt %) are used to form the EML.

(4) Example 4 (Ex4)

A host (Formula 12, 47 wt %), the compound "TD1" in Formula 2 (40 wt %), the compound "FD1" in Formula 4 (1 wt %) and the compound "PD" in Formula 6 (12 wt %) are used to form the EML.

(5) Example 5 (Ex5)

A host (Formula 12, 56 wt %), the compound "TD1" in Formula 2 (40 wt %), the compound "FD1" in Formula 4 (3 wt %) and the compound "PD" in Formula 6 (1 wt %) are used to form the EML.

(6) Example 6 (Ex6)

A host (Formula 12, 54 wt %), the compound "TD1" in Formula 2 (40 wt %), the compound "FD1" in Formula 4 (5 wt %) and the compound "PD" in Formula 6 (1 wt %) are used to form the EML.

Figure 12:
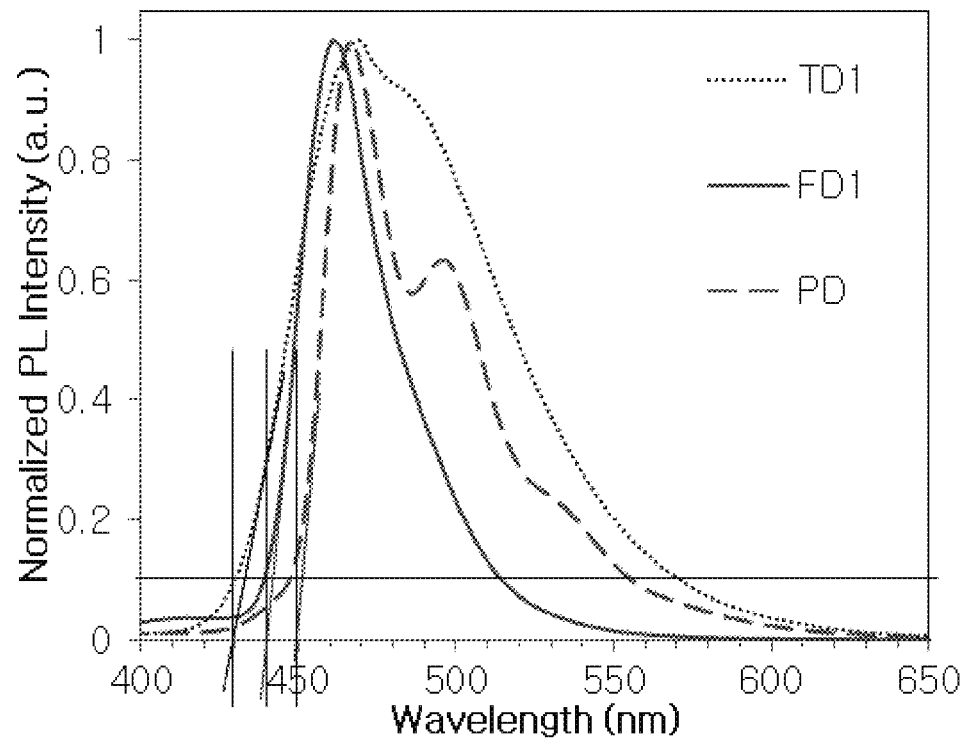
FIG. 12 is a graph of a PL spectrum of a first compound, a second compound and a third compound used in an OLED according to the present disclosure.
Figure 13A:
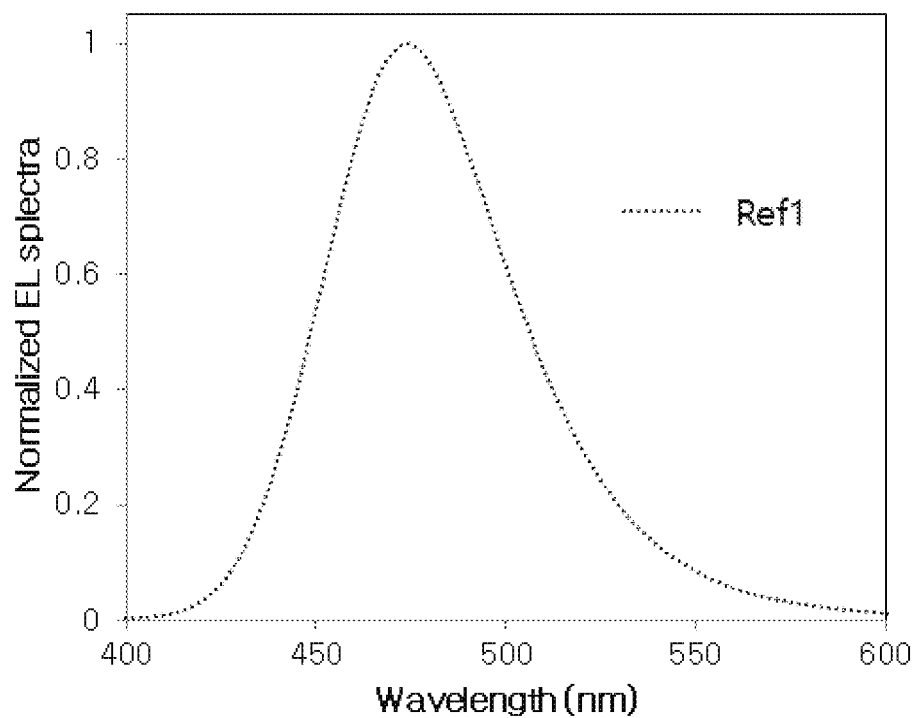
FIGS. 13A to 13L are graphs of an EL spectrum of an OLED using the compounds in FIG. 12.
Figure 13B:
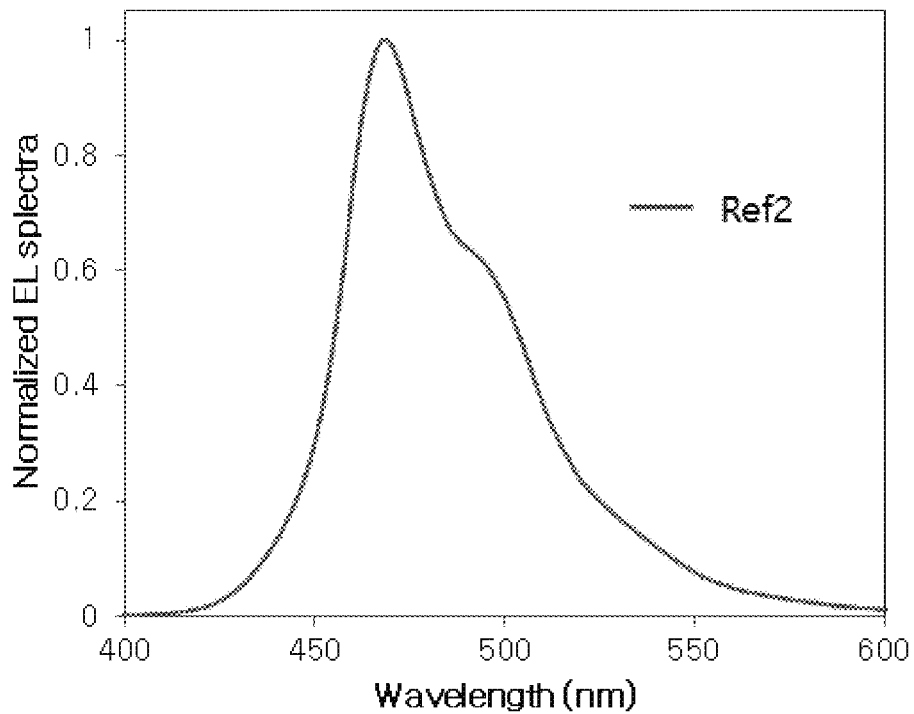
Figure 13C:
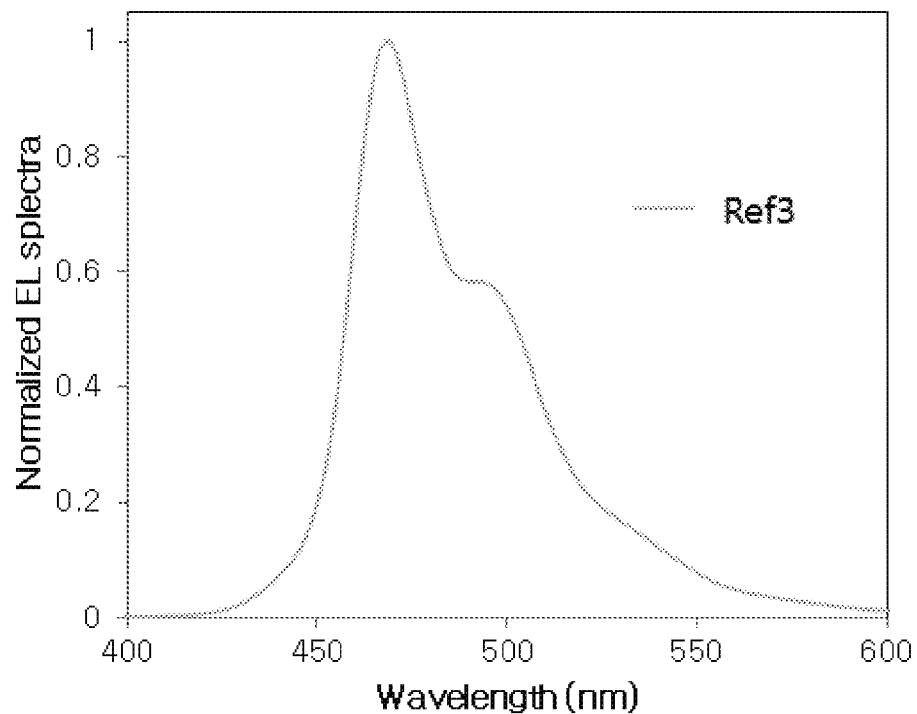
Figure 13D:
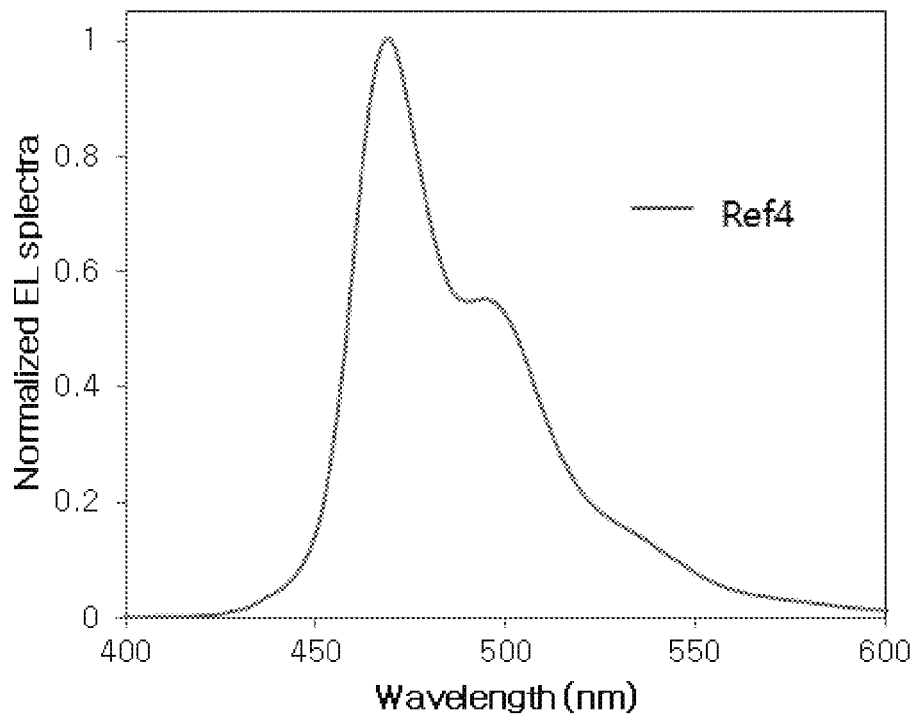
Figure 13E:
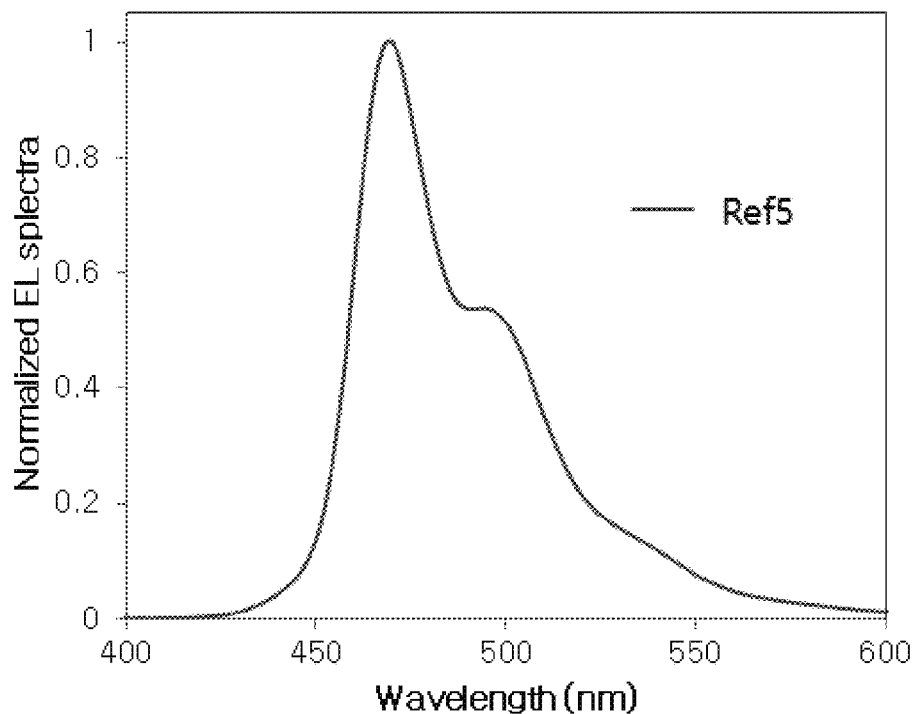
Figure 13F:
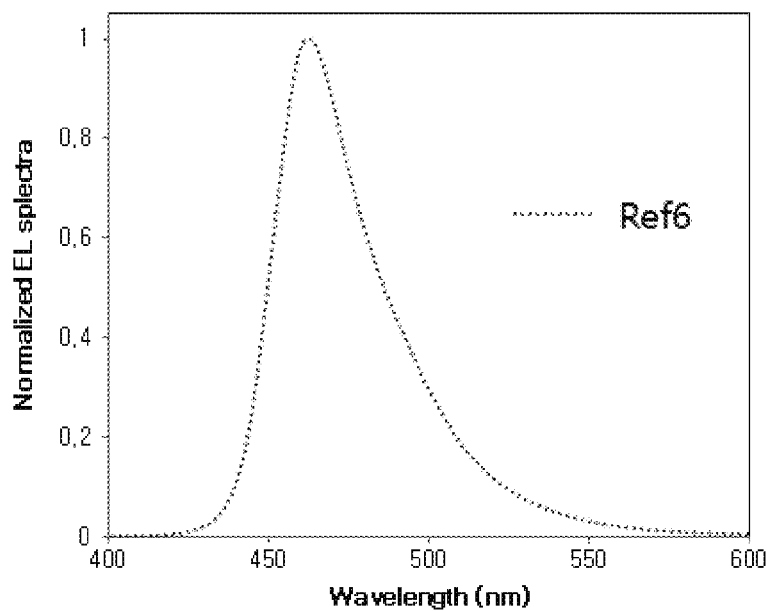
Figure 13G:
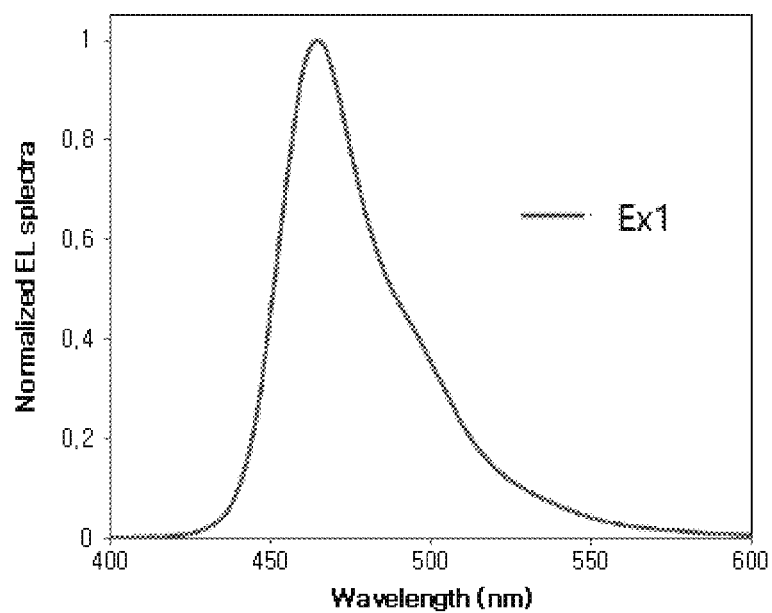
Figure 13H:
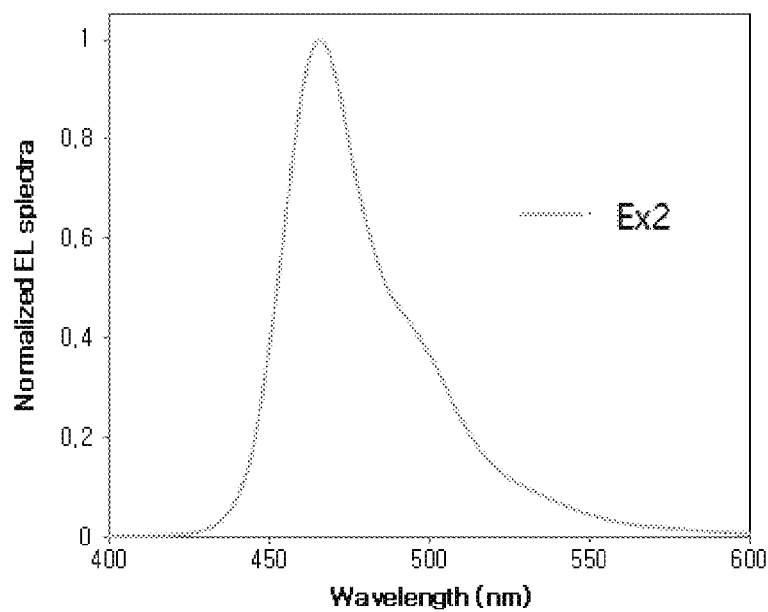
Figure 13I:
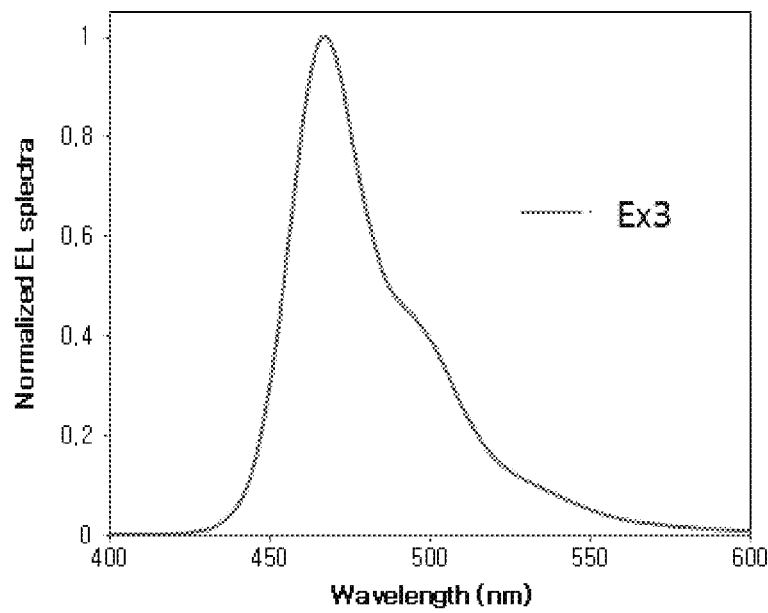
Figure 13J:
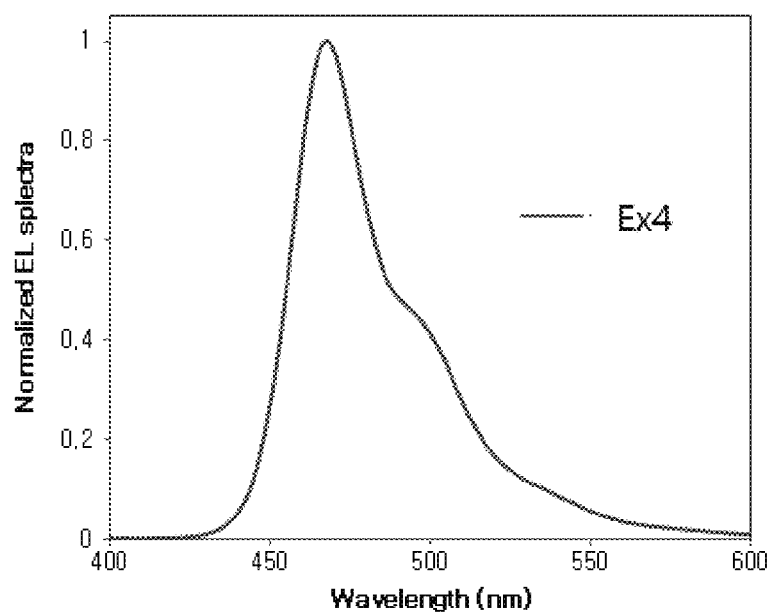
Figure 13K:
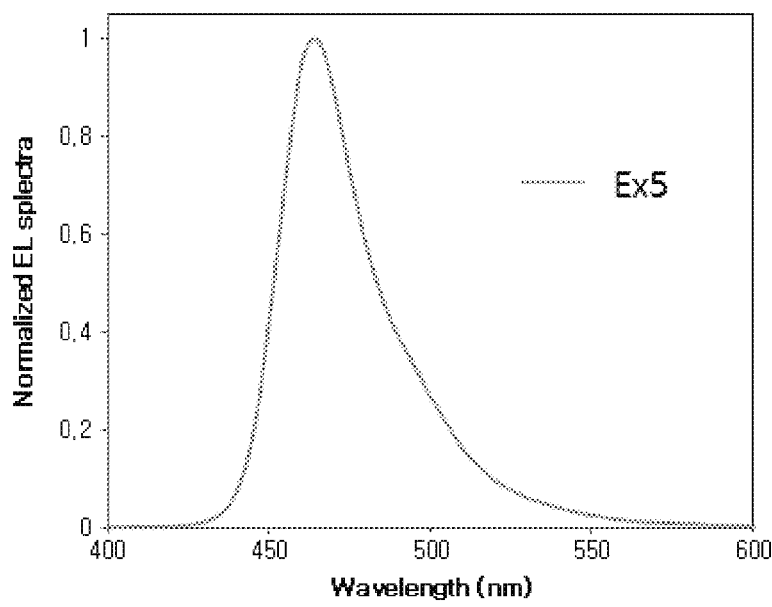
Figure 13L:
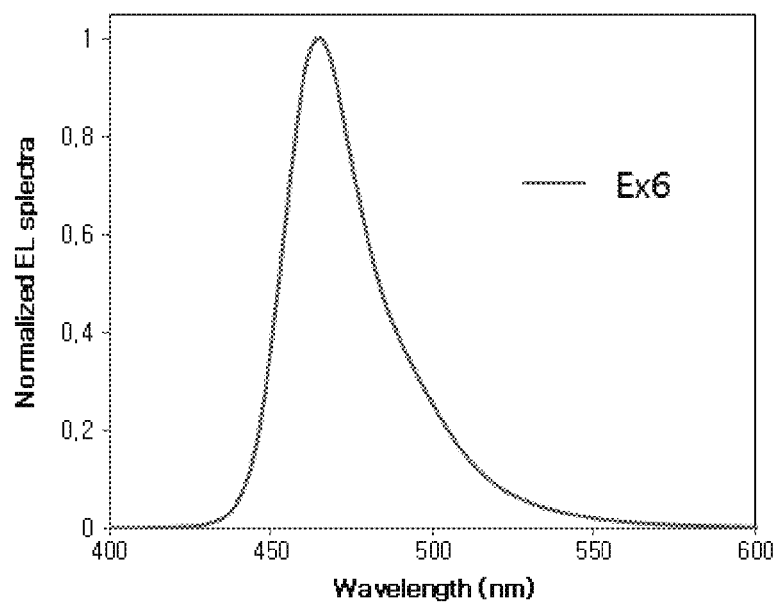

The PL spectrum of the compounds "TD1", "FD1" and "PD", which are used in the EML of the above OLEDs, are measured and shown in FIG. 12. The maximum emission wavelength (λmax) and the onset wavelength of the compounds "TD1", "FD1" and "PD" are measured and listed in Table 2. The properties of the OLED in Comparative Examples 1 to 6 and Examples 1 to 6 are measured and listed in Table 3, and the EL spectrum of the OLED are shown in FIGS. 13A to 13L.

TABLE 2

|     | λmax (nm) | Onset (nm) |
| --- | --- | --- |
| TD1 | 469 | 430 |
| FD1 | 461 | 440 |
| PD  | 467 | 450 |

TABLE 3

| | @ 8.6 mA/cm² | | | | | |
| --- | --- | --- | --- | --- | --- | --- |
| | cd/A | EQE (%) | CIEy | EL λmax (nm) | FWHM (nm) | cd/A/ CIEy | LT95 @ 300 nit |
| Ref1 | 14.3 | 10.4 | 0.191 | 474 | 58 | 75 | 0.3 |
| Ref2 | 19.6 | 13.6 | 0.204 | 468 | 48 | 96 | 1.2 |
| Ref3 | 21.8 | 14.5 | 0.217 | 468 | 46 | 100 | 2.4 |
| Ref4 | 22.3 | 14.6 | 0.225 | 468 | 42 | 99 | 7.5 |
| Ref5 | 23.3 | 15.3 | 0.225 | 470 | 42 | 104 | 8.8 |
| Ref6 | 12.2 | 11.9 | 0.126 | 462 | 36 | 97 | 0.6 |
| Ex1 | 15.8 | 13.8 | 0.145 | 464 | 36 | 109 | 1 |
| Ex2 | 18.7 | 15.7 | 0.153 | 466 | 34 | 122 | 2.8 |
| Ex3 | 20.4 | 16.1 | 0.168 | 466 | 32 | 121 | 6.4 |
| Ex4 | 20.8 | 15.8 | 0.179 | 468 | 34 | 116 | 8.3 |
| Ex5 | 13.0 | 13.0 | 0.122 | 464 | 32 | 107 | 1.4 |
| Ex6 | 11.6 | 11.9 | 0.119 | 464 | 30 | 97 | 1.2 |

As shown in FIG. 12 and Table 2, the first to third compounds "TD1", "FD1" and "PD" meet the above-described relation of the onset wavelength and the maximum emission wavelength. As a result, the emission is provided from the compounds "FD1" and "PD" such that the OLED has high emitting efficiency and excellent color purity.

Namely, as shown in Table 3 and FIGS. 13A to 13L, in comparison to the OLED of Ref1 to Ref6, the OLED in Ex1 to Ex6 has narrow FWHM and/or long lifespan. In addition, in the OLED of Ex1 to Ex6, the value of "cd/A/CIEy", which may be referred to as "blue index", is increased. It means that the emitting efficiency based on the visibility is improved.

For example, when the weight % of the third compound "PD" in the EML is greater than that of the second compound "FD1" in the EML, the OLED has advantages in the color purity, the emitting efficiency and the lifespan.

[OLED3]

An anode (ITO, 50 nm), an HIL (Formula 7, 10 nm), an HTL (Formula 8, 45 nm), an EBL (Formula 9, 15 nm), an EML (30 nm), an HBL (Formula 10, 5 nm), an ETL (Formula 11, 35 nm), an EIL (LiF, 1 nm) and a cathode (Al, 100 nm) are sequentially deposited to form an OLED.

1. Comparative Examples 7 to 12 (Ref7 to Ref12)

The compound "TD2" in Formula 2 is used instead of the compound "TD1" in Comparative Examples 1 to 6.

2. Examples 7 to 10 (Ex7 to Ex10)

The compound "TD2" in Formula 2 is used instead of the compound "TD1" in Example 1 to 4.

Figure 14:
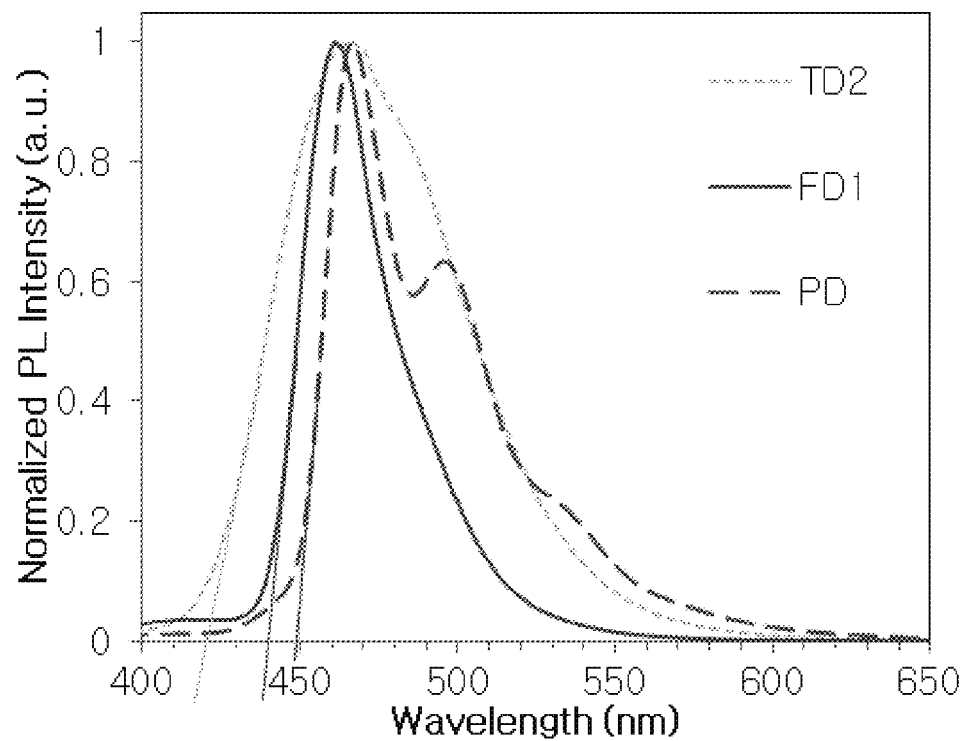
FIG. 14 is a graph of a PL spectrum of a first compound, a second compound and a third compound used in an OLED according to the present disclosure.
Figure 15A:
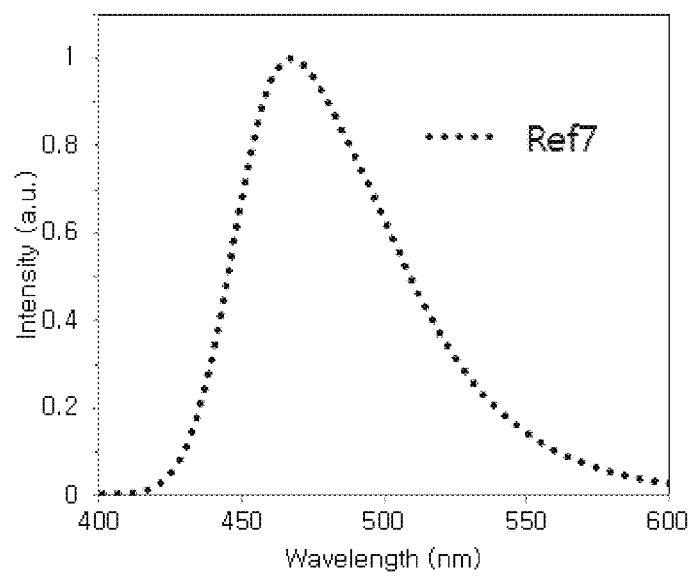
FIGS. 15A to 15J are graphs of an EL spectrum of an OLED using the compounds in FIG. 14.
Figure 15B:
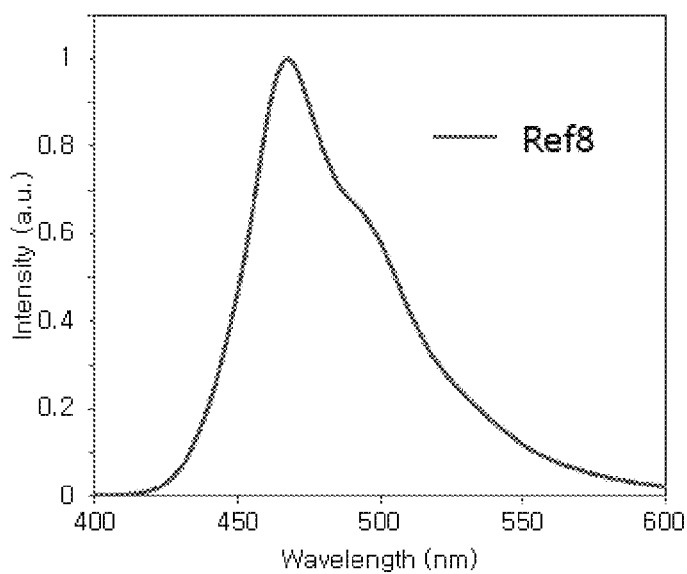
Figure 15C:
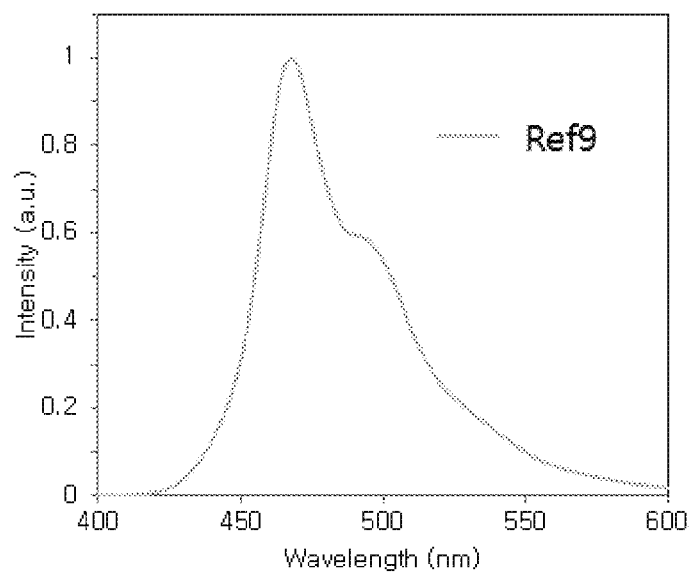
Figure 15D:
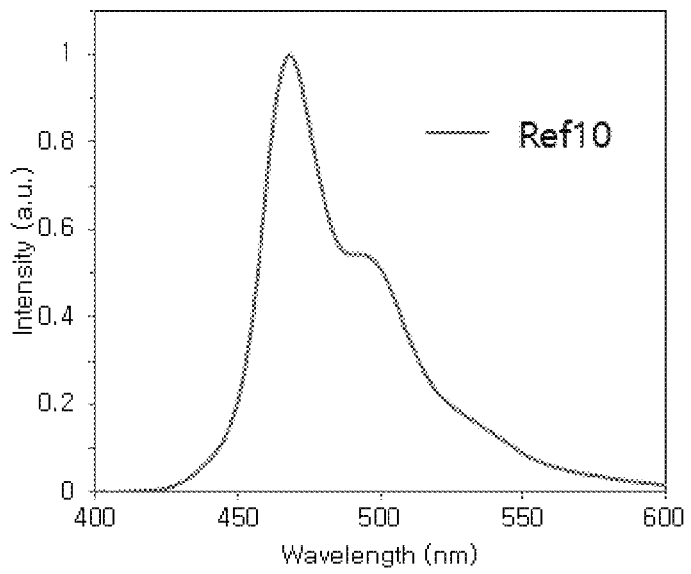
Figure 15E:
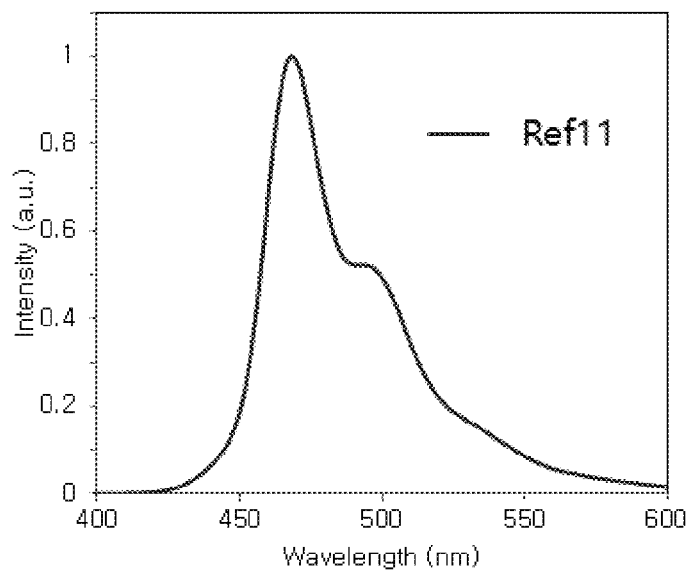
Figure 15F:
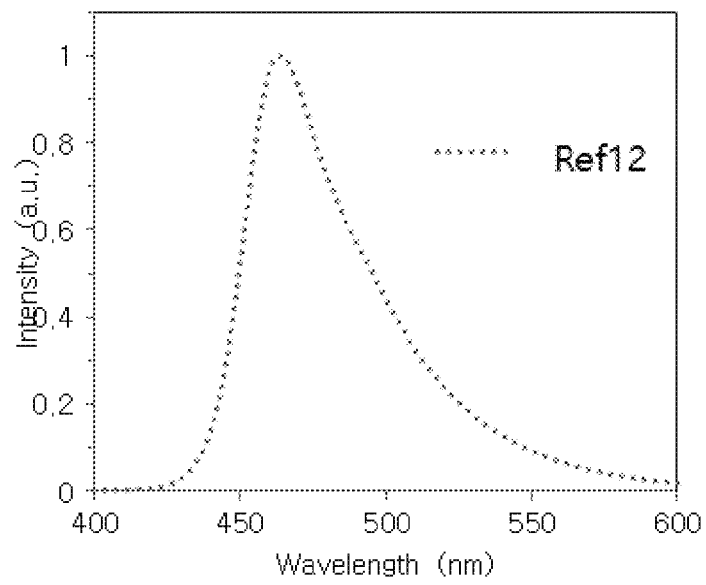
Figure 15G:
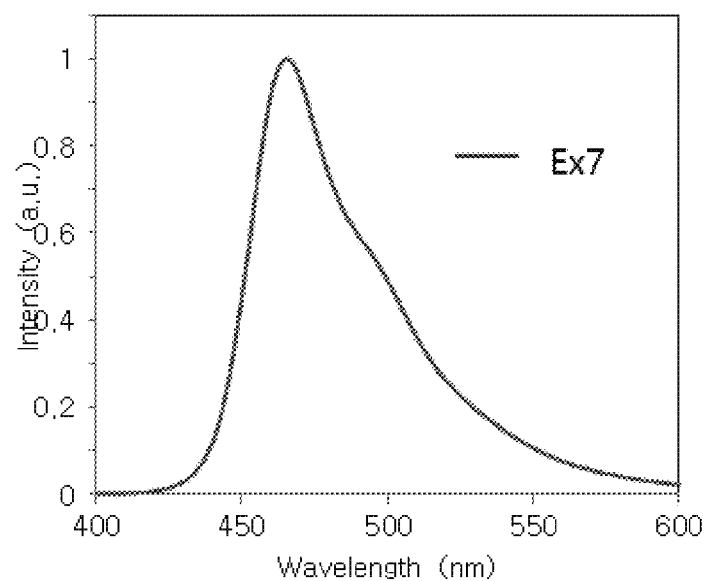
Figure 15H:
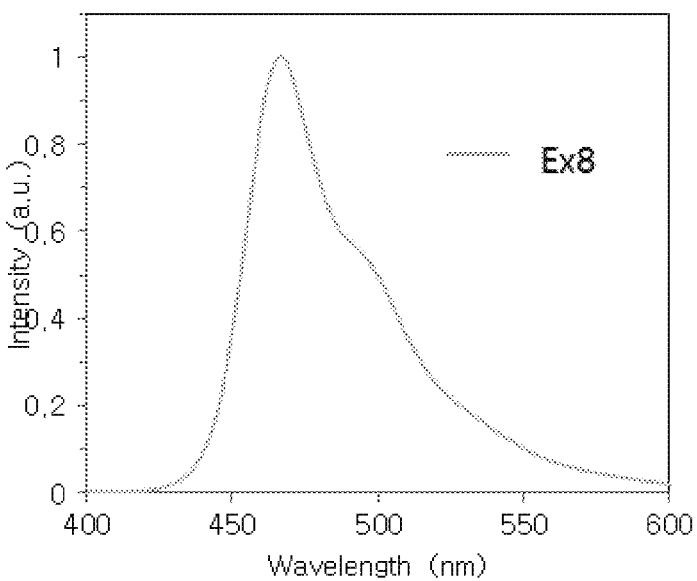
Figure 15I:
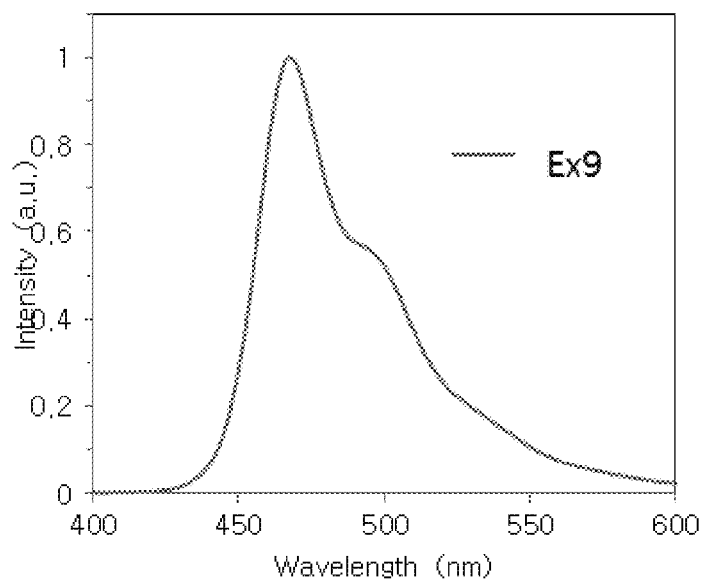
Figure 15J:
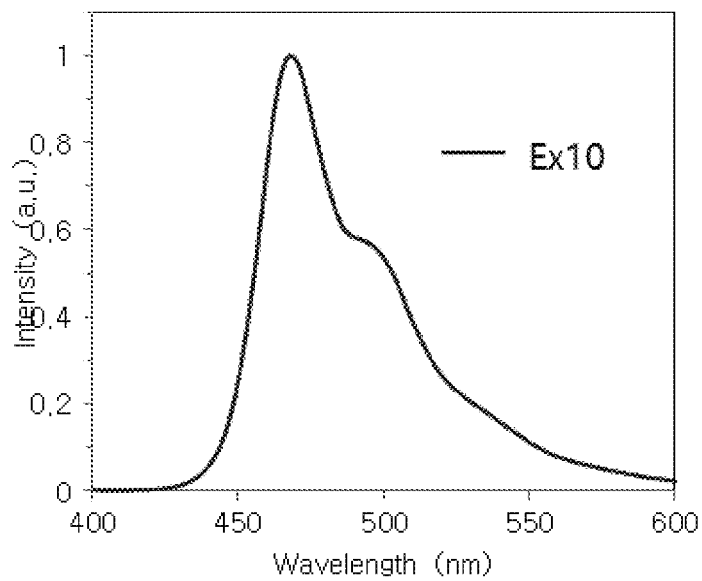

The PL spectrum of the compounds "TD2", "FD1" and "PD", which are used in the EML of the above OLEDs, are measured and shown in FIG. 14. The maximum emission wavelength (λmax) and the onset wavelength of the compounds "TD2", "FD1" and "PD" are measured and listed in Table 4. The properties of the OLED in Comparative Examples 7 to 12 and Examples 7 to 10 are measured and listed in Table 5, and the EL spectrum of the OLED are shown in FIGS. 15A to 15J.

TABLE 4

|     | λmax (nm) | Onset (nm) |
| --- | --- | --- |
| TD2 | 467 | 420 |
| FD1 | 461 | 440 |
| PD  | 467 | 450 |

TABLE 5

| | @ 8.6 mA/cm² | | | | | |
| --- | --- | --- | --- | --- | --- | --- |
| | cd/A | EQE (%) | CIEy | EL λmax (nm) | FWHM (nm) | cd/A/ CIEy | LT95 @ 300 nit |
| Ref7 | 19.7 | 12.8 | 0.211 | 468 | 64 | 94 | 0.1 |
| Ref8 | 21.5 | 13.9 | 0.214 | 468 | 54 | 100 | 1 |
| Ref9 | 22.4 | 14.5 | 0.218 | 468 | 48 | 103 | 1.4 |
| Ref10 | 22.8 | 14.7 | 0.222 | 468 | 44 | 103 | 3 |
| Ref11 | 20.8 | 13.5 | 0.221 | 468 | 42 | 94 | 4.2 |
| Ref12 | 20.8 | 14.7 | 0.186 | 464 | 46 | 112 | 0.2 |
| Ex7 | 19.3 | 12.8 | 0.205 | 466 | 48 | 94 | 1.2 |
| Ex8 | 23.8 | 15.7 | 0.211 | 466 | 46 | 113 | 1.6 |
| Ex9 | 25.2 | 15.9 | 0.226 | 468 | 46 | 111 | 4 |
| Ex10 | 25.0 | 15.4 | 0.235 | 468 | 46 | 106 | 5.2 |

As shown in FIG. 14 and Table 4, the first to third compounds "TD2", "FD1" and "PD" meet the above-described relation of the onset wavelength and the maximum emission wavelength. As a result, the emission is provided from the compounds "FD1" and "PD" such that the OLED has high emitting efficiency and excellent color purity.

Namely, as shown in Table 5 and FIGS. 15A to 15J, in comparison to the OLED of Ref7 to Ref12, the OLED in Ex7 to Ex10 has narrow FWHM and/or long lifespan. In addition, in the OLED of Ex7 to Ex10, the value of "cd/A/CIEy", which may be referred to as "blue index", is increased. It means that the emitting efficiency based on the visibility is improved.

For example, when the weight % of the third compound "PD" in the EML is greater than that of the second compound "FD1" in the EML, the OLED has advantages in the color purity, the emitting efficiency and the lifespan.

[OLED4]

An anode (ITO, 50 nm), an HIL (Formula 7, 10 nm), an HTL (Formula 8, 45 nm), an EBL (Formula 9, 15 nm), an EML (30 nm), an HBL (Formula 10, 5 nm), an ETL (Formula 11, 35 nm), an EIL (LiF, 1 nm) and a cathode (Al, 100 nm) are sequentially deposited to form an OLED.

1. Comparative Examples 13 to 17 (Ref13 to Ref17)

The compound "FD2" in Formula 13 is used instead of the compound "FD1" in Comparative Example 6 and Examples 1 to 4.

[Formula 13]

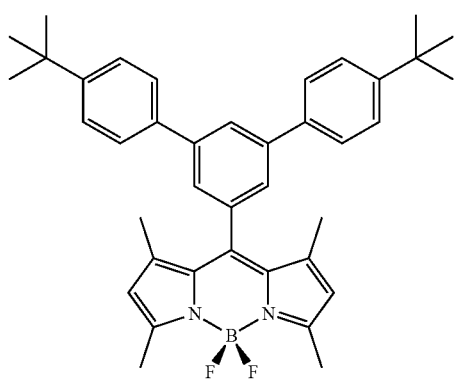

FD2

Figure 16:
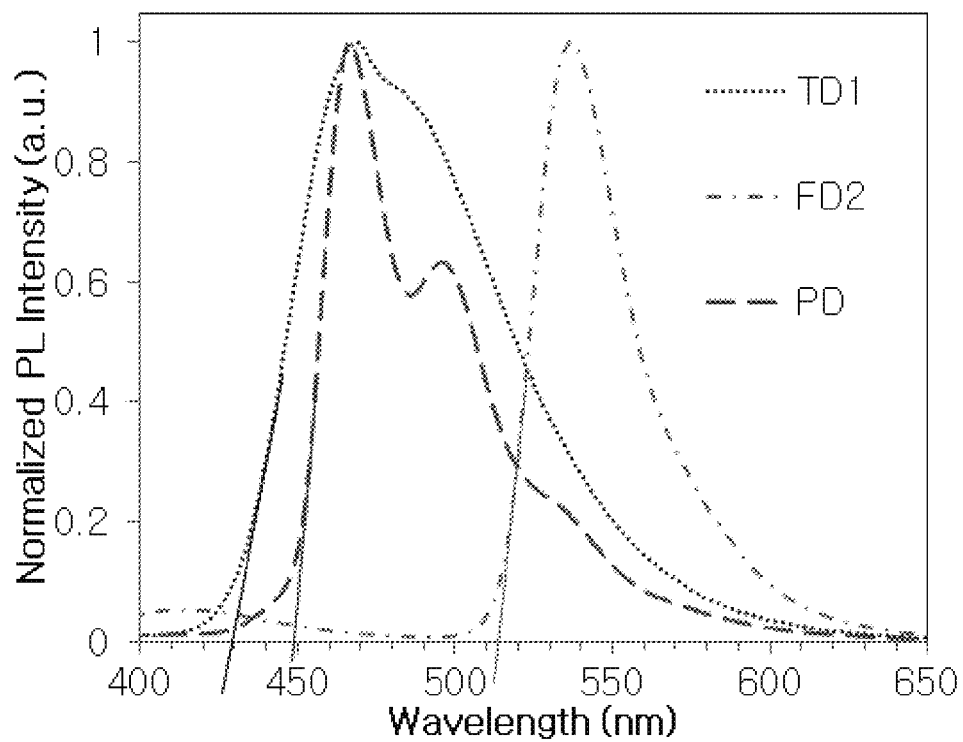
FIG. 16 is a graph of a PL spectrum of a first compound, a second compound and a third compound used in an OLED according to the present disclosure.
Figure 17A:
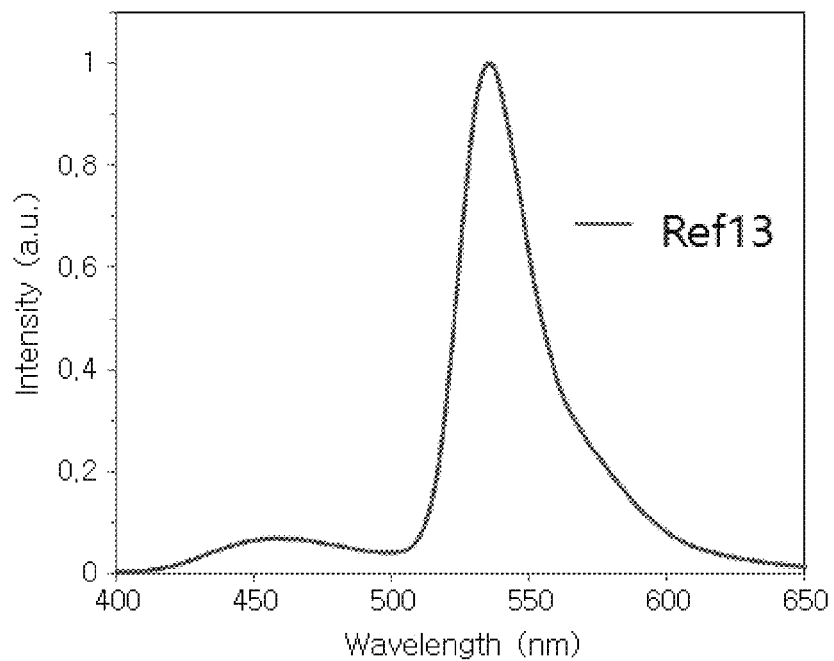
FIGS. 17A to 17E are graphs of an EL spectrum of an OLED using the compounds in FIG. 16.
Figure 17B:
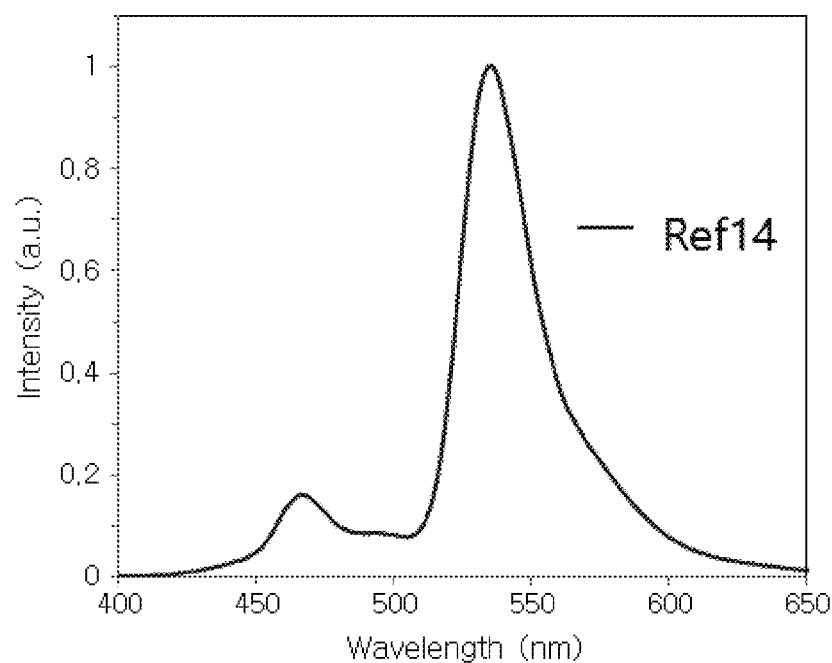
Figure 17C:
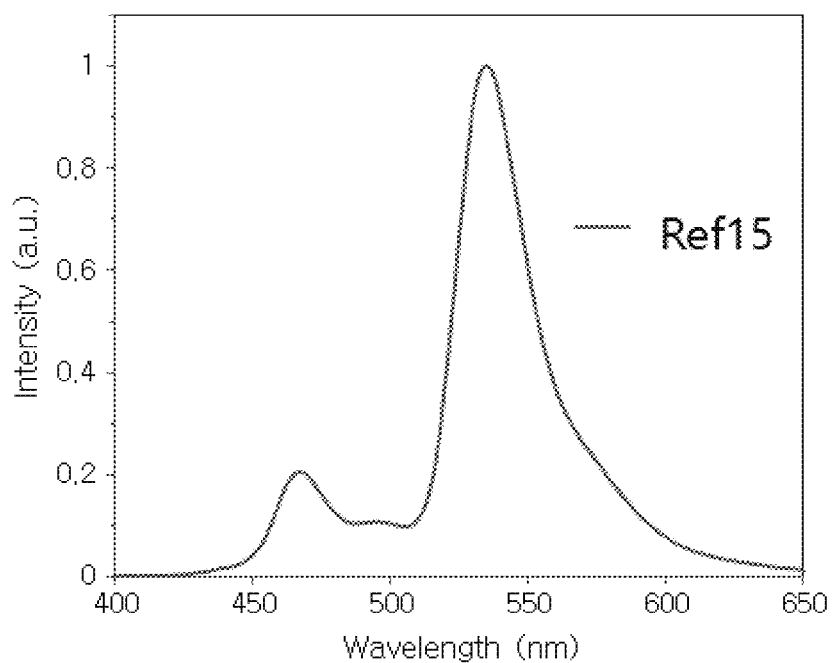
Figure 17D:
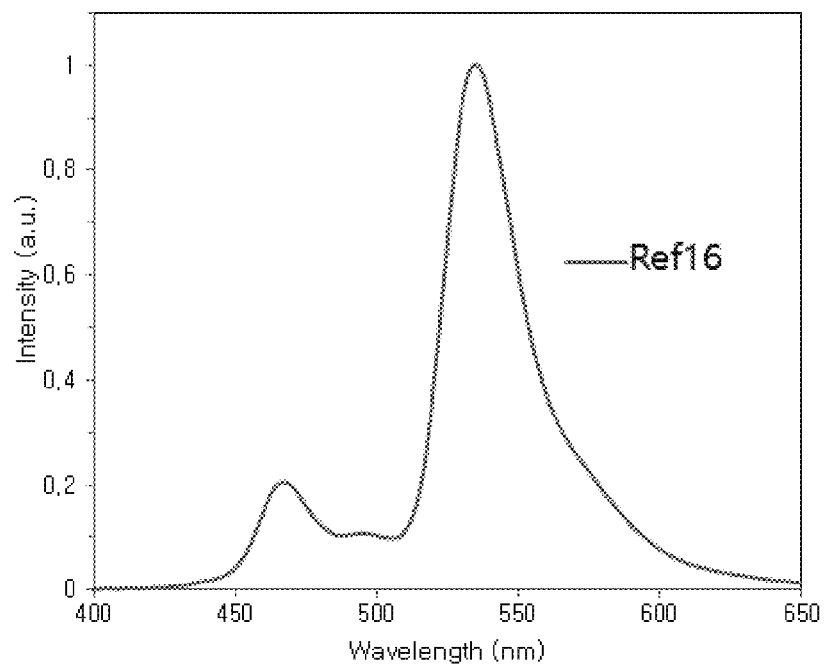
Figure 17E:
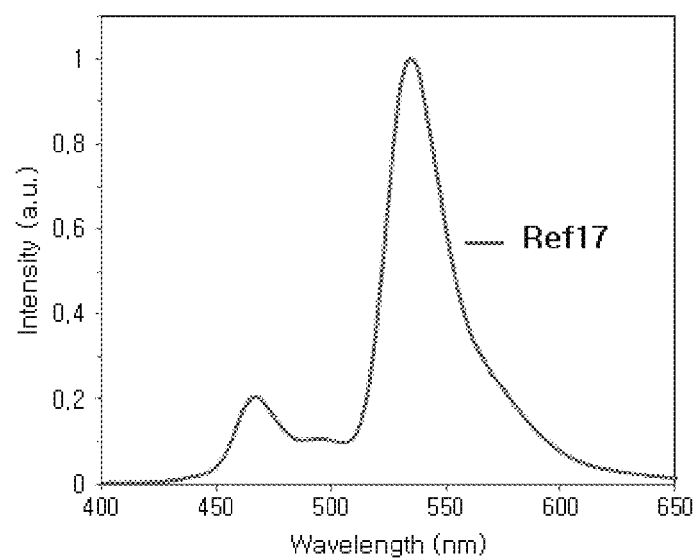

The PL spectrum of the compounds "TD1", "FD2" and "PD", which are used in the EML of the above OLEDs, are measured and shown in FIG. 16. The maximum emission wavelength (λmax) and the onset wavelength of the compounds "TD1", "FD2" and "PD" are measured and listed in Table 6. The properties of the OLED in Comparative Examples 13 to 17 are measured and listed in Table 7, and the EL spectrum of the OLED are shown in FIGS. 17A to 17E.

TABLE 6

|     | λmax (nm) | Onset (nm) |
|-----|-----------|------------|
| TD1 | 469       | 430        |
| FD2 | 537       | 513        |
| PD  | 467       | 450        |

TABLE 7

| | @ 8.6 mA/cm² | | | | | |
|---|---|---|---|---|---|---|
| | cd/A | EQE (%) | CIEy | EL λmax (nm) | FWHM (nm) | cd/A/ CIEy | LT95 @ 300 nit |
| Ref13 | 4.4 | 1.1 | 0.603 | 536 | 32 | 7 | 5 |
| Ref14 | 5.9 | 1.5 | 0.588 | 536 | 30 | 10 | 8 |
| Ref15 | 7.1 | 1.9 | 0.581 | 534 | 30 | 12 | 12 |
| Ref16 | 7.3 | 1.9 | 0.584 | 534 | 32 | 12 | 18 |
| Ref17 | 6.1 | 1.6 | 0.586 | 534 | 32 | 10 | 26 |

As shown in FIG. 16 and Table 6, the first to third compounds "TD1", "FD2" and "PD" do not meet the above-described relation of the onset wavelength and the maximum emission wavelength. Namely, the onset wavelength and the maximum emission wavelength of the second compound "FD2" are greater than those of the third compound "PD" such that the energy transfer is concentrated to the second compound "FD2". Accordingly, the triplet exciton is quenched at the second compound "FD2", and the emitting efficiency and the color sense are significantly decreased as shown in Table 7 and FIGS. 17A to 17E.

Figure 18:
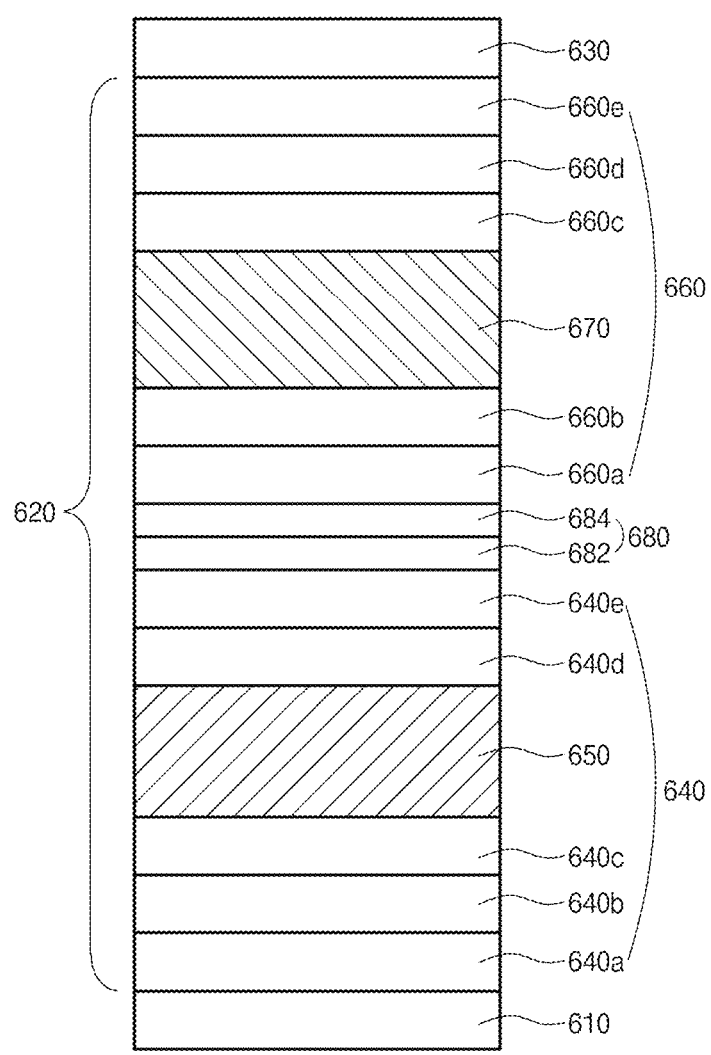
FIG. 18 is a schematic cross-sectional view of an OLED according to a sixth embodiment of the present disclosure.

FIG. 18 is a schematic cross-sectional view of an OLED according to a sixth embodiment of the present disclosure.

As shown in FIG. 18, the OLED D5 includes the first and second electrodes 610 and 630, which face each other, and the emitting layer 620 therebetween. The organic light emitting display device 100 (of FIG. 2) may include a red pixel region, a green pixel region and a blue pixel region, and the OLED D5 may be positioned in each of the red, green and blue pixel regions.

The first electrode 610 may be an anode, and the second electrode 630 may be a cathode.

The emitting layer 620 includes a first emitting part 640 including a first EML 650 and a second emitting part 660 including a second EML 670. In addition, the emitting layer 620 may further include a charge generation layer (CGL) 680 between the first and second emitting parts 640 and 660.

The CGL 680 is positioned between the first and second emitting parts 640 and 660 such that the first emitting part 640, the CGL 680 and the second emitting part 660 are sequentially stacked on the first electrode 610. Namely, the first emitting part 640 is positioned between the first electrode 610 and the CGL 680, and the second emitting part 660 is positioned between the second electrode 630 and the CGL 680.

The first emitting part 640 includes the first EML 650.

In addition, the first emitting part 640 may further include at least one of a first HTL 640b between the first electrode 610 and the first EML 650, an HIL 640a between the first electrode 610 and the first HTL 640b, and a first ETL 640e between the first EML 650 and the CGL 680.

Moreover, the first emitting part 640 may further include at least one of a first EBL 640c between the first HTL 640b and the first EML 650 and a first HBL 640d between the first EML 650 and the first ETL 640e.

The second emitting part 660 includes the second EML 670.

In addition, the second emitting part 660 may further include at least one of a second HTL 660a between the CGL 680 and the second EML 670, a second ETL 660d between the second EML 670 and the second electrode 630, and an EIL 660e between the second ETL 660d and the second electrode 630.

Moreover, the second emitting part 660 may further include at least one of a second EBL 660b between the second HTL 660a and the second EML 670 and a second HBL 660c between the second EML 670 and the second ETL 660d.

The CGL 680 is positioned between the first and second emitting parts 640 and 660. Namely, the first and second emitting parts 640 and 660 are connected to each other through the CGL 680. The CGL 680 may be a P-N junction type CGL of an N-type CGL 682 and a P-type CGL 684.

The N-type CGL 682 is positioned between the first ETL 640e and the second HTL 660a, and the P-type CGL 684 is positioned between the N-type CGL 682 and the second HTL 660a. The N-type CGL 682 provides an electron into the first EML 650 of the first emitting part 640, and the P-type CGL 684 provides a hole into the second EML 670 of the second emitting part 660.

The first and second EMLs 650 and 670 are a blue EML. Alternatively, the first EML 650 is one of a blue EML, a green EML and a red EML, and the second EML 670 is a blue EML. At least one of the first and second EMLs 650 and 670 has the same structure or configuration as the EML 540 of the OLED explained with FIG. 9.

Namely, at least one of the first and second EMLs 650 and 670 includes the first compound having the delayed fluorescent property, the second compound having the fluorescent property or the delayed fluorescent property and the third compound having the phosphorescent property. The first to third compounds are mixed in the single EML.

The first compound may be represented by Formula 1-1 or Formula 1-2 and may be one of the compounds in Formula 2. The second compound may be represented by Formula 3 and may be the compounds in Formula 4. The third compound may be represented by Formula 5-1 or Formula 5-2 and may be the compounds in Formula 6.

As described above, the onset wavelength of the second compound is greater (longer) than that of the first compound and is smaller (shorter) than that of the third compound. In addition, the maximum emission wavelength (λmax) of the second compound is smaller than that of the first compound, and the maximum emission wavelength of the third compound is equal to or smaller than that of the first compound. The maximum emission wavelength of the second compound is smaller than that of the third compound. Moreover, the FWHM of the second compound is smaller than that of the first compound, and the FWHM of the third compound is smaller than that of the first compound.

In each of the first and second EMLs 650 and 670, the weight % of the second compound may be equal to or smaller than that of the third compound. For example, with respect to the second compound, the third compound has the weight % of about 100 to 1200.

Each of the first and second EMLs 650 and 670 may further include a host. The triplet energy level of the host may be equal to or greater (higher) than that of the first compound being the delayed fluorescent compound. In addition, the triplet energy level of the host may be greater than that of the third compound having the phosphorescent property.

In the OLED D5, since the first to third compounds meet the above conditions (or relations), the energy of the first compound is transferred into each of the second and third compounds such that the emission is provided from each of the second and third compounds. Accordingly, the decrease of the lifespan and the emitting efficiency by the triplet exciton in the first compound is prevented.

In addition, since the second and third compounds are included in the single layer, i.e., each of the first and second EMLs 650 and 670, the singlet exciton and the triplet exciton of the first compound are respectively transferred into the second and third compounds. Accordingly, the non-emission quenching problem of the triplet exciton in the first compound and/or the second compound is prevented.

Moreover, the maximum emission wavelength of the second compound is smaller than that of the third compound, the energy transfer from the third compound into the second compound is prevented or minimized.

Accordingly, the OLED D5 provides high emitting efficiency and high color purity.

Figure 19:
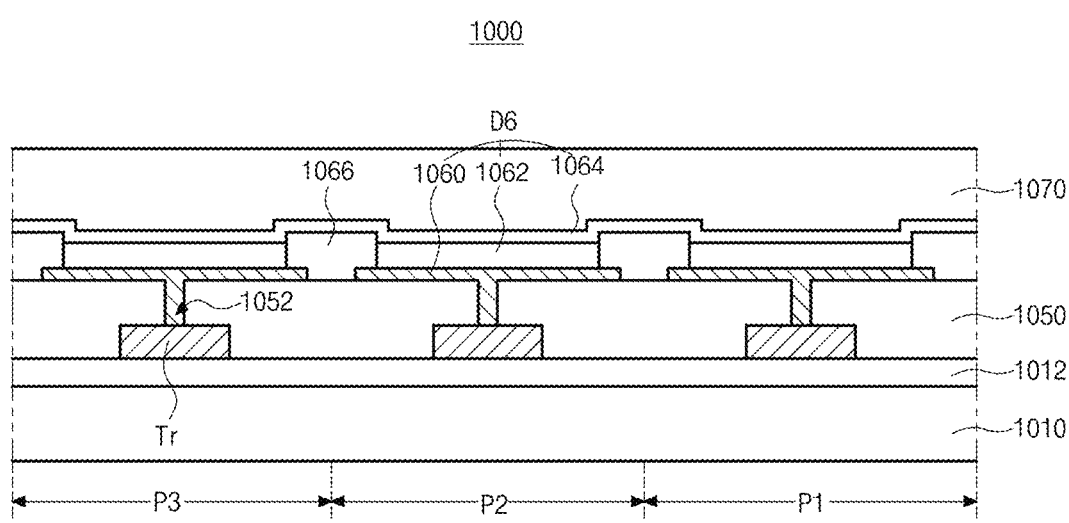
FIG. 19 is a schematic cross-sectional view of an organic light emitting display device according to a seventh embodiment of the present disclosure.

FIG. 19 is a schematic cross-sectional view of an organic light emitting display device according to a seventh embodiment of the present disclosure.

As shown in FIG. 19, the organic light emitting display device 1000 includes a substrate 1010, wherein first to third pixel regions P1, P2 and P3 are defined, a TFT Tr over the substrate 1010 and an OLED D6. The OLED D6 is disposed over the TFT Tr and is connected to the TFT Tr. For example, the first to third pixel regions P1, P2 and P3 may be a blue pixel region, a green pixel region and a red pixel region, respectively.

The substrate 1010 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 1012 is formed on the substrate 1010, and the TFT Tr is formed on the buffer layer 1012. The buffer layer 1012 may be omitted.

As explained with FIG. 2, the TFT Tr may include a semiconductor layer, a gate electrode, a source electrode and a drain electrode and may serve as a driving element.

A planarization layer (or passivation layer) 1050 is formed on the TFT Tr. The planarization layer 1050 has a flat top surface and includes a drain contact hole 1052 exposing the drain electrode of the TFT Tr.

The OLED D6 is disposed on the planarization layer 1050 and includes a first electrode 1060, an emitting layer 1062 and a second electrode 1064. The first electrode 1060 is connected to the drain electrode of the TFT Tr, and the emitting layer 1062 and the second electrode 1064 are sequentially stacked on the first electrode 1060. The OLED D6 is disposed in each of the first to third pixel regions P1 to P3 and emits different color light in the first to third pixel regions P1 to P3. For example, the OLED D6 in the first pixel region P1 may emit the blue light, the OLED D6 in the second pixel region P2 may emit the green light, and the OLED D6 in the third pixel region P3 may emit the red light.

The first electrode 1060 is formed to be separate in the first to third pixel regions P1 to P3, and the second electrode 1064 is formed as one-body to cover the first to third pixel regions P1 to P3.

The first electrode 1060 is one of an anode and a cathode, and the second electrode 1064 is the other one of the anode and the cathode. In addition, one of the first and second electrodes 1060 and 1064 may be a light transmitting electrode (or a semi-transmitting electrode), and the other one of the first and second electrodes 1060 and 1064 may be a reflecting electrode.

For example, the first electrode 1060 may be the anode and may include a transparent conductive oxide material layer formed of a transparent conductive oxide (TCO) material having a relatively high work function. The second electrode 1064 may be the cathode and may include a metallic material layer formed of a low resistance metallic material having a relatively low work function. For example, the transparent conductive oxide material layer of the first electrode 1060 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1064 may include Al, Mg, Ca, Ag, their alloy, e.g., Mg—Ag alloy, or their combination.

In the bottom-emission type organic light emitting display device 1000, the first electrode 1060 may have a single-layered structure of the transparent conductive oxide material layer.

On the other hand, in the top-emission type organic light emitting display device 1000, a reflection electrode or a reflection layer may be formed under the first electrode 1060. For example, the reflection electrode or the reflection layer may be formed of Ag or aluminum-palladium-copper (APC) alloy. In this instance, the first electrode 1060 may have a triple-layered structure of ITO/Ag/ITO or ITO/APC/ITO. In addition, the second electrode 1064 may have a thin profile (small thickness) to provide a light transmittance property (or a semi-transmittance property).

A bank layer 1066 is formed on the planarization layer 1050 to cover an edge of the first electrode 1060. Namely, the bank layer 1066 is positioned at a boundary of the first to third pixel regions P1 to P3 and exposes a center of the first electrode 1060 in the first to third pixel regions P1 to P3.

The emitting layer 1062 as an emitting unit is formed on the first electrode 1060. The emitting layer 1062 may have a single-layered structure of an EML. Alternatively, the emitting layer 1062 may further include at least one of an HIL, an HTL, an EBL, which are sequentially stacked between the first electrode 1060 and the EML, an HBL, an ETL and an EIL, which are sequentially stacked between the EML and the second electrode 1064.

In the first pixel region P1 being the blue pixel region, the EML of the emitting layer 1062 includes the first compound having the delayed fluorescent property, the second compound having the fluorescent property or the delayed fluorescent property and the third compound having the phosphorescent property. The first to third compounds are mixed in the single layer.

The first compound may be represented by Formula 1-1 or Formula 1-2 and may be one of the compounds in Formula 2. The second compound may be represented by Formula 3 and may be the compounds in Formula 4. The third compound may be represented by Formula 5-1 or Formula 5-2 and may be the compounds in Formula 6.

As described above, the onset wavelength of the second compound is greater (longer) than that of the first compound and is smaller (shorter) than that of the third compound. In addition, the maximum emission wavelength (λmax) of the second compound is smaller than that of the first compound, and the maximum emission wavelength of the third compound is equal to or smaller than that of the first compound. The maximum emission wavelength of the second compound is smaller than that of the third compound. Moreover, the FWHM of the second compound is smaller than that of the first compound, and the FWHM of the third compound is smaller than that of the first compound.

In the EML of the emitting layer 1062, the weight % of the second compound may be equal to or smaller than that of the third compound. For example, with respect to the second compound, the third compound has the weight % of about 100 to 1200.

In the first pixel region P1, the EML of the emitting layer 1062 may further include a host. The triplet energy level of the host may be equal to or greater (higher) than that of the first compound being the delayed fluorescent compound. In addition, the triplet energy level of the host may be greater than that of the third compound having the phosphorescent property.

An encapsulation film 1070 is formed on the second electrode 1064 to prevent penetration of moisture into the OLED D6. The encapsulation film 1070 may have a triple-layered structure including a first inorganic insulating layer, an organic insulating layer and a second inorganic insulating layer, but it is not limited thereto.

The organic light emitting display device 1000 may further include a polarization plate (not shown) for reducing an ambient light reflection. For example, the polarization plate may be a circular polarization plate. In the bottom-emission type organic light emitting display device 1000, the polarization plate may be disposed under the substrate 1010. In the top-emission type organic light emitting display device 1000, the polarization plate may be disposed on or over the encapsulation film 1070.

Figure 20:
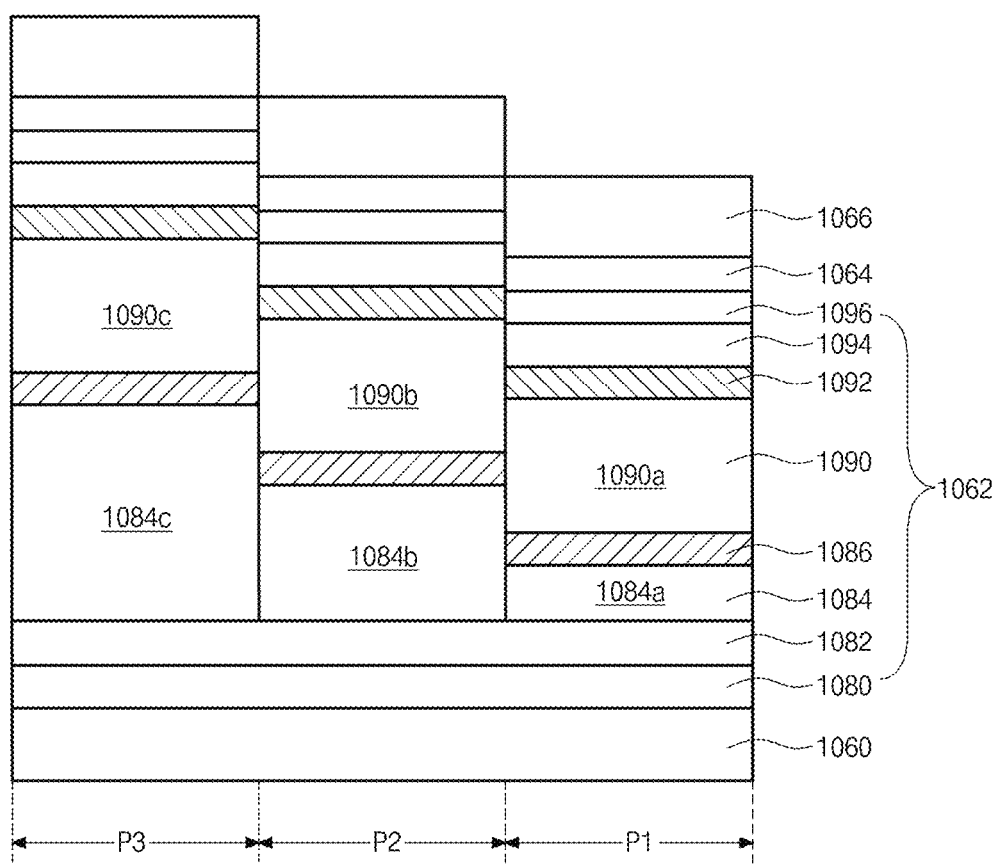
FIG. 20 is a schematic cross-sectional view of an OLED according to an eighth embodiment of the present disclosure.

FIG. 20 is a schematic cross-sectional view of an OLED according to an eighth embodiment of the present disclosure.

Referring to FIG. 20 with FIG. 19, the OLED D6 is positioned in each of first to third pixel regions P1 to P3 and includes the first and second electrodes 1060 and 1064, which face each other, and the emitting layer 1062 therebetween. The emitting layer 1062 includes an EML 1090.

The first electrode 1060 may be an anode, and the second electrode 1064 may be a cathode. For example, the first electrode 1060 may be a reflective electrode, and the second electrode 1064 may be a transmitting electrode (or a semi-transmitting electrode).

The emitting layer 1062 may further include an HTL 1082 between the first electrode 1060 and the EML 1090 and an ETL 1094 between the EML 1090 and the second electrode 1064.

In addition, the emitting layer 1062 may further include an HIL 1080 between the first electrode 1060 and the HTL 1082 and an EIL 1096 between the ETL 1094 and the second electrode 1064.

Moreover, the emitting layer 1062 may further include an EBL 1086 between the EML 1090 and the HTL 1082 and an HBL 1092 between the EML 1090 and the ETL 1094.

Furthermore, the emitting layer 1062 may further include an auxiliary HTL 1084 between the HTL 1082 and the EBL 1086. The auxiliary HTL 1084 may include a first auxiliary HTL 1084a in the first pixel region P1, a second auxiliary HTL 1084b in the second pixel region P2 and a third auxiliary HTL 1084c in the third pixel region P3.

The first auxiliary HTL 1084a has a first thickness, the second auxiliary HTL 1084b has a second thickness, and the third auxiliary HTL 1084c has a third thickness. The second thickness is greater than the first thickness and smaller than the third thickness such that the OLED D6 provides a micro-cavity structure.

Namely, by the first to third auxiliary HTLs 1084a, 1084b and 1084c having a difference in a thickness, a distance between the first and second electrodes 1060 and 1064 in the second pixel region P2, in which a first wavelength range light, e.g., green light, is emitted, is smaller than a distance between the first and second electrodes 1060 and 1064 in the third pixel region P3, in which a second wavelength range light, e.g., red light, being greater than the first wavelength range is emitted, and is greater than a distance between the first and second electrodes 1060 and 1064 in the first pixel region P1, in which a third wavelength range light, e.g., blue light, being smaller than the first wavelength range is emitted. Accordingly, the emitting efficiency of the OLED D6 is improved.

In FIG. 20, the first auxiliary HTL 1084a is formed in the first pixel region P1. Alternatively, a micro-cavity structure may be provided without the first auxiliary HTL 1084a.

A capping layer (not shown) for improving a light-extracting property may be further formed on the second electrode 1064.

The EML 1090 includes a first EML 1090a in the first pixel region P1, a second EML 1090b in the second pixel region P2 and a third EML 1090c in the third pixel region P3. The first to third EMLs 1090a, 1090b and 1090c may be a blue EML, a green EML and a red EML, respectively.

The first EML 1090a includes the first compound having the delayed fluorescent property, the second compound having the fluorescent property or the delayed fluorescent property and the third compound having the phosphorescent property. The first to third compounds are mixed in the single EML.

The first compound may be represented by Formula 1-1 or Formula 1-2 and may be one of the compounds in Formula 2. The second compound may be represented by Formula 3 and may be the compounds in Formula 4. The third compound may be represented by Formula 5-1 or Formula 5-2 and may be the compounds in Formula 6.

As described above, the onset wavelength of the second compound is greater (longer) than that of the first compound and is smaller (shorter) than that of the third compound. In addition, the maximum emission wavelength (λmax) of the second compound is smaller than that of the first compound, and the maximum emission wavelength of the third compound is equal to or smaller than that of the first compound. The maximum emission wavelength of the second compound is smaller than that of the third compound. Moreover, the FWHM of the second compound is smaller than that of the first compound, and the FWHM of the third compound is smaller than that of the first compound.

In the first EML 1090a in the first pixel region P1, the weight % of the second compound may be equal to or smaller than that of the third compound. For example, with respect to the second compound, the third compound has the weight % of about 100 to 1200.

The first EML 1090a in the first pixel region P1 may further include a host. The triplet energy level of the host may be equal to or greater (higher) than that of the first compound being the delayed fluorescent compound. In addition, the triplet energy level of the host may be greater than that of the third compound having the phosphorescent property.

Each of the second EML 1090b in the second pixel region P2 and the third EML 1090c in the third pixel region P3 may include a host and a dopant. For example, in each of the second EML 1090b in the second pixel region P2 and the third EML 1090c in the third pixel region P3, the dopant may include at least one of a phosphorescent compound, a fluorescent compound and a delayed fluorescent compound.

The OLED D6 in FIG. 20 respectively emits the blue light, green light and the red light in the first to third pixel regions P1 to P3 such that the organic light emitting display device 1000 (of FIG. 19) can provide a full-color image.

The organic light emitting display device 1000 may further include a color filter layer corresponding to the first to third pixel regions P1 to P3 to improve a color purity. For example, the color filter layer may include a first color filter layer, e.g., a blue color filter layer, corresponding to the first pixel region P1, a second color filter layer, e.g., a green color filter layer, corresponding to the second pixel region P2, and a third color filter layer, e.g., a red color filter layer, corresponding to the third pixel region P3.

In the bottom-emission type organic light emitting display device 1000, the color filter layer may be disposed between the OLED D6 and the substrate 1010. On the other hand, in the top-emission type organic light emitting display device 1000, the color filter layer may be disposed on or over the OLED D6.

Figure 21:
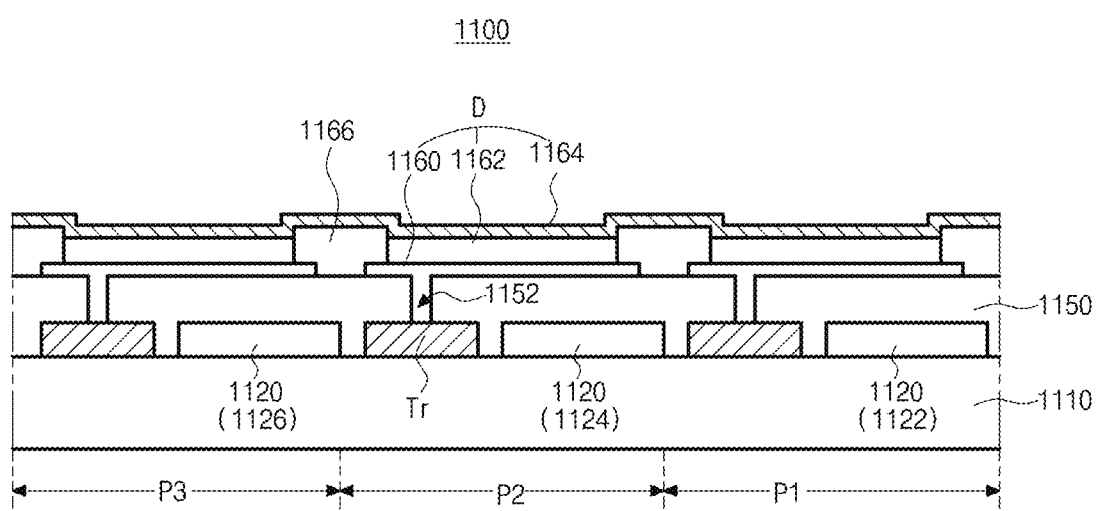
FIG. 21 is a schematic cross-sectional view of an OLED according to a ninth embodiment of the present disclosure.

FIG. 21 is a schematic cross-sectional view of an organic light emitting display device according to a ninth embodiment of the present disclosure.

As shown in FIG. 21, the organic light emitting display device 1100 includes a substrate 1110, wherein first to third pixel regions P1, P2 and P3 are defined, a TFT Tr over the substrate 1110, an OLED D, which is disposed over the TFT Tr and is connected to the TFT Tr, and a color filter layer 1120 corresponding to the first to third pixel regions P1 to P3. For example, the first to third pixel regions P1, P2 and P3 may be a blue pixel region, a green pixel region and a red pixel region, respectively.

The substrate 1110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

The TFT Tr is formed on the substrate 1110. Alternatively, a buffer layer (not shown) may be formed on the substrate 1110, and the TFT Tr may be formed on the buffer layer.

As explained with FIG. 2, the TFT Tr may include a semiconductor layer, a gate electrode, a source electrode and a drain electrode and may serve as a driving element.

In addition, the color filter layer 1120 is disposed on the substrate 1110. For example, the color filter layer 1120 may include a first color filter layer 1122 corresponding to the first pixel region P1, a second color filter layer 1124 corresponding to the second pixel region P2, and a third color filter layer 1126 corresponding to the third pixel region P3. The first to third color filter layers 1122, 1124 and 1126 may be a blue color filter layer, a green color filter layer and a red color filter layer, respectively. For example, the first color filter layer 1122 may include at least one of a blue dye and a blue pigment, and the second color filter layer 1124 may include at least one of a green dye and a green pigment. The third color filter layer 1126 may include at least one of a red dye and a red pigment.

A planarization layer (or passivation layer) 1150 is formed on the TFT Tr and the color filter layer 1120. The planarization layer 1150 has a flat top surface and includes a drain contact hole 1152 exposing the drain electrode of the TFT Tr.

The OLED D is disposed on the planarization layer 1150 and corresponds to the color filter layer 1120. The OLED D includes a first electrode 1160, an emitting layer 1162 and a second electrode 1164. The first electrode 1160 is connected to the drain electrode of the TFT Tr, and the emitting layer 1162 and the second electrode 1164 are sequentially stacked on the first electrode 1160. The OLED D emits the white light in each of the first to third pixel regions P1 to P3.

The first electrode 1160 is formed to be separate in the first to third pixel regions P1 to P3, and the second electrode 1164 is formed as one-body to cover the first to third pixel regions P1 to P3.

The first electrode 1160 is one of an anode and a cathode, and the second electrode 1164 is the other one of the anode and the cathode. In addition, the first electrode 1160 may be a light transmitting electrode (or a semi-transmitting electrode), and the second electrode 1164 may be a reflecting electrode.

For example, the first electrode 1160 may be the anode and may include a transparent conductive oxide material layer formed of a transparent conductive oxide (TCO) material having a relatively high work function. The second electrode 1164 may be the cathode and may include a metallic material layer formed of a low resistance metallic material having a relatively low work function. For example, the transparent conductive oxide material layer of the first electrode 1160 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1164 may include Al, Mg, Ca, Ag, their alloy, e.g., Mg—Ag alloy, or their combination.

The emitting layer 1162 as an emitting unit is formed on the first electrode 1160. The emitting layer 1162 includes at least two emitting parts emitting different color light. Each emitting part may have a single-layered structure of an EML. Alternatively, each emitting part may further include at least one of an HIL, an HTL, an EBL, an HBL, an ETL and an EIL. In addition, the emitting layer 1162 may further include a charge generation layer (CGL) between the emitting parts.

The EML of one of the emitting parts includes the first compound having the delayed fluorescent property, the second compound having the fluorescent property or the delayed fluorescent property and the third compound having the phosphorescent property.

A bank layer 1166 is formed on the planarization layer 1150 to cover an edge of the first electrode 1160. Namely, the bank layer 1166 is positioned at a boundary of the first to third pixel regions P1 to P3 and exposes a center of the first electrode 1160 in the first to third pixel regions P1 to P3. As mentioned above, since the OLED D emits the white light in the first to third pixel regions P1 to P3, the emitting layer 1162 may be formed as a common layer in the first to third pixel regions P1 to P3 without separation in the first to third pixel regions P1 to P3. The bank layer 1166 may be formed to prevent the current leakage at an edge of the first electrode 1160 and may be omitted.

Although not shown, the organic light emitting display device 1100 may further include an encapsulation film that is formed on the second electrode 1164 to prevent penetration of moisture into the OLED D. In addition, the organic light emitting display device 1100 may further include a polarization plate under the substrate 1110 for reducing an ambient light reflection.

In the organic light emitting display device 1100 of FIG. 21, the first electrode 1160 is a transparent electrode (light transmitting electrode), and the second electrode 1164 is a reflecting electrode. In addition, the color filter layer 1120 is positioned between the substrate 1110 and the OLED D. Namely, the organic light emitting display device 1100 is a bottom-emission type.

Alternatively, in the organic light emitting display device 1100, the first electrode 1160 may be a reflecting electrode, and the second electrode 1164 may be a transparent electrode (or a semi-transparent electrode). In this case, the color filter layer 1120 is positioned on or over the OLED D.

In the organic light emitting display device 1100, the OLED D in the first to third pixel regions P1 to P3 emits the white light, and the white light passes through the first to third color filter layers 1122, 1124 and 1126. Accordingly, the blue light, the green light and the red light are displayed in the first to third pixel regions P1 to P3, respectively.

Although not shown, a color conversion layer may be formed between the OLED D and the color filter layer 1120. The color conversion layer may include a blue color conversion layer, a green color conversion layer and a red color conversion layer respectively corresponding to the first to third pixel regions P1 to P3, and the white light from the OLED D can be converted into the blue light, the green light and the red light. The color conversion layer may include a quantum dot. Accordingly, the color purity of the OLED D may be further improved.

The color conversion layer may be included instead of the color filter layer 1120.

Figure 22:
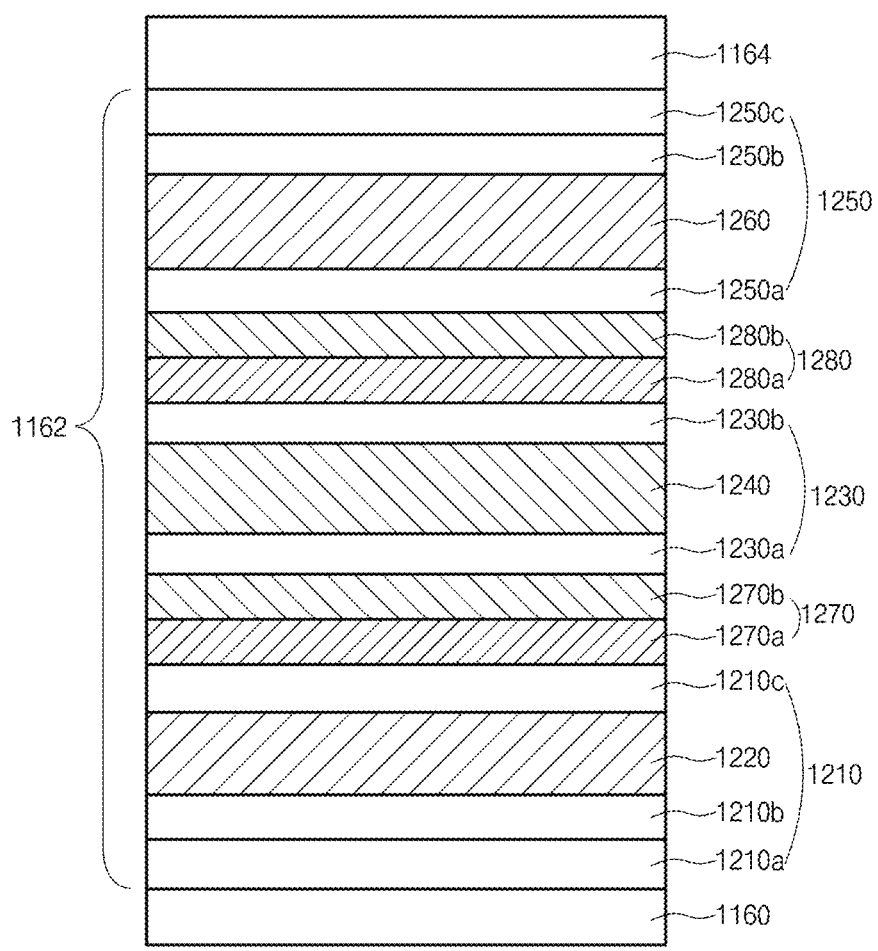
FIG. 22 is a schematic cross-sectional view of an OLED according to a tenth embodiment of the present disclosure.

FIG. 22 is a schematic cross-sectional view of an OLED according to a tenth embodiment of the present disclosure.

As shown in FIG. 22, the OLED D7 includes the first and second electrodes 1160 and 1164, which face each other, and the emitting layer 1162 therebetween.

The first electrode 1160 may be an anode, and the second electrode 1164 may be a cathode. The first electrode 1160 is a transparent electrode (a light transmitting electrode), and the second electrode 1164 is a reflecting electrode.

The emitting layer 1162 includes a first emitting part 1210 including a first EML 1220, a second emitting part 1230 including a second EML 1240 and a third emitting part 1250 including a third EML 1260. In addition, the emitting layer 1162 may further include a first CGL 1270 between the first and second emitting parts 1210 and 1230 and a second CGL 1280 between the second emitting part 1230 and the third emitting part 1250.

The first CGL 1270 is positioned between the first and second emitting parts 1210 and 1230 and includes an N-type CGL 1270a and a P-type CGL 1270b, and the second CGL 1280 is positioned between the second and third emitting parts 1230 and 1250 and includes an N-type CGL 1280a and a P-type CGL 1280b. Namely, the first emitting part 1210, the first CGL 1270, the second emitting part 1230, the second CGL 1280 and the third emitting part 1250 are sequentially stacked on the first electrode 1160. In other words, the first emitting part 1210 is positioned between the first electrode 1160 and the first CGL 1270, and the second emitting part 1230 is positioned between the first and second CGLs 1270 and 1280. The third emitting part 1250 is positioned between the second CGL 1280 and the second electrode 1164.

The first emitting part 1210 may further include an HIL 1210a and a first HTL 1210b under the first EML 1220 and a first ETL 1210c over the first EML 1220. Namely, the HIL 1210a and the first HTL 1210b are positioned between the first electrode 1160 and the first EML 1220, and the first ETL 1210c is positioned between the first EML 1220 and the first CGL 1270.

In addition, the first emitting part 1210 may further include an EBL (not shown) between the first HTL 1210b and the first EML 1220 and an HBL (not shown) between the first ETL 1210c and the first EML 1220.

The second emitting part 1230 may further include a second HTL 1230a under the second EML 1240 and a second ETL 1230b over the second EML 1240. Namely, the second HTL 1230a is positioned between the second EML 1240 and the first CGL 1270, and the second ETL 1230b is positioned between the second EML 1240 and the second CGL 1280.

In addition, the second emitting part 1230 may further include an EBL (not shown) between the second HTL 1230a and the second EML 1240 and an HBL (not shown) between the second ETL 1230b and the second EML 1240.

The third emitting part 1250 may further include a third HTL 1250a under the third EML 1260, and a third ETL 1250b and the EIL 1250c over the third EML 1260. Namely, the third HTL 1250a is positioned between the third EML 1260 and the second CGL 1280, and the third ETL 1250b and the EIL 1250c are positioned between the third EML 1260 and the second electrode 1164.

In addition, the third emitting part 1250 may further include an EBL (not shown) between the third HTL 1250a and the third EML 1260 and an HBL (not shown) between the third ETL 1250b and the third EML 1260.

One of the first to third EMLs 1220, 1240 and 1260 is a blue EML. Another one of the first to third EMLs 1220, 1240 and 1260 may be a green EML, and the other one of the first to third EMLs 1220, 1240 and 1260 may be a red EML.

For example, the first EML 1220 may be the red EML, the second EML 1240 may be the green EML, and the third EML 1260 may be the blue EML. Alternatively, the first EML 1220 may be the green EML, the second EML 1240 may be the red EML, and the third EML 1260 may be the blue EML.

The third EML 1260 being the blue EML has the same structure or configuration as the EML 540 of the OLED explained with FIG. 9. Namely, the third EML 1260 includes the first compound having the delayed fluorescent property, the second compound having the fluorescent property or the delayed fluorescent property and the third compound having the phosphorescent property. The first to third compounds are mixed in the single EML.

The first compound may be represented by Formula 1-1 or Formula 1-2 and may be one of the compounds in Formula 2. The second compound may be represented by Formula 3 and may be the compounds in Formula 4. The third compound may be represented by Formula 5-1 or Formula 5-2 and may be the compounds in Formula 6.

As described above, the onset wavelength of the second compound is greater (longer) than that of the first compound and is smaller (shorter) than that of the third compound. In addition, the maximum emission wavelength (Amax) of the second compound is smaller than that of the first compound, and the maximum emission wavelength of the third compound is equal to or smaller than that of the first compound. The maximum emission wavelength of the second compound is smaller than that of the third compound. Moreover, the FWHM of the second compound is smaller than that of the first compound, and the FWHM of the third compound is smaller than that of the first compound.

In the third EML 1260, the weight % of the second compound may be equal to or smaller than that of the third compound. For example, with respect to the second compound, the third compound has the weight % of about 100 to 1200.

The third EML 1260 may further include a host. The triplet energy level of the host may be equal to or greater (higher) than that of the first compound being the delayed fluorescent compound. In addition, the triplet energy level of the host may be greater than that of the third compound having the phosphorescent property.

The first EML 1220 includes a host and a green dopant (or a red dopant), and the second EML 1240 includes a host and a red dopant (or a green dopant). For example, in each of the first and second EMLs 1220 and 1240, the dopant may be one of a phosphorescent compound, a fluorescent compound and a delayed fluorescent compound.

The OLED D7 in the first to third pixel regions P1 to P3 (of FIG. 21) emits the white light, and the white light passes through the color filter layer 1120 (of FIG. 21) in the first to third pixel regions P1 to P3. Accordingly, the organic light emitting display device 1100 (of FIG. 21) can provide a full-color image.

In the OLED D7, since the first to third compounds meet the above conditions (or relations), the energy of the first compound is transferred into each of the second and third compounds such that the emission is provided from each of the second and third compounds. Accordingly, the decreased of the lifespan and the emitting efficiency by the triplet exciton in the first compound is prevented.

In addition, since the second and third compounds are included in the single layer, i.e., the third EML 1260, the singlet exciton and the triplet exciton of the first compound are respectively transferred into the second and third compounds. Accordingly, the non-emission quenching problem of the triplet exciton in the first compound and/or the second compound is prevented.

Moreover, the maximum emission wavelength of the second compound is smaller than that of the third compound, the energy transfer from the third compound into the second compound is prevented or minimized.

Accordingly, the OLED D7 provides high emitting efficiency and high color purity.

Figure 23:
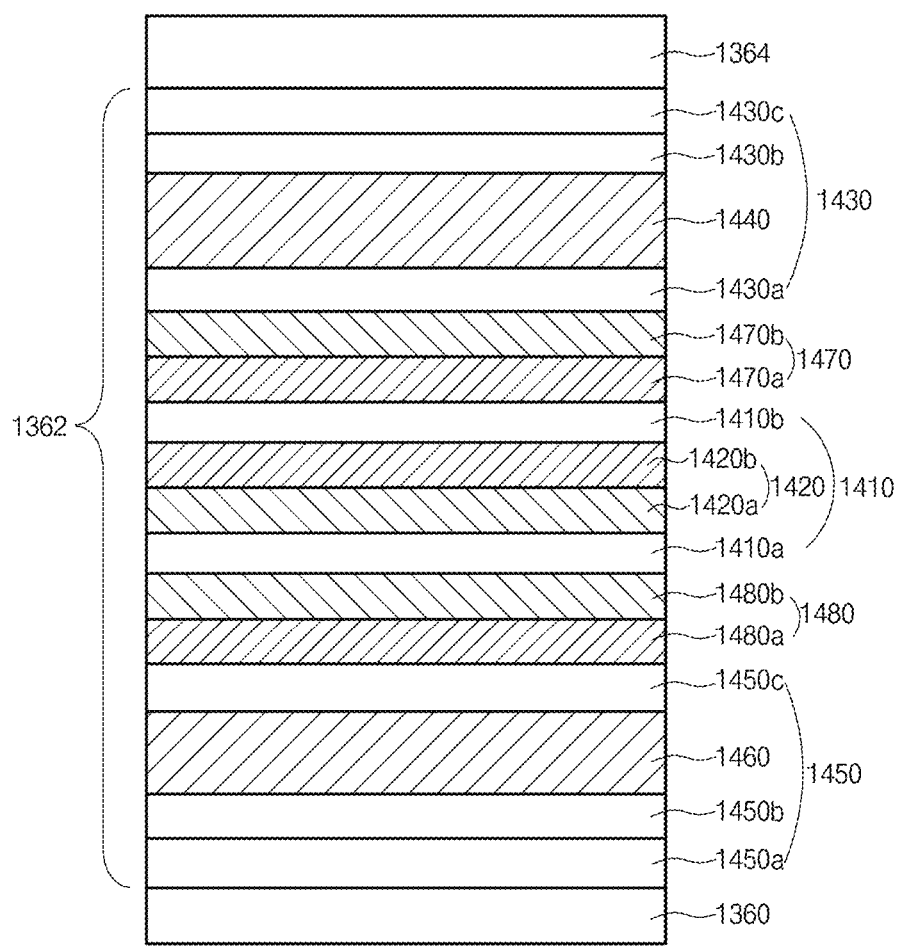
FIG. 23 is a schematic cross-sectional view of an OLED according to an eleventh embodiment of the present disclosure.

FIG. 23 is a schematic cross-sectional view of an OLED according to an eleventh embodiment of the present disclosure.

As shown in FIG. 23, the OLED D8 includes the first and second electrodes 1360 and 1364, which face each other, and the emitting layer 1362 therebetween.

The first electrode 1360 may be an anode, and the second electrode 1364 may be a cathode. The first electrode 1360 is a transparent electrode (a light transmitting electrode), and the second electrode 1364 is a reflecting electrode.

The emitting layer 1362 includes a first emitting part 1410 including a first EML 1420, a second emitting part 1430 including a second EML 1440 and a third emitting part 1450 including a third EML 1460. In addition, the emitting layer 1362 may further include a first CGL 1470 between the first and second emitting parts 1410 and 1430 and a second CGL 1480 between the first emitting part 1410 and the third emitting part 1450.

The first emitting part 1420 includes a lower EML 1420a and an upper EML 1420b. Namely, the lower EML 1420a is positioned to be closer to the first electrode 1360, and the upper EML 1420b is positioned to be closer to the second electrode 1364.

The first CGL 1470 is positioned between the first and second emitting parts 1410 and 1430 and includes an N-type CGL 1470a and a P-type CGL 1470b, and the second CGL 1480 is positioned between the first and third emitting parts 1410 and 1450 and includes an N-type CGL 1480a and a P-type CGL 1480b. Namely, the third emitting part 1450, the second CGL 1480, the first emitting part 1410, the first CGL 1470 and the second emitting part 1430 are sequentially stacked on the first electrode 1360. In other words, the first emitting part 1410 is positioned between the first and second CGLs 1470 and 1480, and the second emitting part 1430 is positioned between the first CGL 1470 and the second electrode 1364. The third emitting part 1450 is positioned between the second CGL 1480 and the first electrode 1360.

The first emitting part 1410 may further include a first HTL 1410a under the first EML 1420 and a first ETL 1410b over the first EML 1420. Namely, the first HTL 1410a may positioned between the first EML 1420 and the second CGL 1480, and the first ETL 1410b may be positioned between the first EML 1420 and the first CGL 1470.

In addition, the first emitting part 1410 may further include an EBL (not shown) between the first HTL 1410a and the first EML 1420 and an HBL (not shown) between the first ETL 1410b and the first EML 1420.

The second emitting part 1430 may further include a second HTL 1430a under the second EML 1440, a second ETL 1430b over the second EML 1440 and an EIL 1430c on the second ETL 1430b. Namely, the second HTL 1430a may be positioned between the second EML 1440 and the first CGL 1470, and the second ETL 1430b and the EIL 1430c may be positioned between the second EML 1440 and the second electrode 1364.

In addition, the second emitting part 1430 may further include an EBL (not shown) between the second HTL 1430a and the second EML 1440 and an HBL (not shown) between the second ETL 1430b and the second EML 1440.

The third emitting part 1450 may further include a third HTL 1450b under the third EML 1460, an HIL 1450a under the third HTL 1450b and a third ETL 1450c over the third EML 1460. Namely, the HIL 1450a and the third HTL 1450b may be positioned between the first electrode 1360 and the third EML 1460, and the third ETL 1450c may be positioned between the third EML 1460 and the second CGL 1480.

In addition, the third emitting part 1450 may further include an EBL (not shown) between the third HTL 1450b and the third EML 1460 and an HBL (not shown) between the third ETL 1450c and the third EML 1460.

One of the lower and upper EMLs 1420a and 1420b of the first EML 1420 is a red EML, and the other one of the lower and upper EMLs 1420a and 1420b of the first EML 1420 may be a green EML. Namely, the red EML (or the green EML) and the green EML (or the red EML) are sequentially stacked to form the first EML 1420.

Each of the second and third EMLs 1440 and 1460 may be a blue EML. At least one of the second and third EMLs 1440 and 1460 has the same structure or configuration as the EML 540 of the OLED explained with FIG. 9.

Namely, at least one of the second and third EMLs 1440 and 1460 includes the first compound having the delayed fluorescent property, the second compound having the fluorescent property or the delayed fluorescent property and the third compound having the phosphorescent property. The first to third compounds are mixed in the single EML.

The first compound may be represented by Formula 1-1 or Formula 1-2 and may be one of the compounds in Formula 2. The second compound may be represented by Formula 3 and may be the compounds in Formula 4. The third compound may be represented by Formula 5-1 or Formula 5-2 and may be the compounds in Formula 6.

As described above, the onset wavelength of the second compound is greater (longer) than that of the first compound and is smaller (shorter) than that of the third compound. In addition, the maximum emission wavelength (λmax) of the second compound is smaller than that of the first compound, and the maximum emission wavelength of the third compound is equal to or smaller than that of the first compound. The maximum emission wavelength of the second compound is smaller than that of the third compound. Moreover, the FWHM of the second compound is smaller than that of the first compound, and the FWHM of the third compound is smaller than that of the first compound.

In at least one of the second and third EMLs 1440 and 1460, the weight % of the second compound may be equal to or smaller than that of the third compound. For example, with respect to the second compound, the third compound has the weight % of about 100 to 1200.

At least one of the second and third EMLs 1440 and 1460 may further include a host. The triplet energy level of the host may be equal to or greater (higher) than that of the first compound being the delayed fluorescent compound. In addition, the triplet energy level of the host may be greater than that of the third compound having the phosphorescent property.

The OLED D8 in the first to third pixel regions P1 to P3 (of FIG. 21) emits the white light, and the white light passes through the color filter layer 1120 (of FIG. 21) in the first to third pixel regions P1 to P3. Accordingly, the organic light emitting display device 1100 (of FIG. 21) can provide a full-color image.

In FIG. 23, the OLED D8 has a triple stack structure with the second and third EMLs 1440 and 1460 being the blue EML. Alternatively, the OLED D8 may have a double stack structure without an emitting part including one of the second and third EMLs 1440 and 1460.

In at least one of the second and third EMLs 1440 and 1460 of the OLED D8, since the first to third compounds meet the above conditions (or relations), the energy of the first compound is transferred into each of the second and third compounds such that the emission is provided from each of the second and third compounds. Accordingly, the decrease of the lifespan and the emitting efficiency by the triplet exciton in the first compound is prevented.

In addition, since the second and third compounds are included in the single layer, the singlet exciton and the triplet exciton of the first compound are respectively transferred into the second and third compounds. Accordingly, the non-emission quenching problem of the triplet exciton in the first compound and/or the second compound is prevented.

Moreover, the maximum emission wavelength of the second compound is smaller than that of the third compound, the energy transfer from the third compound into the second compound is prevented or minimized.

Accordingly, the OLED D8 provides high emitting efficiency and high color purity.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An organic light emitting diode, comprising:
a first electrode;
a second electrode facing the first electrode; and
a first emitting material layer including a first compound, a second compound and a third compound and positioned between the first and second electrodes,
wherein the first compound is represented by Formula 1-1 or Formula 1-2:

[Formula 1-1]

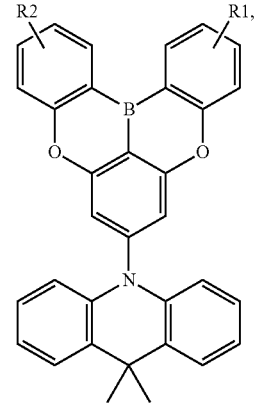

[Formula 1-2]

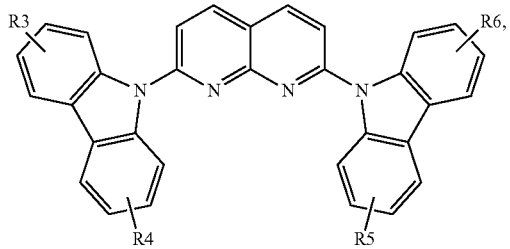

wherein each of R1 and R2 is independently selected from the group consisting of hydrogen (H), C1 to C10 alkyl and C6 to C30 aryl, wherein each of R3 to R6 is independently selected from the group consisting of H, C1 to C10 alkyl and C6 to C30 aryl, wherein the second compound is represented by Formula 2:

[Formula 2]

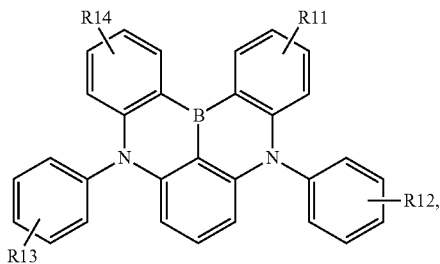

wherein each of R11 to R14 is independently selected from the group consisting of H, deuterium (D), C1 to C10 alkyl, C6 to C30 aryl and C6 to C30 arylamino group, wherein the third compound is represented by Formula 3-1 or Formula 3-2:

[Formula 3-1]

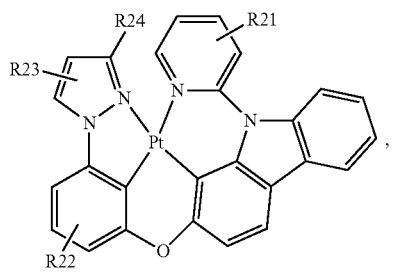

[Formula 3-2]

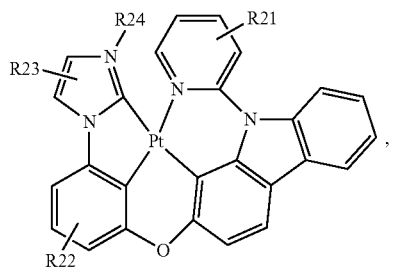

wherein each of R21 to R24 is independently selected from the group consisting of H, C1 to C10 alkyl and C6 to C30 aryl.

2. The organic light emitting diode according to claim 1, wherein the first to third compounds are included in a single layer.

3. The organic light emitting diode according to claim 2, wherein a weight % of the second compound is equal to or smaller than a weight % of the third compound.

4. The organic light emitting diode according to claim 2, wherein the first emitting material layer further includes a host.

5. The organic light emitting diode according to claim 2, further comprising: a hole blocking layer between the second electrode and the first emitting material layer,
wherein the first emitting material layer further includes a host, and the host is same as a material of the hole blocking layer.

6. The organic light emitting diode according to claim 2, further comprising: an electron blocking layer between the first electrode and the first emitting material layer,
wherein the first emitting material layer further includes a host, and the host is same as a material of the electron blocking layer.

7. The organic light emitting diode according to claim 1, wherein the first emitting material layer includes a first layer and a second layer between the first layer and the second electrode, and
wherein the first layer includes the first compound and the second compound, and the second layer includes the first compound and the third compound.

8. The organic light emitting diode according to claim 7, wherein a thickness of the first layer is smaller than a thickness of the second layer.

9. The organic light emitting diode according to claim 7, wherein a weight % of the second compound in the first layer is equal to or greater than a weight % of the third compound in the second layer.

10. The organic light emitting diode according to claim 7, wherein the first emitting material layer further includes a third layer including the first compound and the third compound and positioned between the first electrode and the first layer.

11. The organic light emitting diode according to claim 7, wherein the second layer further includes a host.

12. The organic light emitting diode according to claim 1, further comprising:
a second emitting materail layer between the first electrode and the first emitting material layer; and
a charge generation layer between the first and second emitting material layers,
wherein the second emitting material layer is one of a red emitting material layer, a green emitting material layer and a blue emitting material layer.

13. An organic light emitting device, comprising:
a substrate; and
an organic light emitting diode disposed on or over the substrate, the organic light emitting diode including:
a first electrode;
a second electrode facing the first electrode; and
a first emitting material layer including a first compound, a second compound and a third compound and positioned between the first and second electrodes, wherein the first compound is represented by Formula 1-1 or Formula 1-2:

[Formula 1-1]

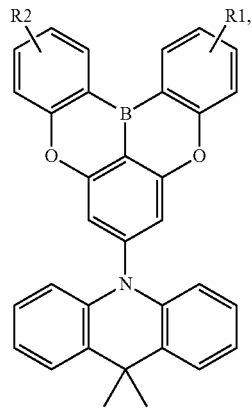

[Formula 1-2]

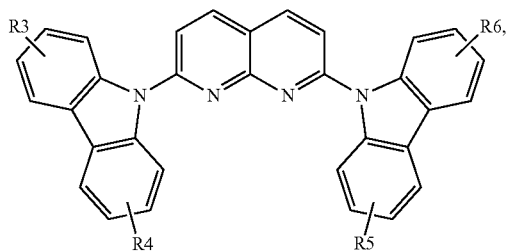

wherein each of R1 and R2 is independently selected from the group consisting of hydrogen (H), C1 to C10 alkyl and C6 to C30 aryl, wherein each of R3 to R6 is independently selected from the group consisting of H, C1 to C10 alkyl and C6 to C30 aryl, wherein the second compound is represented by Formula 2:

[Formula 2]

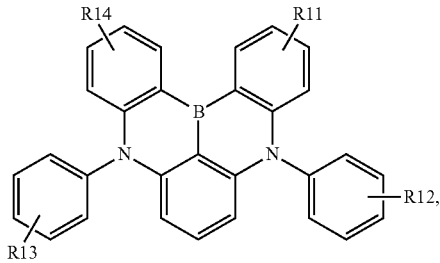

wherein each of R11 to R14 is independently selected from the group consisting of H, deuterium (D), C1 to C10 alkyl, C6 to C30 aryl and C6 to C30 arylamino group, wherein the third compound is represented by Formula 3-1 or Formula 3-2:

[Formula 3-1]

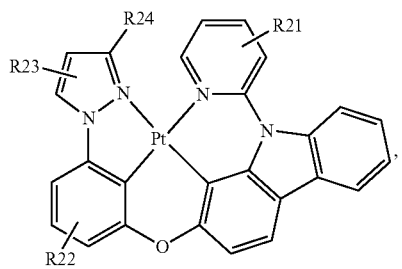

[Formula 3-2]

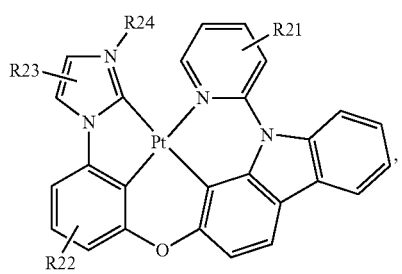

wherein each of R21 to R24 is independently selected from the group consisting of H, C1 to C10 alkyl and C6 to C30 aryl.

14. The organic light emitting device according to claim 13, wherein the first to third compounds are included in a single layer.

15. The organic light emitting diode according to claim 1, wherein the first compound is one of compounds in Formula 4:

[Formula 4]

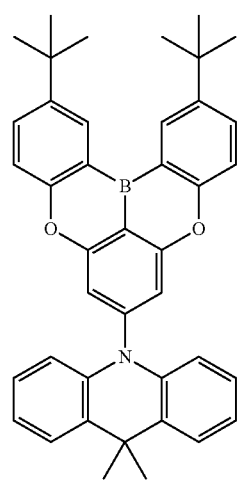

TD1

-continued
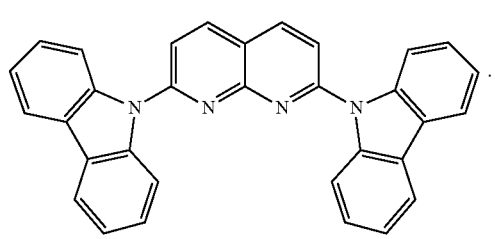
TD2
16. The organic light emitting diode according to claim 1, wherein the second compound is represented by Formula 5:
[Formula 5]
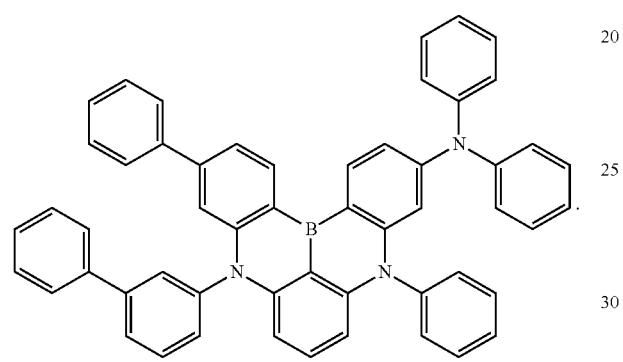
FD1
17. The organic light emitting diode according to claim 1, wherein the third compound is represented by Formula 6:
[Formula 6]
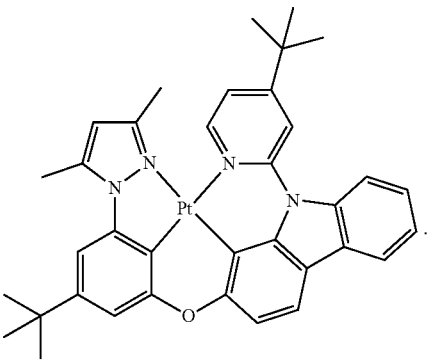
PD
* * * * *